United States Patent [19]
Saito et al.

[11] Patent Number: 5,434,742
[45] Date of Patent: Jul. 18, 1995

[54] CAPACITOR FOR SEMICONDUCTOR INTEGRATED CIRCUIT AND METHOD OF MANUFACTURING THE SAME

[75] Inventors: Katsuaki Saito; Michio Ohue; Takuya Fukuda; JaiHo Choi; Yukinobu Miyamoto, all of Hitachi, Japan

[73] Assignee: Hitachi, Ltd., Tokyo, Japan

[21] Appl. No.: 995,977

[22] Filed: Dec. 23, 1992

[30] Foreign Application Priority Data

| Dec. 25, 1991 | [JP] | Japan | 3-342726 |
| Jan. 30, 1992 | [JP] | Japan | 4-015446 |
| Feb. 19, 1992 | [JP] | Japan | 4-032212 |
| Apr. 3, 1992 | [JP] | Japan | 4-082461 |

[51] Int. Cl.⁶ .......... H01G 7/06; H01G 4/008; H01G 4/12
[52] U.S. Cl. .............. 361/321.5; 361/305; 361/322
[58] Field of Search .......... 361/322, 301.2, 303, 361/304, 305, 321.5, 321.4; 257/296, 301, 306, 295, 532, 741, 68, 71; 437/919; 365/149; 29/25.42

[56] References Cited

U.S. PATENT DOCUMENTS

| 4,458,295 | 7/1984 | Durschlag | 361/322 |
| 4,707,897 | 11/1987 | Rohrer | 29/25.42 |
| 4,964,016 | 10/1990 | Marchand | 361/321.4 |
| 5,155,573 | 10/1992 | Abe | 365/145 |
| 5,248,564 | 9/1993 | Ramesh | 361/321.1 |
| 5,307,304 | 4/1994 | Saito et al. | 365/145 |

FOREIGN PATENT DOCUMENTS

| 1170057 | 7/1986 | Japan | 257/532 |
| 0133952 | 5/1990 | Japan | 437/919 |

OTHER PUBLICATIONS

Japanese Journal of Applied Physics, Part 1 Regular Papers and Short Notes, Sep. 1991, vol. 30, No. 9B.

*Primary Examiner*—Bruce A. Reynolds
*Assistant Examiner*—Michael D. Switzer
*Attorney, Agent, or Firm*—Antonelli, Terry, Stout & Kraus

[57] ABSTRACT

A semiconductor integrated circuit apparatus according to the present invention has a capacitor formed in such a manner that a ferroelectric thin film is formed after a MOS transistor has been formed on a substrate thereof, a ferroelectric thin film made of, for example, $PbZrTiO_3$ or $SrTiO_3$ or the like is formed into a columnar shape to form electrodes positioned in direct contact with the side wall portions of said columnar ferroelectric thin film, and the top portion is removed. As a result, a fact that an oxide of each electrode, which deteriorates the relative permittivity, is formed on the interface between the electrode and the ferroelectric material is prevented, and a large capacity can be realized with respect to the area of the substrate because the ferroelectric thin film is formed into the columnar and elongated shape, resulting in that the capacitance of the capacitor is not reduced in which the electrodes and the oxide dielectric material having a high permittivity are, in series, connected to each other.

The capacitor is formed into a DRAM or an FRAM memory cell so as to realize a semiconductor memory revealing a high degree of integration and a high processing speed.

25 Claims, 54 Drawing Sheets

SEMICONDUCTOR MEMORY BOARD — MEMORY CHIP ACCORDING TO THE PRESENT INVENTION — CONNECTOR PORTION

PLASTIC PLATE — MEMORY CHIP ACCORDING TO THE PRESENT INVENTION — CONNECTOR PORTION

POCKETBOOK-TYPE COMPUTER

DIRECTION OF GROWTH OF CRYSTAL →

DIRECTION OF GROWTH OF CRYSTAL ↑

DIRECTION OF GROWTH OF CRYSTAL

DIRECTION OF GROWTH OF CRYSTAL

CAPACITOR FOR SEMICONDUCTOR INTEGRATED CIRCUIT AND METHOD OF MANUFACTURING THE SAME

BACKGROUND OF THE INVENTION

1. Field of the Invention

The present invention relates to a capacitor for a semiconductor integrated circuit which uses a dielectric material and a method of manufacturing the same, and, more particularly, to a semiconductor integrated circuit device of a high density type which uses the aforesaid capacitor.

2. Description of the Related Art

A dynamic random access memory, hereinafter called a "DRAM", has been studied energetically in recent years because it has, as a storage device of a computer, advantages that it has a considerably large storage capacity and it is capable of operating at high speed. Under the aforesaid condition, there has been a desire of further raising the operation speed and the degree of integration. The technology about the DRAM has been in detail disclosed in, for example, "The Latest Very Large-Scale Integrated Circuit Handbook" edited by Yoichi Akasaka and three others and published by Science Forum.

FIG. 63 is a vertical cross sectional view which illustrates a memory cell portion of a typical DRAM. Each memory cell comprises a pair composed of a MOS transistor including a source S, a drain D, a source electrode 14, a drain electrode 301 and a gate electrode 11 formed on a Si substrate and a capacitor including a drain electrode 301, a dielectric material 302 and a plate electrode 303, so as to store 1-bit data depending upon the charge stored in the capacitor. A gate electrode 11 of the MOS transistor is connected to a word line which is connected to an X-decoder driver of a peripheral circuit. On the other hand, the source electrode 14 of the MOS transistor is connected to a bit line which is connected to a peripheral circuit such as a sense amplifier, a reading circuit, a writing circuit and the like.

A charge larger than 200 fC must be stored in the capacity of the capacitor in order to withstand an error (called a "soft error") taken place due to a charge generated by α rays. Assuming that the power supply voltage is 3 V, the capacitor requires a capacity of about 70 fF.

The capacity of the capacitor is expressed by the following Equation (1):

$$C = \xi_0 \cdot \xi_\gamma \frac{S}{d} \quad (1)$$

where
- C: capacity
- $\xi_0$: permittivity in vacuum
- $\xi_\gamma$: relative permittivity
- S: area of electrode
- d: thickness of insulating film As can be understood from Equation (1), the capacity of the capacitor is in proportion to the relative permittivity $\xi_\gamma$ of the insulating film and the electrode area S of the capacitor, but is in inverse proportion to the thickness d of the insulating film. Therefore, the surface area S of the electrode must be enlarged, the thickness d of the insulating film must be reduced and an insulating film having a large permittivity must be used in order to enlarge the capacity C of the capacitor. However, it is difficult to satisfactorily enlarge the electrode area S of the capacitor by the conventional mass production technology because the surface area of one memory cell of a highly-integrated DRAM is reduced. Therefore, a study for enlarging the surface area has been made, for example, as disclosed in 1991 Symposium on VLSI Technology Digest of Technical Papers P7-P13. As can be understood from this, a considerably complicated process has been required in order to enlarge the surface area. However, the thickness of the insulating film cannot be reduced satisfactorily because the puncture electric field must keep a required level.

On the other hand, a study for making the insulating film by a material having a large permittivity has been carried out as disclosed in, for example, P3 to P29 of Japanese Journal of Applied Physics, September 1991, Vol. 30, No. 9B, Ferroelectric Materials and their Applications. The materials having a large permittivity $\xi_\gamma$ are exemplified by $Ta_2O_5$ and $TiO_2$ each having a permittivity $\xi_\gamma$ of about 20 to 100, and ferroelectric materials having a perovskite type crystalline structure such as $Pb(ZrTi)O_3$, $(PbLa)(ZrTi)O_3$, $BaTiO_3$, and $SrTiO_3$ each of which has a permittivity larger than the aforesaid value.

The ferroelectric material has a so-called spontaneous polarization phenomenon in which it has a polarization although no electric field is applied thereto. The aforesaid material has a Curie temperature. The material has the spontaneous polarization in the case where the temperature is lower than the Curie temperature, while the material has no spontaneous polarization in the case where the temperature is higher than the Curie temperature. If the temperature is in the vicinity of the Curie temperature, the permittivity of the material becomes maximum, and the permittivity of some materials is larger than 10,000 at the aforesaid temperature. By solid-dissolving materials having different Curie temperatures, the Curie temperature can be shifted from the specific value of the material, the peak width of the permittivity with respect to the temperature can be widened, causing the dependency upon the temperature can be changed.

FIG. 64 is a graph which illustrates a typical spontaneous polarization. As shown in FIG. 64, the ferroelectric material takes place a phenomenon called the "spontaneous polarization" in which it has the polarization therein even if no electric field is supplied thereto. A technology about a ferroelectric memory which uses the aforesaid spontaneous polarization as a memory has been disclosed in Japanese Patent Publication(A) No. 63-201998, Japanese Patent Publication(A) No. 64-066897 and Japanese Patent Publication(A) No. 1-158691. Another technology about a highly-integrated DRAM in which a ferroelectric material (PZT) is used and capacitors are arranged three-dimensionally has been disclosed in U.S. Pat. No. 5,081,559.

As the applicable examples of the ferroelectric material other than the use as the capacitor, it has been variously used, for example, as an infrared ray sensor, and an electrooptical device, and the like. In the aforesaid electronic devices, the size and the thickness of the ferroelectric member have been reduced with the tendency of reducing the size and raising the degree of integration.

Since the perovskite type ferroelectric material usually has a very large relative permittivity and also has a large anisotropy, it is considered as a ferroelectric material. A thin film made of the ferroelectric material is, as disclosed in Japanese Patent Publication No. 1-80339, formed by an evaporation method, a sputtering method or a plasma oxidation method by utilizing the larger permittivity. It is necessary for the ferroelectric memory to form a capacitor of the ferroelectric material on the silicon substrate on which the transistors are formed. However, the ferroelectric material, the composition of which is expressed by $ABO_3$, can easily be reacted with silicon and therefore it cannot be directly formed on the silicon or on the silicon oxide film. Therefore, a barrier layer must be formed in order to prevent the aforesaid reaction. Although noble metal such as Pt can be used as an excellent lower electrode because it has excellent barrier characteristics and small electric resistance, it cannot be subjected to a fine process such as etching.

In order to reduce the size of a computer and to raise the operation speed of the same, the storage device included by the computer must be highly integrated. Therefore, there is a desire of reducing the storage cell per bit in order to reduce the size of the semiconductor device for use as the internal storage device. Accordingly, the capacitor for use as the dynamic type memory or the ferroelectric nonvolatile memory must be reduced, causing a necessity to arise in that the permittivity of the ferroelectric material for use in the capacitor must be raised and another necessity to arise in that the spontaneous polarization value of the ferroelectric material shown in FIG. 64 must be enlarged.

FIG. 65 illustrates the structure of the conventional capacitor formed in such a manner that noble metal is used as the base electrode. In the case where noble metal such as platinum, palladium is used as the material which does not form the oxide having a low permittivity, the metal oxide is not formed if the film is sufficiently thick, resulting in a ferromagnetic film revealing excellent crystallinity and a high permittivity to be formed. However, even if the insulator having a high effective permittivity can be formed by the aforesaid technique, noble metal such as platinum must be subjected to a process such as ion milling or wet etching because it cannot be subjected to a reactive ion etching process or a dry etching process. Therefore, a problem arises in that high integration cannot be realized.

Curve A shown in FIG. 4 is a graph which illustrates the relationship between the thickness of the ferroelectric film and the capacity. FIG. 4 illustrates results of an experiment carried out about the relationship between the capacity of the capacitor and the thickness of the $BaTiO_3$ film in the case where $BaTiO_3$ is employed as the ferroelectric material, and the electrode area is made $1 \times 1$ $\mu m^2$. In the case where the thickness of the film is thinned as described above, a problem arises in that a large leakage current flows between the electrodes and therefore the charge holding characteristics deteriorate. In the case where the capacitor of the aforesaid type is used as the capacitor of the DRAM, another problem arises in that the thickness cannot be reduced because a sufficient charge cannot be left at the time of the reading operation due to a fact that the charge stored at the time of the writing operation decreases. Hence, the area of the device cannot be reduced because the area required for the capacity increases in the case where a desired capacity is intended to be obtained.

As described above, a material having a satisfactorily large permittivity has not been obtained for the purpose of realizing an application of the ferroelectric material as a device although there has been a desire of obtaining an excellent oxide ferroelectric thin film.

SUMMARY OF THE INVENTION

An object of the present invention is to provide a capacitor for a semiconductor integrated circuit capable of overcoming the aforesaid problems and a method of manufacturing the same.

Another object of the present invention is to provide a capacitor for a semiconductor integrated circuit from which a large capacity can be realized therein with respect to the area of the substrate, and to provide a method of manufacturing the same.

The aforesaid object can be realized by a structure comprising: a substrate; at least one type dielectric material selected from oxide dielectric materials each having a permittivity of 20 or more or dielectric materials each having polarization which possesses hysteresis; two or more electrodes formed in direct contact with the two sides of the dielectric material and composed of a conductive material which can be oxidized.

It is preferable that the aforesaid dielectric material have a structure formed into a wall shape which is substantially perpendicular to the substrate and each side wall of the dielectric material has the electrode.

It is preferable that an oxide of the conductive material of at least one of the electrodes be the oxide dielectric material having a permittivity of 20 or more or the dielectric material having polarization which possesses hysteresis.

The aforesaid object can be realized by a capacitor comprising a dielectric material on a substrate thereof and two or more electrodes for applying an electric field to the dielectric material, wherein the dielectric material is made of an elongated crystal or an amorphous particle block, and the electrodes are disposed so as to apply an electric field substantially perpendicular to the lengthwise direction of the crystal or the particle block.

It is preferable that the oxide dielectric material be at least one type material selected from a group composed of the following materials: $KNbO_3$, $NaTaO_3$, $KTaO_3$, $SrTiO_3$, $BaTiO_3$, $PbTiO_3$, $SrZrO_3$, $BaZrO_3$, $BiFeO_3$, $(Na_{\frac{1}{2}}Bi_{\frac{1}{2}})TiO_3$, $(K_{\frac{1}{2}}Bi_{\frac{1}{2}})TiO_3$, $(K_{\frac{1}{2}}La_{\frac{1}{2}})TiO_3$, $(Ba_{\frac{1}{2}}Pb_{\frac{1}{2}})TiO_3$, $(Ca_{\frac{1}{2}})TiO_3$, $(Na_{\frac{1}{2}}Nd_{\frac{1}{2}})TiO_3$, $(Ag_{\frac{1}{2}}Ce_{\frac{1}{2}})TiO_3$, $(Pb_{\frac{1}{2}}Ca_{\frac{1}{2}})ZrO_3$, $Ba(Mg_{\frac{1}{3}}Te_{\frac{2}{3}})O_3$, $Ba(Mn_{\frac{1}{3}}Te_{\frac{2}{3}})O_3$, $Ba(Co_{\frac{1}{3}}Te_{\frac{2}{3}})O_3$, $Ba(Cd_{\frac{1}{3}}Te_{\frac{2}{3}})O_3$, $Pb(Mg_{\frac{1}{3}}Te_{\frac{2}{3}})O_3$, $Pb(Mn_{\frac{1}{3}}Te_{\frac{2}{3}})O_3$, $Pb(Co_{\frac{1}{3}}Te_{\frac{2}{3}})O_3$, $Pb(Ni_{\frac{1}{3}}Te_{\frac{2}{3}})O_3$, $Pb(Zn_{\frac{1}{3}}Te_{\frac{2}{3}})O_3$, $Pb(Cd_{\frac{1}{3}}Te_{\frac{2}{3}})O_3$, $Pb(Co_{\frac{1}{3}}W_{\frac{2}{3}})O_3$, $Pb(Zr_{\frac{1}{2}}Ti_{\frac{1}{2}})O_3$, $Pb(Mg_{\frac{1}{3}}Nb_{\frac{2}{3}})O_3$, $Pb(Sc_{\frac{1}{2}}Nb_{\frac{1}{2}})O_3$, $Pb(Mn_{\frac{1}{2}}Nb_{\frac{1}{2}})O_3$, $Pb(Fe_{\frac{1}{2}}Nb_{\frac{1}{2}})O_3$, $Pb(Ni_{\frac{1}{2}}Nb_{\frac{1}{2}})O_3$, $Pb(In_{\frac{1}{2}}Nb_{\frac{1}{2}})O_3$, $Pb(Fe_{\frac{1}{2}}W_{\frac{1}{2}})O_3$, $Pb(Lu_{\frac{1}{2}}Ta_{\frac{1}{2}})O_3$, $Pb(Yb_{\frac{1}{2}}Ta_{\frac{1}{2}})O_3$, $Pb(Cu_{\frac{1}{2}}Sb_{\frac{1}{2}})O_3$, $Pb(Al_{\frac{1}{2}}Sb_{\frac{1}{2}})O_3$, $Ca(Mg_{\frac{1}{3}}Te_{\frac{2}{3}})O_3$, and $Ca(Mn_{\frac{1}{3}}Te_{\frac{2}{3}})O_3$.

It is preferable that the electrode be at least one type materials selected from a group composed of the following materials: KNb, NaTa, KTa, SrTi, BaTi, PbTi, SrZr, BaZr, BiFe, NaBiTi, KBiTi, KLaTi, $BaPbTiO_3$, CaSrTi, NaNdTi, AgCeTi, PbCaZr, BaMgTe, BaMnTe, BaCoTe, BaCdTe, PbMgTe, PbMnTe, PbCoTe, ZnTe, PbCdTe, PbCoW, PbZrTi, PbMgNb, PbScNb, PbMnNb, PbFeNb, PbNiNb, PbInNb, PbFeW, PbLuTa, PbYbTa, PbCuSb, PbAlSb, CaMgTe, and CaMnTe.

The aforesaid object can be realized by a method of manufacturing a capacitor, comprising the steps of: forming, on a semiconductor substrate thereof, a film of an oxide dielectric material having a permittivity of 20 or more or a film of a dielectric material having polarization which possesses hysteresis; forming the oxide dielectric material into a wall shape; forming a film of a conductive material on the surface of the oxide dielectric material formed into the wall shape; and removing the conductive material film formed at the top portion of the oxide dielectric material so as to electrically separate the two side walls of the oxide dielectric material from each other, so that electrodes are formed.

The aforesaid object can be realized by a method of manufacturing a capacitor, comprising the steps of: forming, on a semiconductor substrate thereof, a film of a dielectric material composed of an elongated crystal or an amorphous particle block; forming the dielectric material into a wall shape; forming a conductive material film to be positioned in contact with the lengthwise direction of the crystal or the amorphous particle block of the dielectric material formed into the wall shape; and removing the conductive material film formed at the top portion of the dielectric material so as to electrically separate the two side walls of the dielectric material from each other, so that electrodes are formed.

As a result of the aforesaid structure, an oxide insulator having a permittivity of 20 or more or that having a polarization which processes hysteresis which has a high relative permittivity is formed after an active device has been formed on a semiconductor substrate, the aforesaid oxide insulator is formed into a wall shape, a conductive material is formed on the wall-shaped oxide insulator in vacuum, and the conductive material present at the top portion is removed, so that electrodes are formed on the two side walls of the oxide insulator. Hence, the surface of each electrode, which comes in contact with the ferroelectric material, is not exposed to a high temperature oxygen atmosphere, causing the surface of each electrode to be oxidized. Therefore, a metal film having a low permittivity can be formed, and, hence, the drop of the effective permittivity can be prevented. Consequently, a capacitor for a semiconductor integrated circuit having a large capacity can be obtained.

As a result, materials other than the noble metal such as platinum, which have been employed as the material of the capacitor which uses the high permittivity material or an insulator having hysteresis in the polarization thereof, can be used. Since the metal other than the noble metal or the semiconductor is excellent in the processability at the time of dry etching or the like, a fine capacitor can be formed on the substrate.

The unconformability between the grating constant of the base material and that of the aforesaid oxide insulator causes a low permittivity layer to be formed in the interface between the oxide insulator and the base material. The aforesaid low permittivity layer is formed even if noble metal such as platinum is used as the base material. Therefore, in the case where a capacitor is structured while using the base material as one of the electrodes, the low permittivity layer is formed in series with the high permittivity layer, causing the effective permittivity to be lowered. However, when an oxide insulating film of the aforesaid type is formed while using the insulating film as the base material, the processing direction is made to be longitudinal with respect to the substrate, and electrodes are formed on the side walls, the lower permittivity layer formed due to the unconformability from the grating constant of the insulating film serving as the base material and the high permittivity layer are connected to each other in parallel. As a result, the portion having the high permittivity substantially shares the major portion. Therefore, a capacitor having a high effective permittivity and a large capacitance can be structured while necessitating a small electrode area.

By disposing a multiplicity of the aforesaid storage cells in a two-dimensional or three-dimensional matrix form in such a manner that the oxide insulator surrounds the junction of the active device and the capacitor when the active device and the aforesaid capacitor which uses the oxide insulator are electrically connected to each other, the layout for disposing the storage cells can easily be made. Therefore, a large electrode area can be obtained while necessitating a small area so that a high integration degree can be realized. Furthermore, a lithography process for electrically insulating the electrodes formed on the two side walls of the oxide insulator from each other can be omitted.

The aforesaid capacitor is connected to the periphery circuit for reading data so as to constitute a DRAM, so that a high speed memory access operation can be performed.

The aforesaid capacitor can be manufactured by forming a ferroelectric material after transistors have been formed on the substrate and by forming electrodes by an oxide working process, a process of forming a metal or semiconductor film and a metal or semiconductor working process.

An oxide insulator expressed by $Pb(Zr_xTi_{1-x})O_3$, $(Pb_yLa_{1-y})(Zr_xTi_{1-x})O_3$ is a material which has a high boundary temperature (the Curie temperature) of about 400° C. between a temperature range in which its polarization has hysteresis and a temperature range in which it has not the hysteresis. Therefore, the aforesaid oxide insulator has a large spontaneous polarization at the room temperature. By using the oxide insulator as a ferroelectric memory (FRAM) having the aforesaid structure, excellent memory characteristics can be obtained.

Furthermore, the fact that the aforesaid materials has a large resistance ratio and is able to prevent the leakage current enables excellent memory characteristics to be obtained by using the aforesaid material as the oxide insulator to form a DRAM having the aforesaid structure.

Crystals in the perovskite structure which uses Ba or Sr, the mass of which is small with respect to that of Pb, enable excellent dielectric characteristics to be obtained in a high frequency region higher than 10 MHZ. Although a large spontaneous polarization cannot be obtained at the room temperature because its Curie temperature is adjacent, the relative permittivity becomes maximum at the Curie temperature. Therefore, a large capacitance can be obtained while necessitating a small area when the aforesaid material is used as the capacitor, enabling the DRAM to operate at high speed.

When a material of a $PbMgNbO_3$ type having a Curie temperature of about 10° C. to 40° C. and a relative permittivity of 7,000 or more is used as the oxide insulator, the capacitor can be constituted while necessitating a small area because the change of the dielectric characteristics, which takes place at the temperature in the temperature range in which the DRAM is operated, can be reduced to 10 to 20%. Therefore, the layout can be designed flexibly and therefore a highly-integrated DRAM can be constituted.

When the insulating material composed of two or more types of elements and having a permittivity of 20 or more when it is oxidized or a material which becomes an insulator having the polarity which possesses hysteresis is used as the material of the electrode, the aforesaid oxide film has a high permittivity of has ferroelectric characteristics even if the oxide film is formed between the electrode and the dielectric material in the oxidation process for obtaining the oxide dielectric material having a high permittivity or the oxide ferroelectric material. Therefore, the overall capacitance of the capacitor is not reduced but a high capacitance can be obtained even if the electrode, the aforesaid oxide film, the oxide dielectric material having a high permittivity or the oxide ferroelectric material form a series. As a result, the degree of integration in the capacitor can be raised.

By using the aforesaid oxide ferroelectric material as the dielectric material and by using the aforesaid material as the material for the electrode, the conformability between the dielectric material and the electrode can be improved.

By interposing the oxide of the electrode between the oxide dielectric material and the electrodes of the capacitor, the conformability of the dielectric material can be improved.

Among the leakage currents flowing in the insulating material of the capacitor, there are currents which flow due to the deep level in the band gap generated in the boundary portion of the crystal particles. Therefore, the leakage current is able to easily flow along the boundary portion of the crystal particles and the aforesaid boundary is formed in a direction in which the crystal grows. When an electric field is applied in the direction in which crystal grows in the insulating film, that is, in a direction perpendicular to the elongated direction of the crystal particle boundary, the number of passes of the leakage current is reduced in comparison to the case where an electric field is applied in parallel to the direction in which the crystal grows. Furthermore, the leakage current flows along the boundary portion of the crystal particles while bypassing the crystal particles, causing the distance of the pass is elongated. Therefore, the electric resistance increases, causing the leakage current to be decreased. Thus, increase in the leakage current due to the enlargement of the capacity of the capacitor for the semiconductor integrated circuit can be prevented.

In the aforesaid DRAM cell having a pair composed of the aforesaid capacitor and the MOS transistor, either of the electrodes of the capacitor in which the leakage current is decreased is connected to the drain electrode or the source electrode of the MOS transistor and the residual electrode is connected to the plate electrode, so that the charge stored at the time of the data writing operation is maintained until the reading operation. Therefore, a DRAM having excellent data writing/reading characteristics can be obtained.

When a ferroelectric nonvolatile memory (FRAM) is constituted in such a manner that the capacitor having the aforesaid structure is constituted by using a ferroelectric material having the spontaneous polarization as the insulating material, and an external circuit capable of reading and writing the direction of the spontaneous polarization of the aforesaid ferromagnetic material is provided, the leakage current can be reduced. Therefore, the electric energy required to write data can be reduced and the charge can be maintained, so that an FRAM revealing excellent writing and reading characteristics is obtained.

When a semiconductor memory card or a semiconductor memory board is constituted by using the random access memory or the ferroelectric nonvolatile memory, the high speed memory access time can be realized. In the case where the ferroelectric nonvolatile memory is used, a battery for saving the data in the memory when the power supply is turned off can be omitted and a memory capacity equivalent to or larger than that of the magnetic disk can be obtained in the similar manner as that when the magnetic disk is used. Therefore, a high speed memory access can be enabled in comparison to the magnetic disk. When a computer is constituted by using a microprocessor or the aforesaid memory by using the random access memory or the nonvolatile memory as the built-in cash memory, a solid recording medium revealing a reduced cost and a large capacity can be formed, the processing speed can be raised, and the size can be reduced, while decreasing required electric power consumption. When a ferroelectric memory is used, a memory freed from a soft error can be obtained.

When the memory card, which uses the aforesaid memory device, is used as a interchangeable sub-storage medium in a small or a portable computer system such as the conventional floppy disk smaller than the work station, a driving system such as a motor for rotating the disk and the driving power source can be omitted. Therefore, the overall size of the system can be reduced, the electric power consumption can be decreased and a large quantity of information can be read/written at high speed, causing the overall processing performance of the system to be improved.

In the case where the aforesaid memory device, a logical device which uses the memory device, a system LSI, or a semiconductor disk substrate memory card which uses the memory device is used in a super computer, a large size computer, a general-purpose computer, medium or a small size computer, a work station, a personal computer, a portable computer a lap top computer or a notebook type personal computer, a larger capacity can be stored and high speed access can be realized in comparison to the conventional structures, while reducing the overall cost. Therefore, the processing performance and the like can be improved.

In the case where the ferroelectric nonvolatile memory is used, advantages of the nonvolatile characteristics, a large capacity and a small electric power consumption can be realized. In particular, an electric backup can be omitted because it is nonvolatile memory. Therefore, a storage battery necessary at the time of the power failure can be omitted, causing an advantage to be realized in that the overall size of the system can be reduced. Furthermore, the necessity of copying the stored contents on the magnetic disk having a low access speed can be eliminated. Therefore, a larger quantity of information can be processed at higher speed in comparison to the conventional system, causing advantages to be realized in that the overall processing speed of the system can be raised, the performance can be improved, the size can be reduced and the overall cost can be reduced.

As for a portable personal computer and a notebook type computer, the system durable against vibrations can be constituted because the magnetic disk is not required. Furthermore, the system can be operated by the battery because the electric power consumption can be reduced, causing the probability in the portable use to be raised, for example, a stable operation can be realized in a movable body or the like.

When the aforesaid logical device is employed in a signal processing portion and the memory device according to the present invention is used as the main storage portion, access to a large quantity information can be realized at high speed. Therefore, extremely high grade and complicated information process can be completed in a short time.

The present invention is constituted in such a manner that the oxide insulator having a permittivity of 20 or more or that having the polarization which possesses hysteresis and having a high relative permittivity is formed after the active device has been formed on the semiconductor substrate, the thus formed oxide insulator is formed into a wall shape, the conductive material is formed on the wall-shaped oxide insulator in vacuum, and the conductive material present at the top portion is removed to form electrodes on both of the side walls of the oxide insulator. As a result, an advantage can be realized in that a dielectric material can be formed, in which the deterioration of the effective permittivity due to the oxidation of the surface of the electrode can be prevented, which reveals a high relative permittivity and reduced leakage current, and a capacitor for a semiconductor integrated circuit having a large capacity with respect to the area of the substrate can be obtained.

By forming the electrodes of a capacitor, which uses the oxide dielectric material having a high permittivity or the oxide ferroelectric material, by the material which is composed of two types of elements and which are made to be a dielectric material having a high permittivity or to be a ferroelectric material when it is oxidized, the high permittivity or the ferroelectric characteristics of the oxide film can be maintained even if the oxide film is formed between the electrodes and the dielectric material during the oxidation process for obtaining the dielectric material. Therefore, a large capacity can be obtained while preventing the reduction of the overall capacitor, causing an effect to be obtained in that the degree of integration can be raised.

The product, on which the random access memory or the nonvolatile memory which uses the aforesaid capacitor revealing a high degree of integration is mounted, enables a high degree of integration to be realized and the size to be reduced and the function to be improved. Furthermore, the processing speed can be improved due to the realized high degree of integration and the reduced size.

Furthermore, a ferroelectric material and a dielectric material having a high permittivity which can be advantageously used as the random access memory or the nonvolatile memory can be manufactured while revealing excellent reproduceability.

When an electric field is applied in substantially perpendicular to the elongated direction of the crystal boundary, the number of passes of the leakage current can be decreased in comparison to the case where an electric field is applied in parallel to the direction in which the crystal grows because the leakage current can easily flows along the boundary portion of the crystal particles in the insulating material of the capacitor. Furthermore, the leakage current flows along the boundary portion of the crystal particles while bypassing the crystal particles, the distance of the pass can be elongated, causing the electric resistance to be enlarged. As a result, the leakage current in the capacitor can be reduced. Therefore, the increase of the leakage current taken place due to the enlargement of the capacity of the capacitor for a semiconductor integrated circuit can be prevented.

BRIEF DESCRIPTION OF THE DRAWINGS

FIG. 52a illustrates the structure of an ordinary MOS transistor;

FIG. 52b illustrates the process for manufacturing a DRAM cell portion which uses a capacitor according to example 36 of the present invention;

FIG. 52c illustrates the process for manufacturing the DRAM cell portion which uses the capacitor according to example 36 of the present invention;

FIG. 52d illustrates the process for manufacturing the DRAM cell portion which uses the capacitor according to example 36 of the present invention;

FIG. 52e illustrates the process for manufacturing the DRAM cell portion which uses the capacitor according to example 36 of the present invention;

FIG. 52f illustrates the process for manufacturing the DRAM cell portion which uses the capacitor according to example 36 of the present invention;

FIG. 52g illustrates the process for manufacturing the DRAM cell portion which uses the capacitor according to example 36 of the present invention;

DESCRIPTION OF THE PREFERRED EMBODIMENTS

Examples of the present invention will now be described with reference to the drawings.

Example 1

Figure 1:
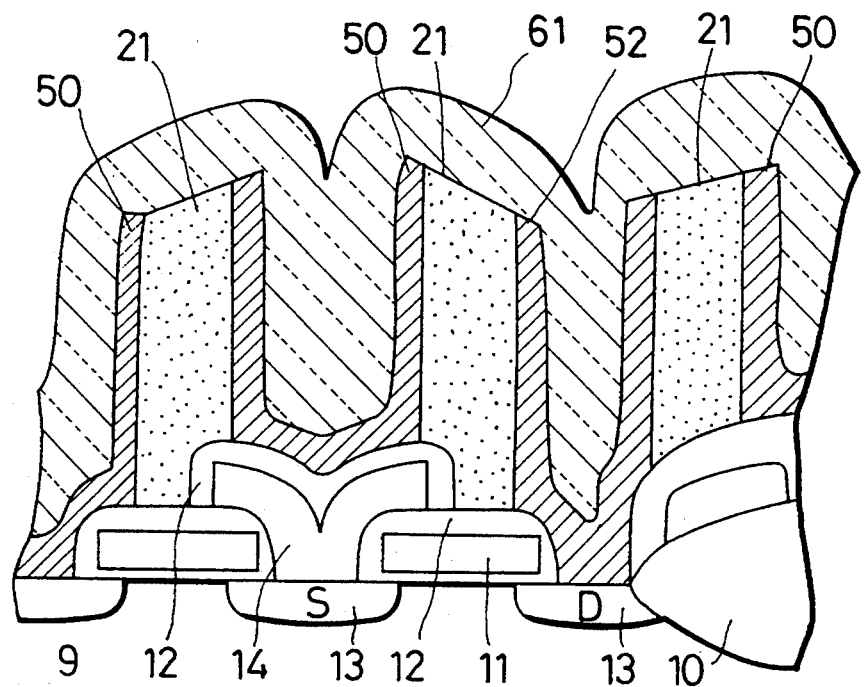
FIG. 1 is a schematic cross sectional view which illustrates a example of a present invention capacitor for a semiconductor integrated circuit.

FIG. 1 illustrates an embodiment of a capacitor according to the present invention, where reference numeral 9 represents a Si substrate on which a source and drain 13 are formed, 11 represents a gate electrode, 14 represents a source electrode, 21 represents a ferroelectric material, 50 represents a plate electrode formed on either side of the ferroelectric material 21, 52 represents a drain electrode formed on the residual side of the ferroelectric material 21, 12 represents an insulating layer, and 61 represents a protection layer.

FIGS. 2a to 2e illustrate a dynamic random access memory (hereinafter called a "DRAM") which illustrates a ferroelectric material according to this example in a state where it is in a manufacturing process. The aforesaid DRAM is designed in a 0.3 μm rule in a 64 Mbit DRAM technology under conditions that the power supply voltage is 1.5 V, the sense amplifier pitch is 0.8 μm and the word line pitch is 0.7 μm. However, the following technology is not limited to the aforesaid design dimensions.

Figure 2A:
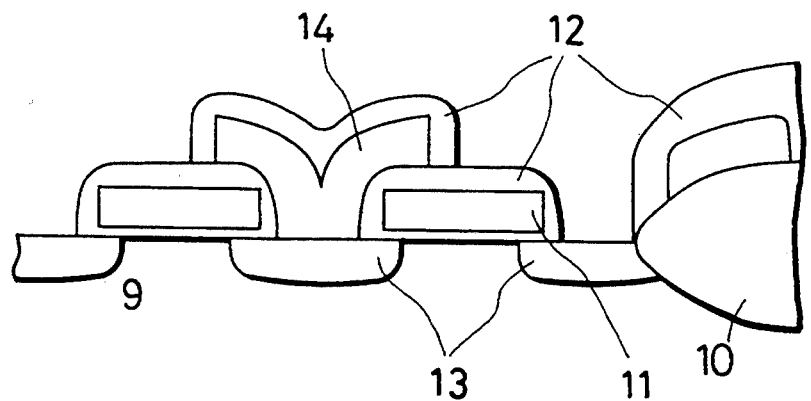
FIG. 2a illustrates the structure of an ordinary MOS transistor.

FIG. 2a is a cross sectional view of the Si substrate on which the MOS transistor is formed.

Figure 2B:
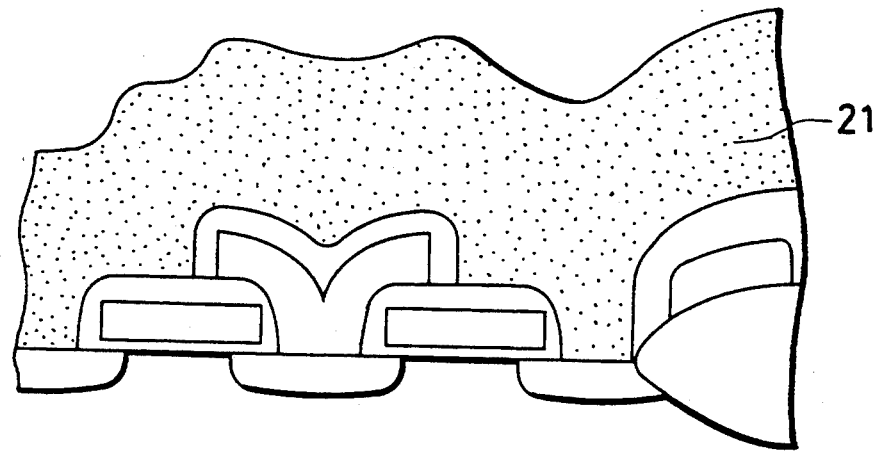
FIG. 2b illustrates the manufacturing process according to Example 1 of the present invention.

FIG. 2b illustrates a state where a solid-solution film of a ferroelectric material 21 made of $BaTiO_3$ (barium titanate) and $SrTiO_3$ is formed on the entire surface of the MOS transistor to have a thickness of 1.0 μm for example. As the film forming method, an organic metal chemical gas phase deposition method is used in which ozone is used while making organic metal such as Ba, Ti and Sr or a complex of the organic metal to serve as a carrier gas and the temperature of the substrate is made to be 800° C.

Figure 2C:
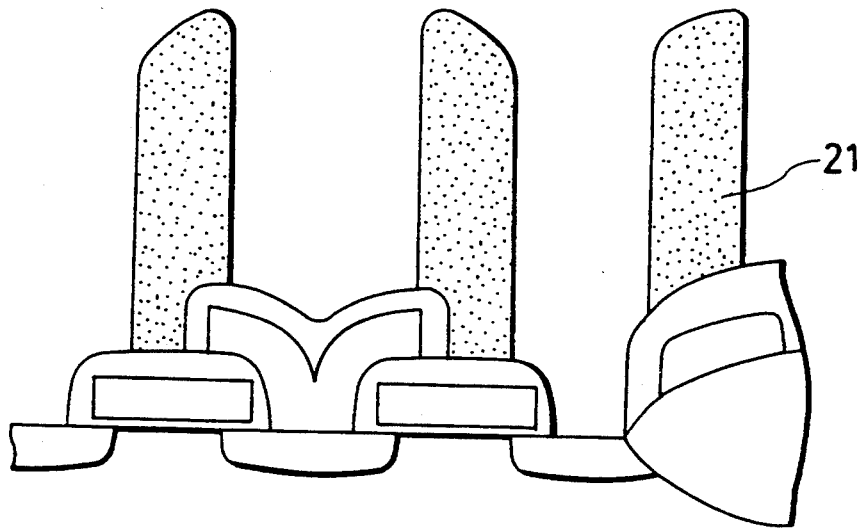
FIG. 2c illustrates the manufacturing process according to Example 1 of the present invention.

FIG. 2c illustrates a state where the solid-solution film made of the ferroelectric material 21 is selectively etched after a lithographic process has been completed. At this time, it is necessary for the ferroelectric material present on the drain contact hole of the MOS transistor to be removed and for the ferroelectric material 21 to have the desired thickness. However, no problems arises even if the ferroelectric material is left on the bit line 14.

Figure 2D:
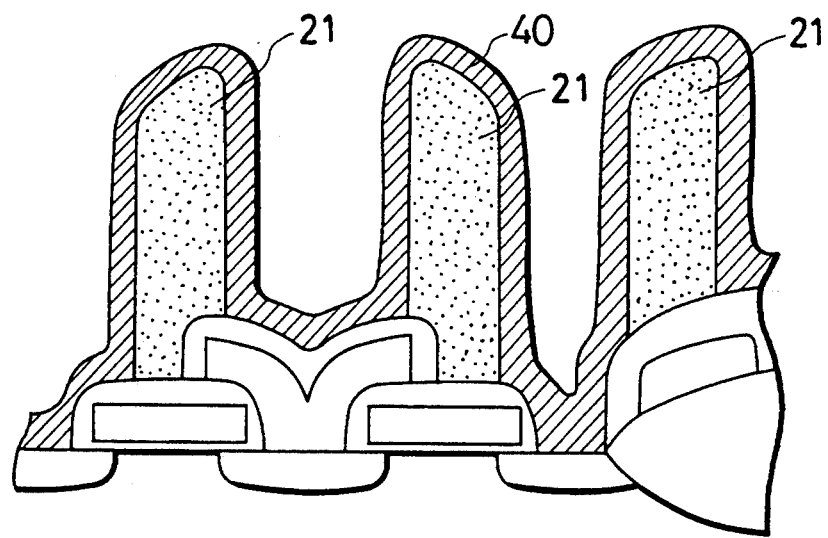
FIG. 2d illustrates the manufacturing process according to Example 1 of the present invention.

FIG. 2d illustrates a state where metal or polysilicon film is formed on the surface of the ferroelectric material 21. In this example, aluminum film was formed by a RF sputtering method at the film forming temperature of 300° C. The sputtering process is arranged in such a manner that an aluminum target, the purity of which is seven-nine, is used and RF electric power is applied in an argon atmosphere. At this time, the aluminum film 40 and the electrode of the transistor must be electrically connected to each other.

Figure 2E:
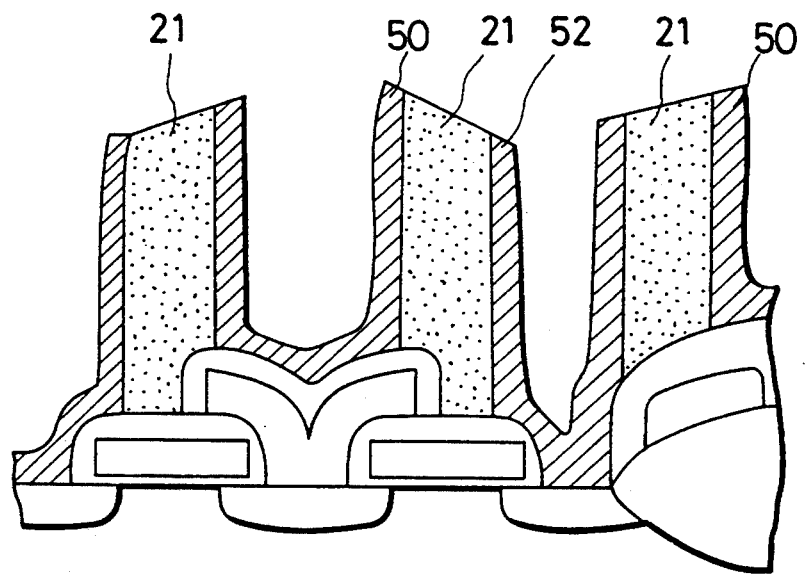
FIG. 2e illustrates the manufacturing process according to Example 1 of the present invention.

FIG. 2e illustrates a process in which a portion of the aluminum thin film 40 deposited on the ferroelectric material 21 is removed, and the source electrode 50 and the plate electrode 52 are separated from each other. The interval between the electrodes is determined depending upon the required capacity and the specific resistance of the film.

Then, the protection film 61 is formed on the entire surface, so that the capacitor shown in FIG. 1 manufactured.

Figure 3:
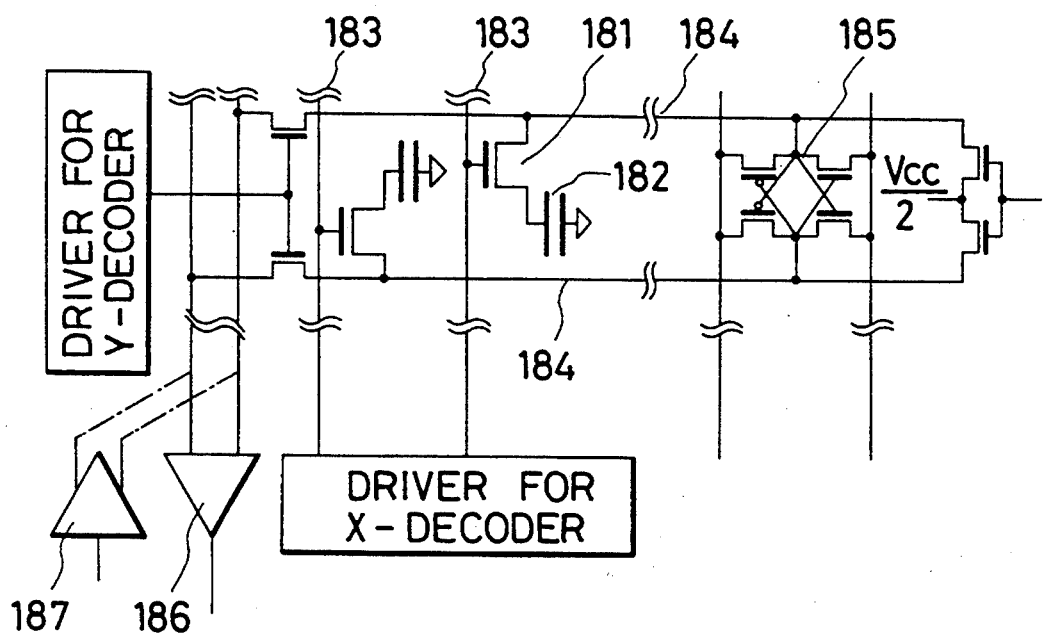
FIG. 3 is a circuit diagram which illustrates a DRAM which uses the present invention capacitor.

FIG. 3 illustrates a DRAM which uses the capacitor according to the present invention. Reference numeral 181 represents a MOS transistor, 182 represents the capacitor according to the present invention, 183 represents a word line, 184 represents a bit line, 185 represents a sense amplifier, 186 represents reading circuit, and 187 represents a writing circuit.

The capacitor according to the present invention enables a capacitance of about 100 fF to be obtained when the area of the dielectric material is 0.75 μm². Since a voltage level of 0.75 V, which is the half of the power supply voltage of 1.5 V, is applied to the electrode, a charge of 75 fC can be stored. The resistance ratio at the time of the side wall portions of the ferroelectric material 21 is about $10^{13}$ Ωcm and the interval between the electrodes is made to be 0.2 μm, so that the leakage current can be satisfactorily reduced when it is used as a DRAM cell. The permittivity of the aforesaid material was about 3,000.

Figure 63:
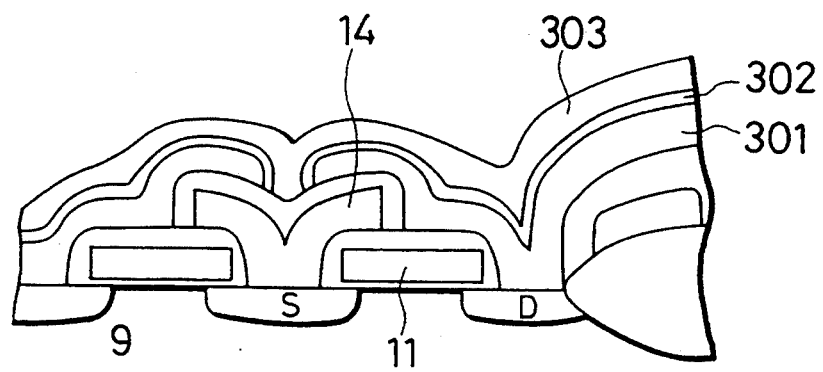
FIG. 63 is a circuit diagram for use in the memory cell portion of a prior art DRAM.
Figure 64:
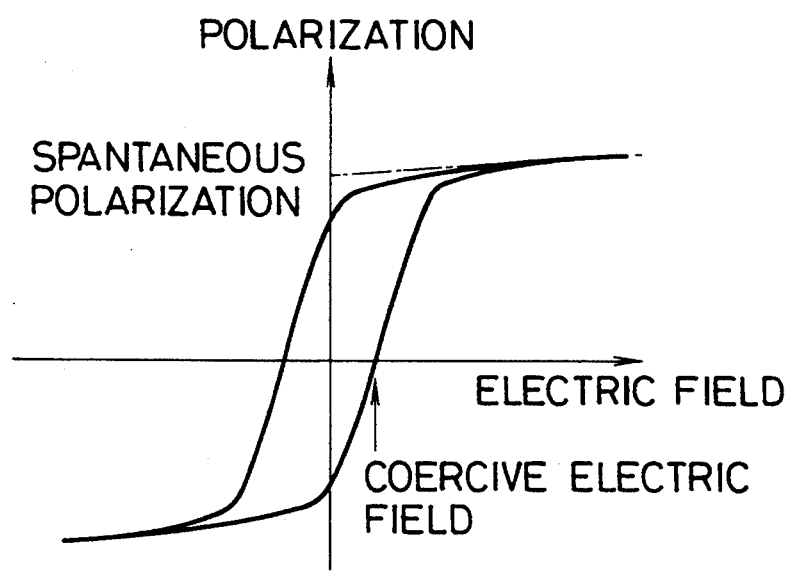
FIG. 64 illustrates a prior art spontaneous polarization.

According to this example, the area required for the memory cell to be formed can be reduced to about one-third in comparison to the conventional memory cell structure which uses the SiO$_2$ film as the insulating material 302 as shown in FIG. 63.

Figure 4:
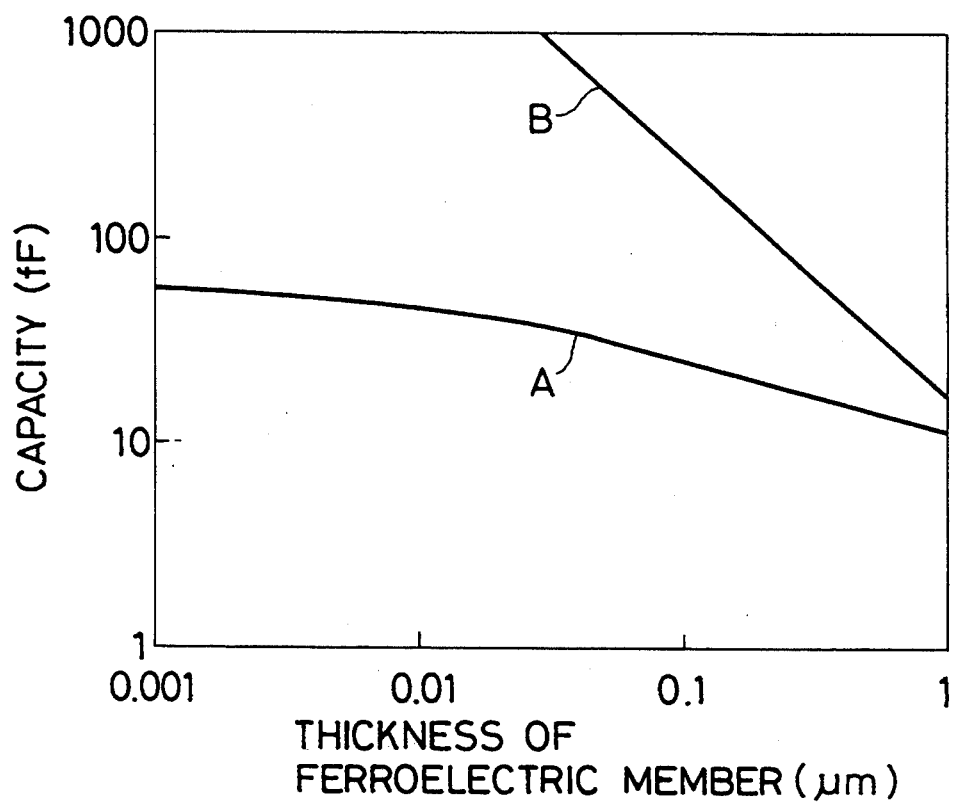
FIG. 4 is a graph which illustrates the relationship between the thickness of a ferroelectric film and the capacity.
Figure 5:
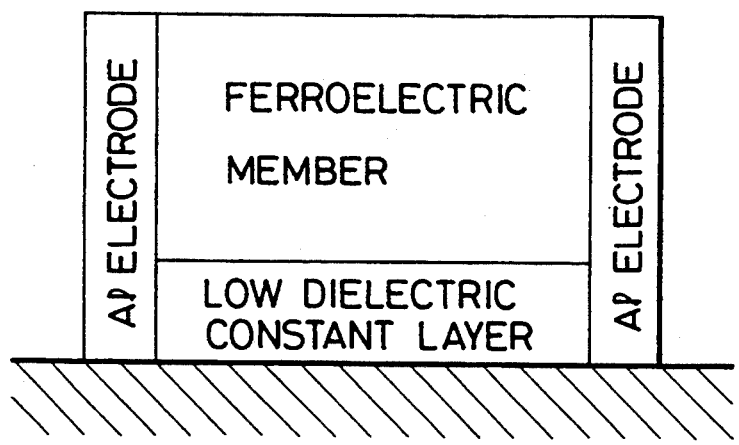
FIG. 5 illustrates the relationship among a base material, a low permittivity layer and a high permittivity layer according to the present invention.
Figure 8:
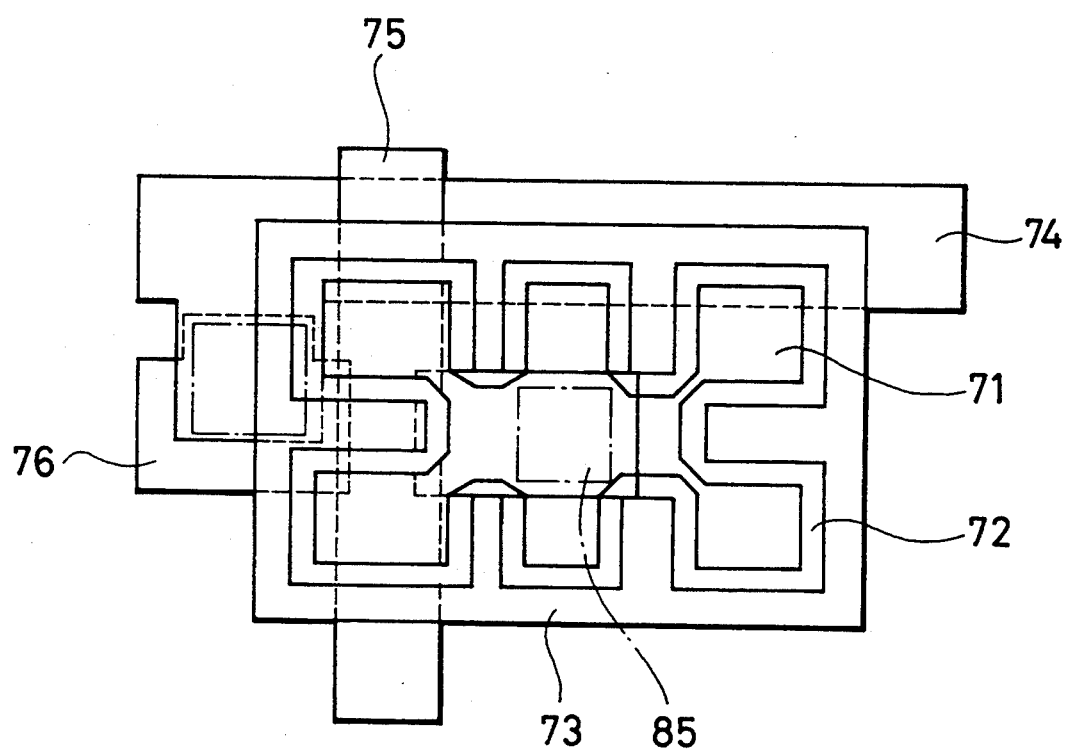
FIG. 8 is plan view which illustrates another DRAM cell portion which uses the high permittivity material according to Example 1 of the present invention.
Figure 65:
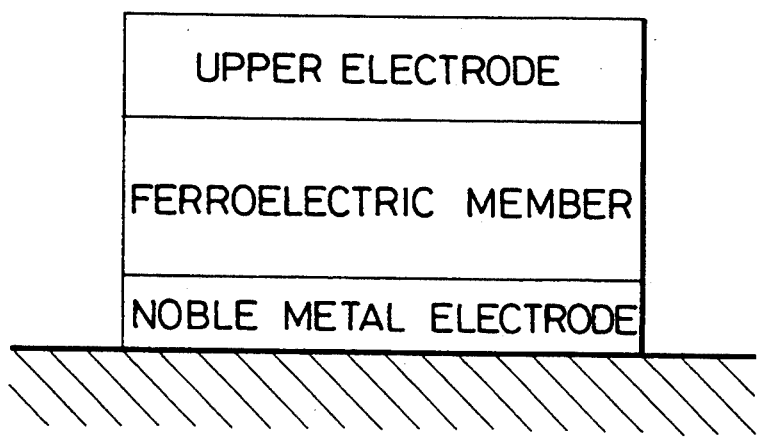
FIG. 65 illustrates the structure of a prior art capacitor in the case where noble metal is used to form the base electrode.

FIGS. 4 and 5 are schematic views which illustrate the effect of this example. FIG. 65 illustrates a conventional capacitor which uses a noble metal electrode. The aforesaid device structured as shown in FIG. 8 must be subjected to an ion milling process for the purpose of processing platinum, causing a problem to arise in that it cannot be fined satisfactorily. Therefore, a memory cell area which is about 1.5 times that of this example is required in order to obtain the same capacitance as that obtainable from this example. Although the processability can be improved in the case where aluminum or polysilicon is used to form the electrodes, the fact that the electrodes are oxidized at the time of forming the ferroelectric film and therefore an aluminum oxide or an SiO$_2$ film each having a low permittivity are formed deteriorates the capacitance to about one-eighth of that obtainable from this example (see curve B) as shown in FIG. 4 in a state where the dielectric material have a thickness of 1.2 μm if the capacitor is constituted while making the thickness of the ferroelectric film and the electrode area to be the same as the aforesaid case. Since the electrodes of the ferroelectric capacitor according to the present invention and shown in FIG. 5 are formed after the ferroelectric film has been formed, no oxide having a low permittivity is formed on the interface between the electrode and the ferroelectric material. Therefore, metal or polysilicon which reveal excellent processability can be used to form the electrodes, causing a fine process to be performed.

In this example, a BPSG film is formed after the metal electrode shown in FIG. 2d has been formed, and it is etched back so as to cause only the upper portion of the metal electrode to appear outside. Then, only the metal present on the upper portion of the ferroelectric material is etched so as to separate the electrodes from each other. As an alternative to this, the memory cell portion can be constituted by forming an insulating film made of SiO$_2$ or the like. In the aforesaid process, only one lithography mask required to pattern the ferroelectric material for constituting the ferroelectric material is used. Therefore, the number of mask can be saved, the enlargement of the mask required for mask aligning accuracy can be prevented, and the deterioration of the yield due to the defective alignment of the mask can be prevented in comparison to the conventional process in which a complicated memory cell is constituted.

Example 2

Figure 6:
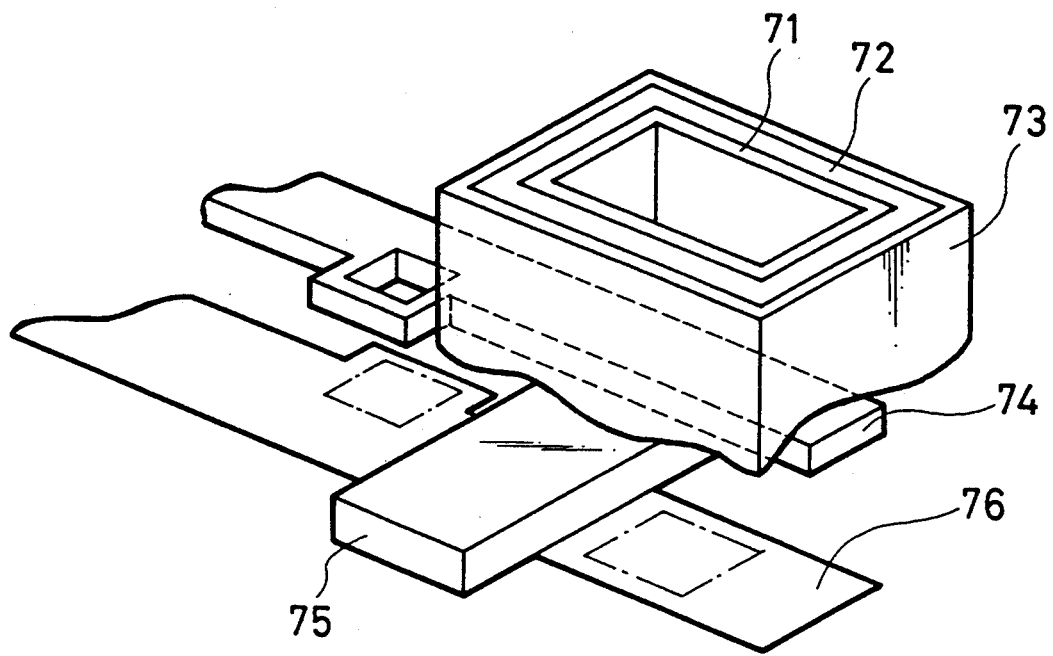
FIG. 6 is a perspective view which illustrates a DRAM cell portion which uses the high permittivity material according to Example 1 of the present invention.
Figure 7:
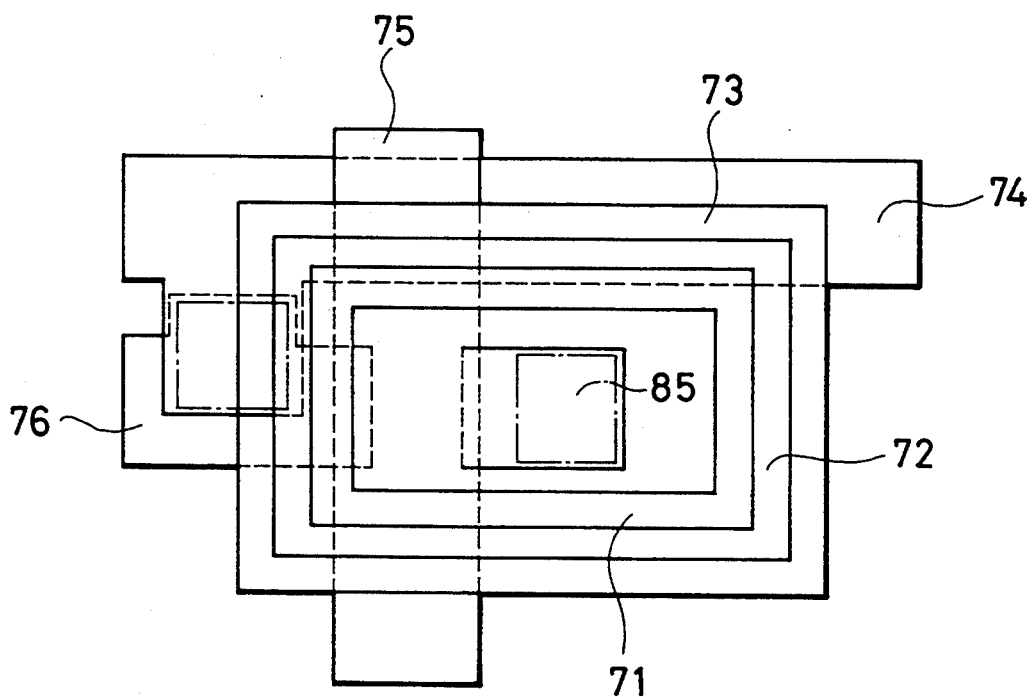
FIG. 7 is a plan view which illustrates the DRAM cell portion which uses the high permittivity material according to Example 1 of the present invention.

FIGS. 6 and 7 respective are a perspective view and a plan view which illustrate a DRAM cell which uses the dielectric material having a high permittivity according to Example 1. In this example, ferroelectric film 72 is formed to surround a drain electrode 85 (at the position designated by a dashed line) of the MOS transistor. As a result, the height of the capacity cell can be lowered from 1 μm to 0.7 μm assuming that the same capacitance obtainable from the structure, which uses the ferroelectric material, is realized as that according to Example 1. Therefore, the step can be reduced after the memory cell has been constituted, causing the breakage of the wiring taken place due to the presence of the step at the time of forming the aluminum wiring later to be decreased by about 10%. Therefore, the yield of the device can be improved.

Figure 13:
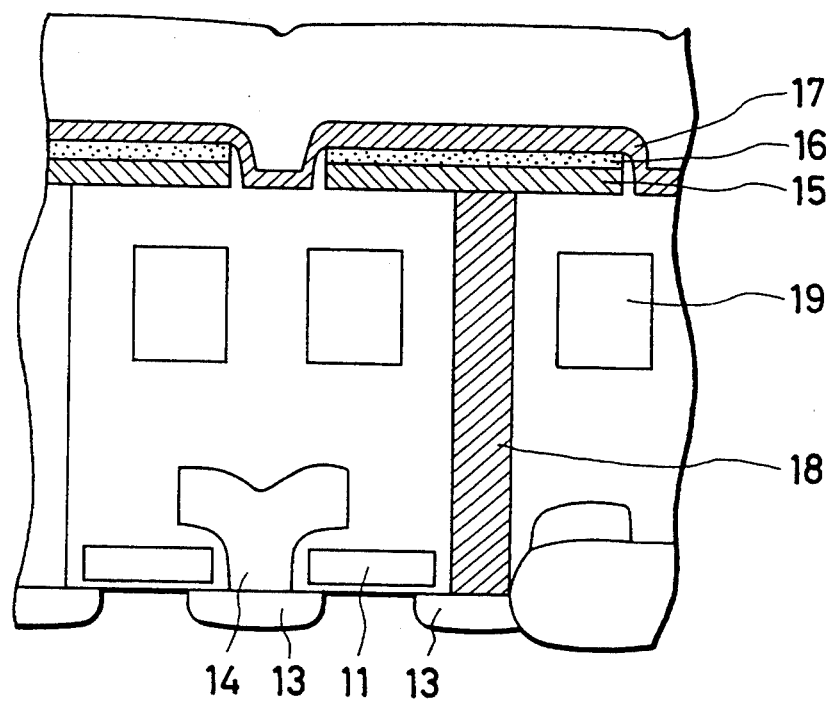
FIG. 13 illustrates a DRAM, FRAM memory cell portion in which the ferroelectric capacitor according to the present invention is formed on the final wiring.

FIG. 8 is a plan view which illustrates another DRAM cell which uses the dielectric material having a high permittivity according to Example 1. As shown in FIG. 13, the ferroelectric material film is formed to surround the electrodes of the MOS transistor so that a layout can be employed in which the surface area of the electrode is enlarged. Assuming that the same capacitance is obtained as that obtainable from the aforesaid structure, the height of the ferroelectric material can be lowered to 0.4 μm. Therefore, breakage of the wiring taken place due to the same reason as that in the case of the aforesaid case can be decreased by about 25%.

Example 3

FIGS. 9a to 9d are cross sectional views which illustrate a process of manufacturing a DRAM cell in which a spacer having projections and pits is used to form projections and pits on the ferroelectric material so as to enlarge the surface area of the capacitor.

Figure 9A:
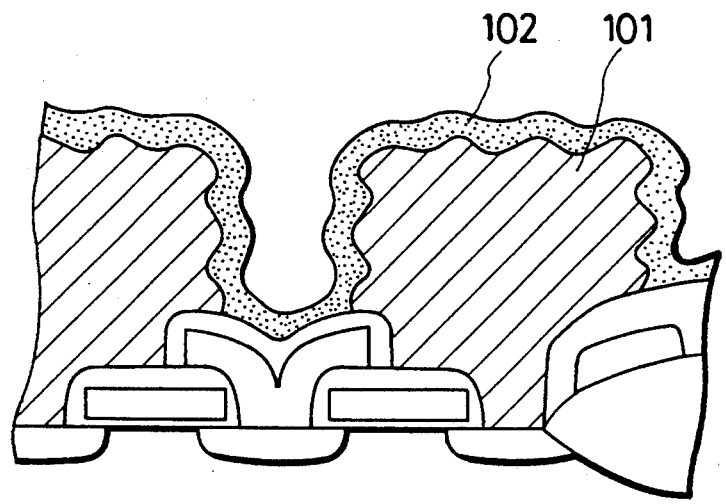
FIG. 9a illustrates the process for manufacturing the capacitor according to Example 3 of the present invention.
Figure 14:
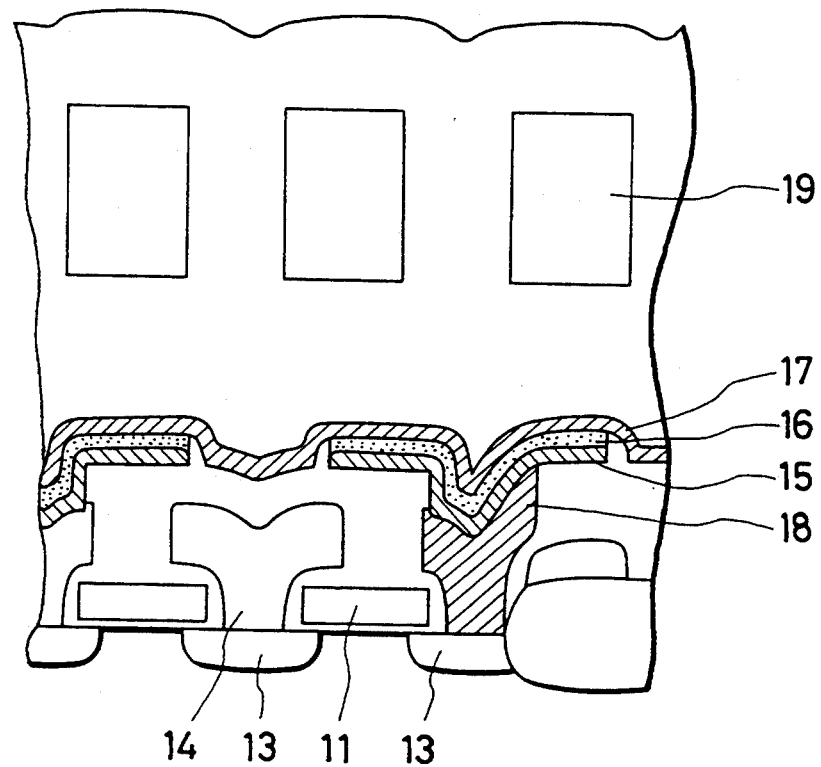
FIG. 14 illustrates a DRAM, FRAM memory cell portion in which the ferroelectric capacitor according to the present invention is formed between bit lines.

FIG. 9a illustrates the manufacturing process according to this example. Similarly to FIG. 2a, a MOS transistor is formed, and polysilicon is deposited at a relatively low temperature of 550° C. so that grains about 0.1 to 0.05 μm are formed on the surface of the polysilicon layer. Then, process is performed in such a manner that the grains are left in the vicinity of the contact electrode of the MOS transistor. As a result, polysilicon islands 101 having the projections and pits as shown in FIG. 14 are formed. The height of each island was made to be 0.5 μm.

Then, PbMgNbO$_3$ ceramics are used as a target and an argon gas is used as a sputtering gas, so that a PbMgNbO$_3$ ferroelectric film 102 is formed on the substrate. The relative permittivity of the formed PbMgNbO$_3$ film is about 5,000. The film forming process was arranged so as to make the film thickness to be 0.2 μm at the side wall portion of the island.

Figure 9B:
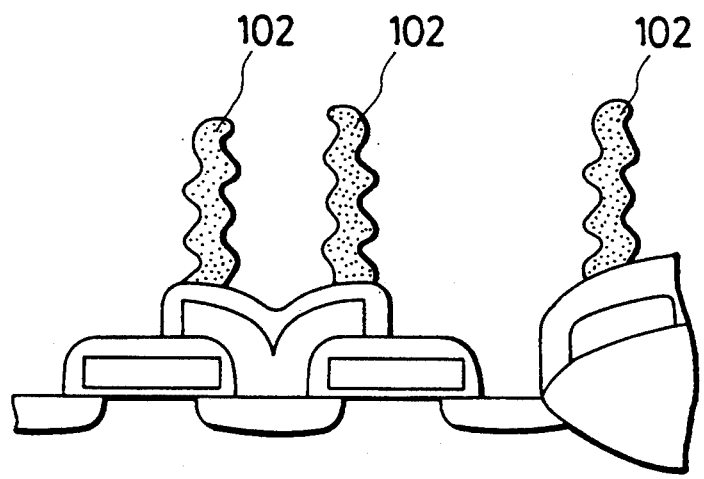
FIG. 9b illustrates the manufacturing process according to Example 3 of the present invention.

FIG. 9b illustrates the manufacturing process according to this example. The ferroelectric film 102 is removed from a portion except for the side wall portion of the island by dry etching. Then, the polysilicon portion in the islands and a SiOx formed in the vicinity of the boundary portion between the polysilicon portion and the PbMgNbO$_3$ are removed so that only the ferroelectric film 102 made of PbMgNbO$_3$ is left as illustrated. Although the polysilicon portion does not need to be removed completely, the SiOx present in the vicinity of the boundary portion must be completely removed.

Figure 9C:
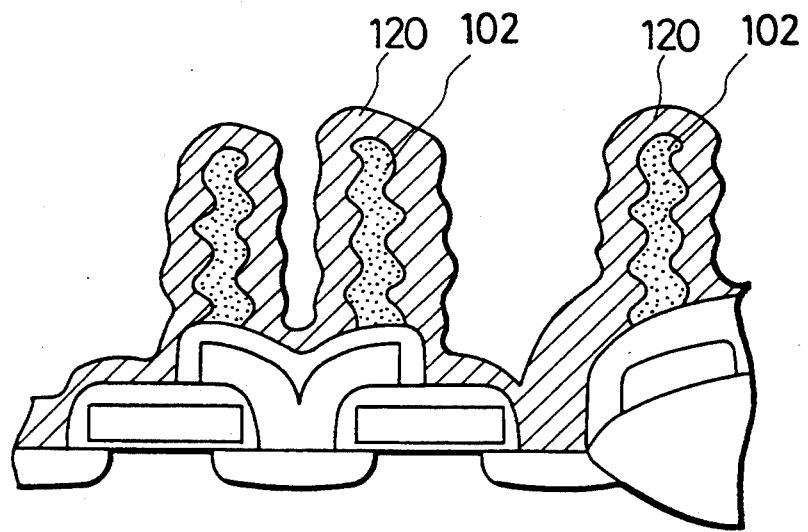
FIG. 9c illustrates the manufacturing process according to Example 3 of the present invention.

FIG. 9c illustrates the manufacturing process according to this example. As the electrodes, titanium siliside 120 is formed.

Figure 9D:
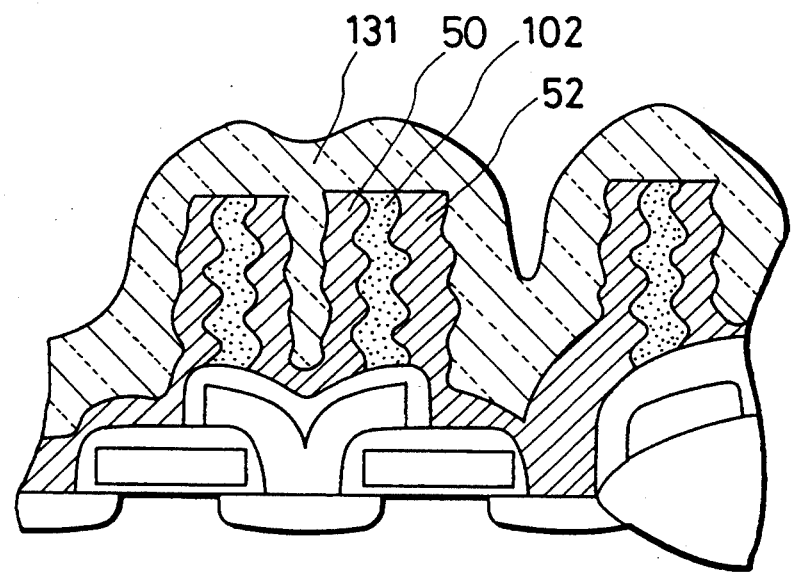
FIG. 9d illustrates the manufacturing process according to Example 3 of the present invention.

FIG. 9d illustrates the manufacturing process according to this example.

The top portion of the titanium siliside 120 is cut and separated so that a protection film 131 is formed to cover the overall portion, so that a memory cell is formed.

Example 4

FIGS. 10a to 10d are schematic cross sectional views which illustrate another process of manufacturing a DRAM cell in which a spacer having projections and pits is used to form projections and pits on the ferroelectric material so as to enlarge the surface area of the capacitor.

Figure 10A:
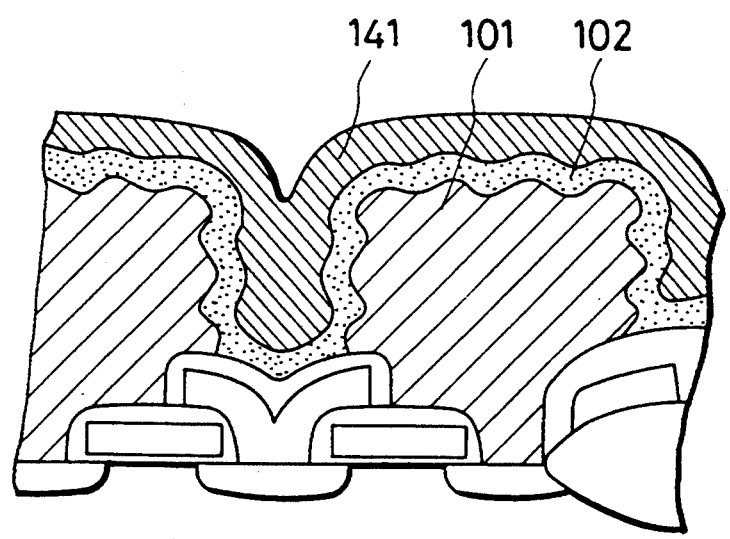
FIG. 10a illustrates the process for manufacturing the capacitor according to Example 4 of the present invention.

FIG. 10a illustrates the manufacturing process according to Example 4.

In the example shown in FIG. 10a, a first electrode 141 which is first made to be a plate electrode is formed on the ferroelectric material 102 made of $Pb(Mg,Nb)O_3$ shown in FIG. 9a.

Figure 10B:
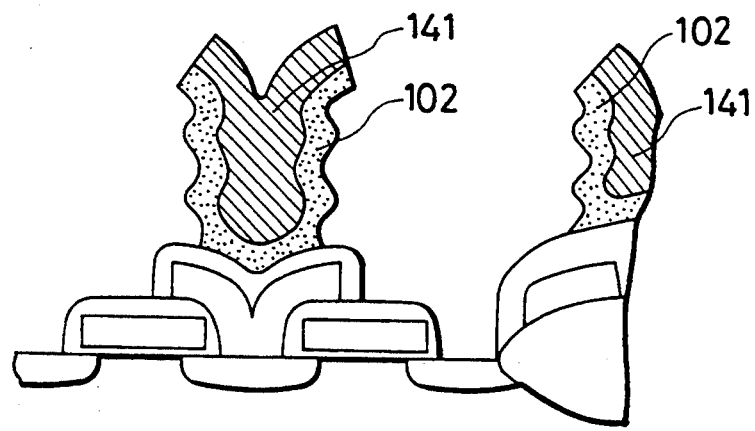
FIG. 10b illustrates the manufacturing process according to Example 4 of the present invention.

FIG. 10b illustrates the manufacturing process according to Example 4.

A portion of the first electrode 141 is etched, and the island 101 made of polysilicon is etched.

Figure 10C:
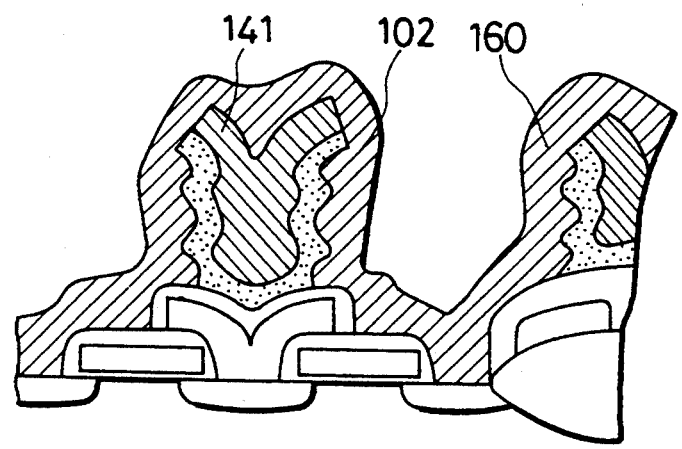
FIG. 10c illustrates the manufacturing process according to Example 4 of the present invention.

FIG. 10c illustrates the manufacturing process according to Example 4.

As an electrode which is made to be a storage node 160, an n-type polysilicon film 160 is formed on the entire surface by a CVD method.

Figure 10D:
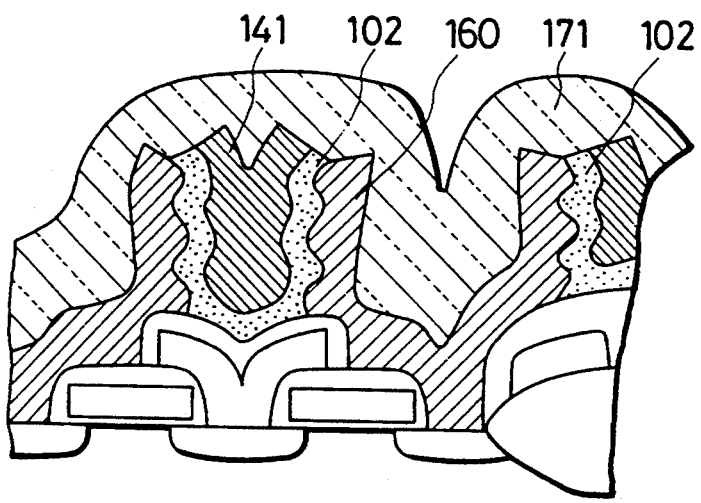
FIG. 10d illustrates the manufacturing process according to Example 4 of the present invention.

FIG. 10d illustrates the manufacturing process according to Example 4.

The storage node 160 and the first electrode 141 are electrically insulated from each other by dry etching, so that a protection film 171 is formed finally. As a result, a similar cell structure can be obtained.

The similar cell structure can be obtained by another method shown in FIG. 10a in which the first electrode 141 which is made to be the plate electrode is further formed on the ferroelectric material 102 made of $PbMgNbO_3$, and then the process similar to the aforesaid process is performed.

In the case where the height of the ferroelectric material is made to be 0.4 μm while constituting the capacitor according to this example by the same manner as shown in FIG. 8, a capacitance of 150 fF can be obtained even if the area of the memory cell is reduced to 0.5 μm×0.4 μm which is the half of the area according to Example 1. Thus, the area required to form the capacity can be reduced.

Example 5

An example of a ferroelectric memory is shown in which a $Pb(ZrTi)O_3$ film is formed as the ferroelectric film and the spontaneous polarization is utilized. A sol-gel method is employed to form the aforesaid film.

Figure 11:
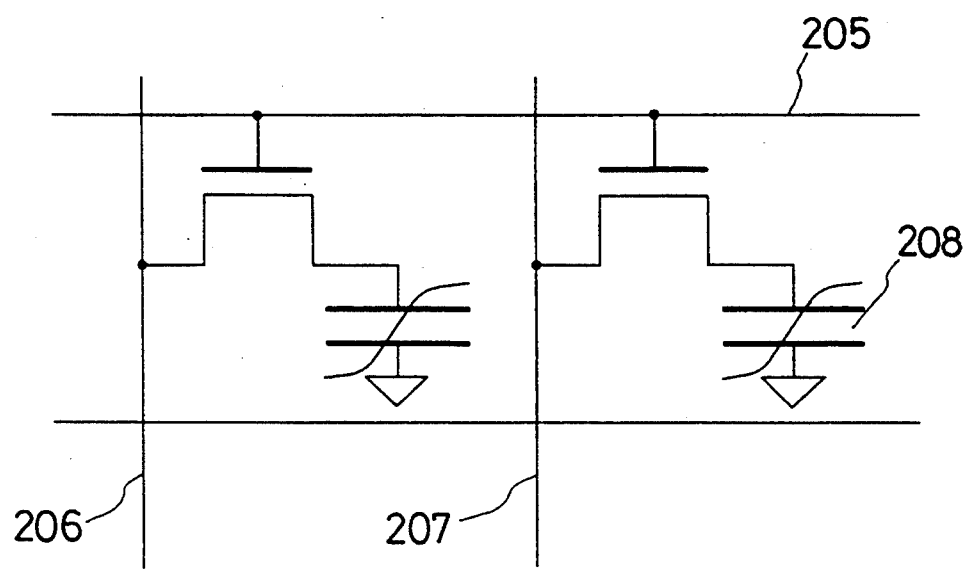
FIG. 11 is a circuit diagram which illustrates a DRAM cell portion which uses the present invention ferroelectric capacitor.

FIG. 11 is a circuit diagram which illustrates a ferroelectric nonvolatile memory which uses the capacitor according to the present invention.

The cell thus constituted has the same cross sectional as that shown in FIG. 1. Reference numeral 208 represents a ferroelectric capacitor. According to this example, the cell area can be significantly reduced in comparison to the conventional structure in which platinum electrodes are disposed in parallel to the substrate. In the case where the conventional cell structure is employed while utilizing the polarization inversion, an area of several μm square is required to obtain the charge with which reading is enabled. On the contrary, a capacity area of 1 μm square is sufficient to obtain a satisfactorily large polarization-inverted charge according to this example in which the height of the ferroelectric material is 1.5 μm, the film thickness is 0.2 μm, the plane structure shown in FIG. 8 is employed, and projections and pits are formed on the surface of the ferroelectric material as employed in Example 3. Furthermore, advantages can be realized in the ferroelectric nonvolatile memory that the degree of integration and the processing speed can be raised and the cost can be reduced by forming, at 600° C., the electrode by using polysilicon, which has been doped to an n-type, and which can significantly easily be processed finely in comparison to platinum. Although this example is arranged in such a manner that the storage device is formed by two pairs each of which is composed of the capacity and the MOS transistor, similar advantages in that the cell area can be reduced and the degree of integration can be raised are realized in the case of another nonvolatile memory which uses the spontaneous polarization of the ferroelectric material.

Example 6

The ferroelectric material, as the aforesaid materials, contains a multiplicity of elements such as heavy metal or magnesium which changes the characteristics of the semiconductor or the insulating film. The aforesaid material is dispersed in an active region of the MOS transistor during the process for forming the ferroelectric film or a process after the ferroelectric film has been formed, causing the energy band gap level of the semiconductor to be changed. As a result, a problem arises in that the MOS transistor turning off current increases or the threshold voltage is changed.

Figure 12:
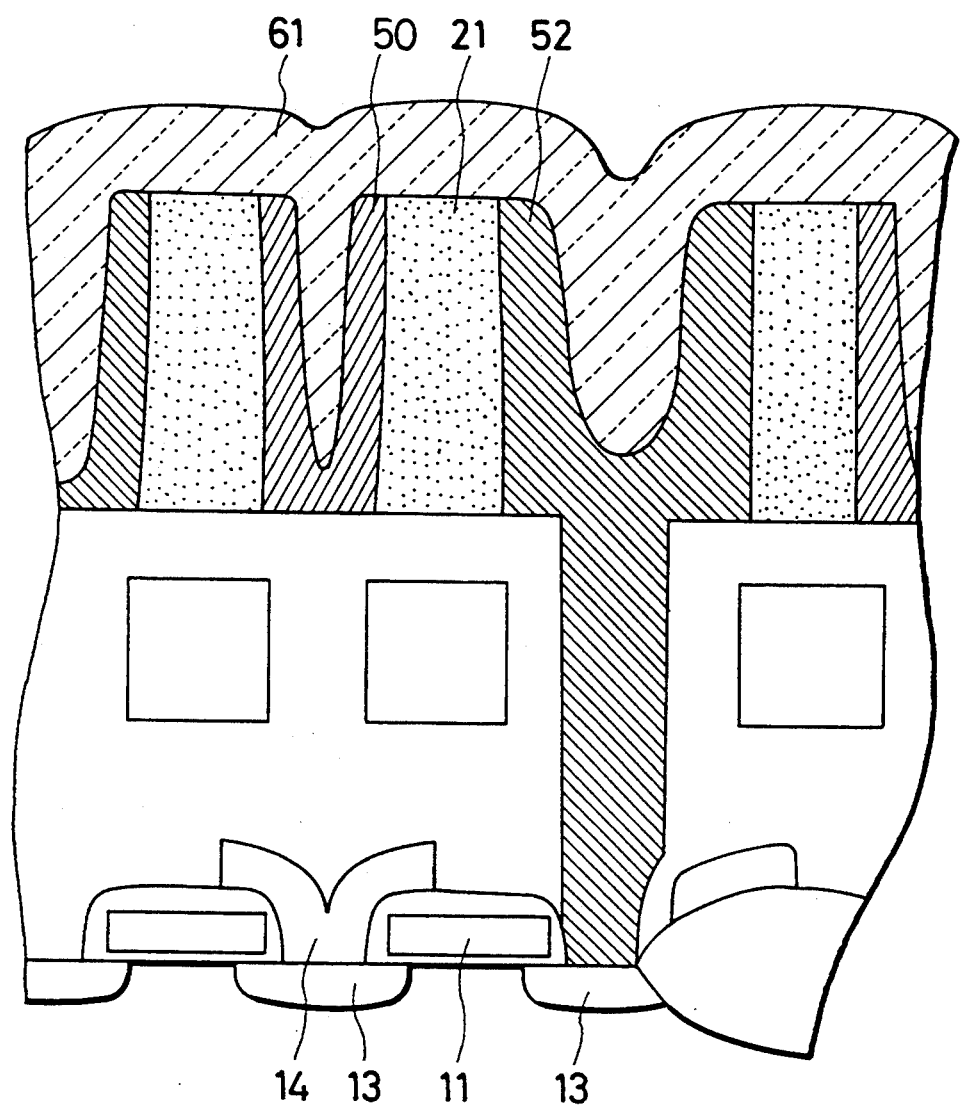
FIG. 12 illustrates the structure of a DRAM cell in which the capacitor which uses the ferroelectric material according to the present invention is formed at the top end of the substrate.

FIG. 12 is a cross sectional view which illustrates a cell of a DRAM constituted in such a manner that the capacitor, which uses the ferroelectric material, is formed after the control transistor, driving peripheral circuits and metal wiring have been formed. In the aforesaid structure, the metal contained in the ferroelectric material does not considerably change the characteristics of the MOS transistor due to a high temperature process or the like after the ferroelectric film has been formed. As a result, the reliability of the device can be maintained for a long time. When the device shown in FIG. 1 and the memory structured as shown in FIG. 12 were evaluated, resulting in the turning off current of the MOS transistor can be reduced by a quantity of about one digit in the case shown in FIG. 12 in comparison to the case shown in FIG. 1.

As a method of preventing the dispersion of the aforesaid metal in the semiconductor, a barrier member made of titanium nitride or the like is formed between the ferroelectric material and the transistor, or an insulating material such as BPSG or PSG which has a high degree of solid solution with the aforesaid heavy metal is used as a correlation insulating film or the like. As a result, the diffused metal elements are caught into the insulating film before they reach the active region of the transistor, causing an effect to be obtained in that the change of the transistor characteristics due to the metal elements to be prevented. The technique for forming the barrier member has been disclosed in Example 7.

The metal element for forming the ferroelectric material is exemplified by uranium, radium type, actinium type, tritinium type and neptunium type radioisotopes. The aforesaid element, for example, lead is converted into Bi, the atomic number of which is larger by one, or Po, the atomic number of which is larger by two due to β-ray decay. The aforesaid element is then converted into Tl or Pb due to α-ray decay. The aforesaid α-rays are incident on a depletion layer formed adjacent to the MOS transistor, causing the soft error to take place. In order to satisfactorily prevent the soft error, the metal elements are refined sufficiently to remove impurity metal and also remove the radioisotope.

As shown in FIG. 12 by forming the ferroelectric material so as to be positioned away from the MOS transistor after the wiring process has been completed, the probability of flying of the α-rays to the depletion layer can be lowered even if the α-rays are generated. As a result, the soft error generation probability can significantly be lowered.

The restriction of the change of the characteristics of the MOS transistor thanks to the structure shown in FIG. 12 and the reduction of the soft error generation due to the α-rays are not limited to the aforesaid device in which the capacitor is used which has electrodes on the side walls of the ferroelectric material thereof. The aforesaid structure can be effectively applied to the conventional technology in which the capacitor is constituted in such a manner that the ferroelectric material is formed on the base electrode.

The dielectric film is not limited to the ferroelectric film, and is applied to, for example, a device which uses a metal oxide film or a metal nitride film which is able to cause a problem of the change of the characteristics of the transistor and a problem of the soft error.

FIG. 13 illustrates the cross sectional structure of the DRAM cell portion according to this example.

As shown in FIG. 13, a metal wiring 19 is formed, a wiring protection film is formed, and a lower metal 15 which is made to be the storage node, a dielectric film 16 and a plate line 17 are formed, and a contact electrode 18 made of polysilicon for connecting the base metal 15 and the MOS transistor is formed, so that the final protection film is formed. Similarly to the aforesaid case in which the capacity is formed on the metal wiring, a similar effect can be obtained in the case where the ferroelectric capacitor is formed on the bit line.

FIG. 14 illustrate the structure in which the ferroelectric capacitor is formed above the bit line.

Figure 15:
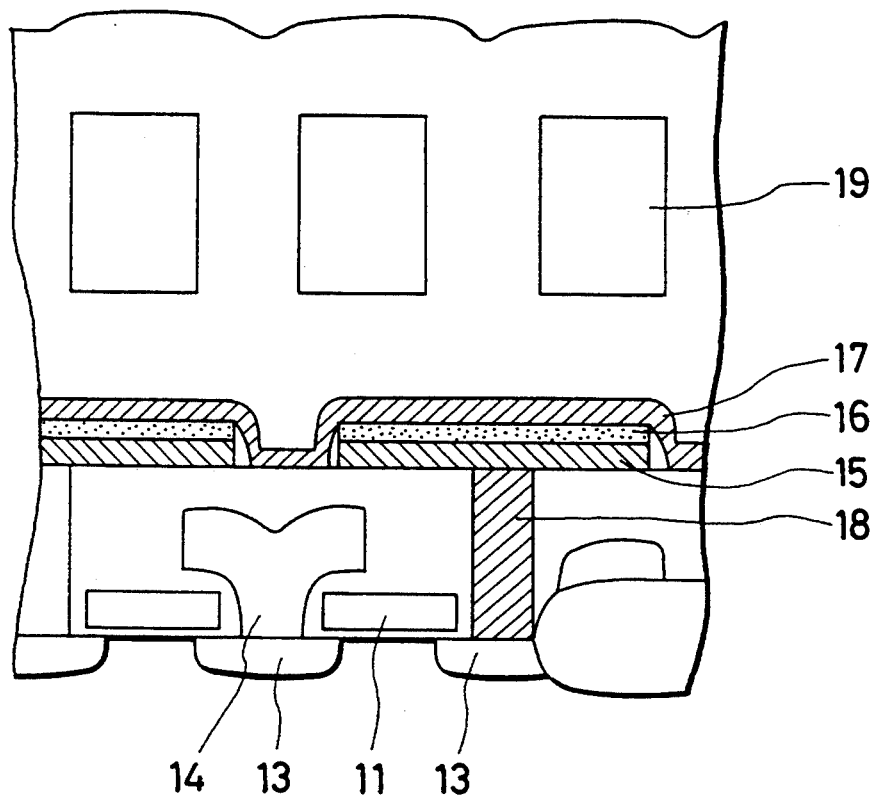
FIG. 15 illustrates a DRAM, FRAM memory cell portion in which the ferroelectric capacitor according to the present invention is formed after the interlayer film between bit lines has been subjected to planation.

FIG. 15 illustrates the cross sectional structure of another DRAM cell portion.

Figure 27:
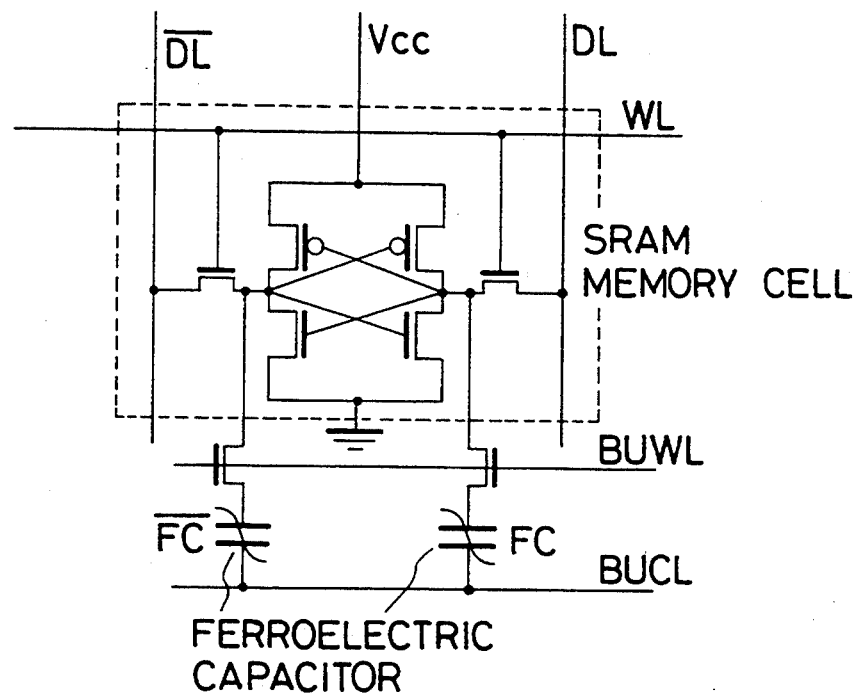
FIG. 27 is a circuit diagram which illustrates an SRAM memory cell which uses a prior art ferroelectric capacitor.

The structure shown in FIG. 27 is arranged in such a manner that the insulating film on the bit line and contacting polysilicon are subjected to a planation, and the base metal, the ferroelectric film and the plate line are formed and processed. In the aforesaid structure, the base metal surface can be flattened accurately, causing the crystallinity of the ferroelectric film formed on it to be improved. As a result, the permittivity can be improved and the leakage current can be reduced.

Example 7

In the aforesaid examples, the material or the ferroelectric film is formed into a single layer. However, this example is arranged in such a manner that ferroelectric materials having different compositions are formed on the semiconductor substrate, one of the two layers, that is, the first layer being used as a buffer layer with respect to the base oxide layer so as to improve the crystallinity of the ferroelectric material of the second layer and to obtain the ferroelectric characteristics.

Figure 16:
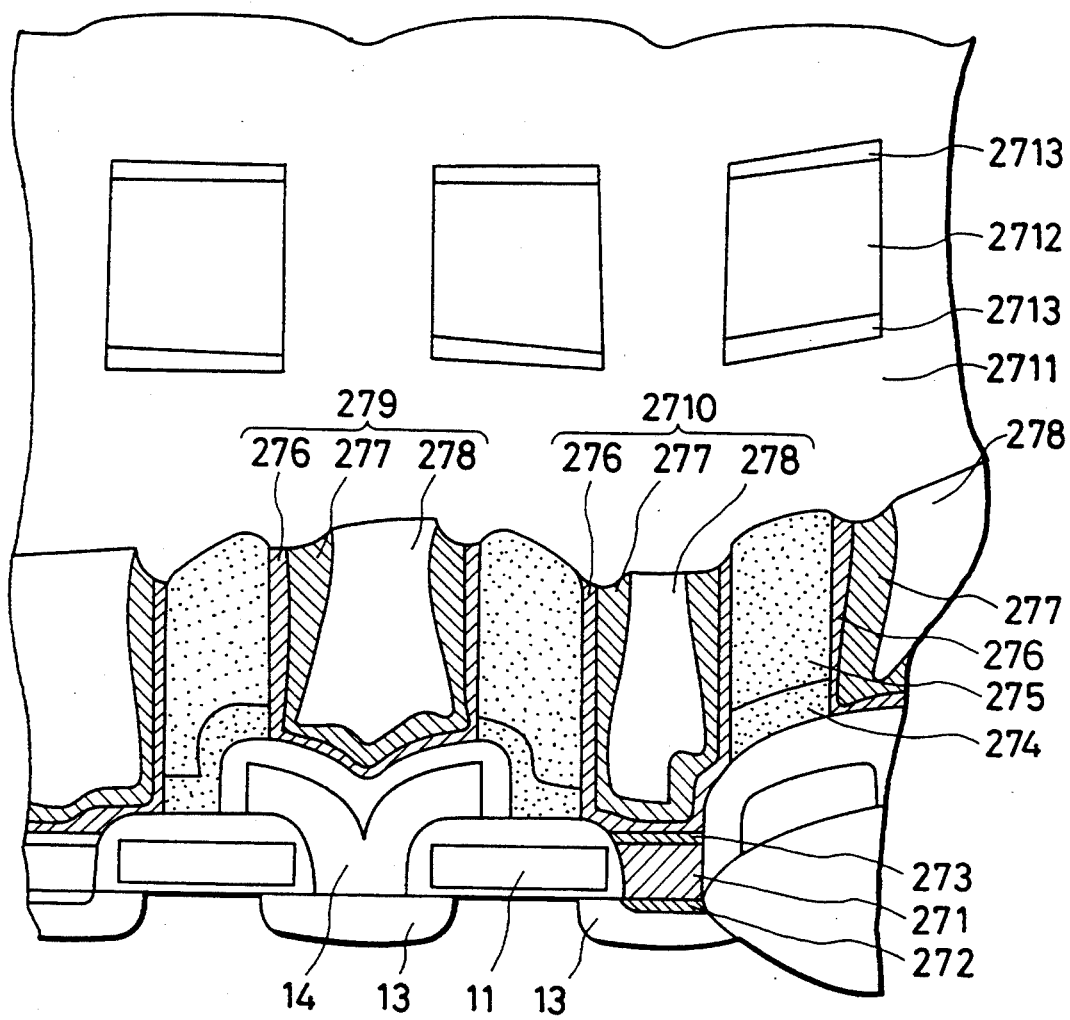
FIG. 16 illustrates a memory cell which uses a multi-layer ferroelectric material and a multi-layer electrode according to an example of the present invention.

FIG. 16 illustrates a memory cell which uses a multi-layer ferroelectric material and a multi-layer electrode. The memory cell according to this example is designed in accordance with a 0.3 μm rule under conditions that the power supply voltage is 3.0 V, the sense amplifier pitch is 0.8 μm, and the word line pitch is 0.7 μm. However, the present invention is not limited to the aforesaid design dimensions.

As shown in FIG. 2a, the MOS transistor and the bit line are formed on the Si substrate, titanium 271 in the contact hole is formed in order to reduce the contact resistance with silicon. The formed titanium 271 reacts with silicon in the ensuing high temperature process so that titanium siliside 272 having a thickness of about 0.020 μm is formed in the boundary portion with the silicon. The titanium siliside 272 further reduces the contact resistance.

Furthermore, nitride titanium 273, which is made to be barrier layer, is formed on the titanium portion. By forming a barrier material in the contact hole of the drain electrode of the MOS transistor before the ferroelectric film is formed, contamination of heavy metal such as lead and zirconium, and magnesium contained by the ferroelectric material, which will be movable ions in Si, into Si is prevented. If Si were contaminated with the heavy metal or movable ions, an electron energy level is formed in a deep region in the band gap of Si, causing the leakage current to increase in the MOS transistor or causing the threshold voltage to be changed. As a barrier material capable of preventing it, the titanium nitride 273 is used.

Furthermore, a $SrTiO_3$ layer 274 and a $Pb(Mg,Nb)O_3$ layer 275 are formed to respectively have a thickness of 0.1 μm and a thickness of 0.45 μm by a CVD method and a sol-gel method.

Furthermore, a photolithography and a dry etching are processed so that a $Pb(Mg,Nb)O_3$ layer 275 and a $SrTiO_3$ layer 274 are formed to have a width of 0.15 μm and a length of 2 μm. At this time, the height of the ferroelectric layer is 0.5 μm, and the ferroelectric layer is formed to surround the contact hole of the source electrode of the MOS transistor as shown in FIG. 7. Furthermore, an aluminum layer 276 is formed to have a thickness of 0.04 μm and a polysilicon layer 277 is formed to have a thickness of 0.05 μm. Furthermore, boron silicate glass (BPSG) 278 is formed and reflowed at a high temperature of 800° C. Then, the PBSG is etched back until polysilicon present on $Pb(Mg, Nb)O_3$ appears.

Then, polysilicon present on the ferroelectric material is removed by etching, and aluminum present on the ferroelectric material is removed by sulfuric acid. As a result, a plate electrode 279 and a storage node 2710 are electrically separated from each other while interposing the ferroelectric material. As a result, the area of the electrode positioned in contact with $Pb(Mg, Nb)O_3$ is made to be 1 μm² (2 μm×0.5 μm) and the interval between the electrodes is made to be 0.15 μm.

Then, a $SiO_2$ film 2711 serving as a protection film is formed on the capacitor, so that a memory cell is formed. In the case where it is used in a DRAM, aluminum wiring 271 and 272 and the like are formed on it so as to establish a contact with external electrodes before it is enclosed into a package. Thus, the subject process is completed. Although a process of forming the peripheral circuits such as the sense amplifier and the driver circuit and the like are omitted from the description, they are of course included and therefore the structure is as shown in FIG. 3.

A capacitance of about 80 fF is obtained with the capacitor according to this example. Since a voltage of 1.5 V, which is the half of the power supply voltage, is applied to the plate electrode, a charge of 120 fC is stored. Furthermore, a leakage current is reduced to about 1 fA which is sufficiently small value to be used as a DRAM cell.

Although the description is made about Pb(Mg,Nb)O₃ which is used in the DRAM, the present invention is not limited to the aforesaid film. For example, in the case where BaTiO₃, or SrTiO₃ or a solid-solution film, or the main component of which is either of the aforesaid film, is used, excellent response characteristics can be obtained in a high frequency region of 100 kHz or higher although the dimensions of the device are different from the aforesaid device because they have a small relative permittivity in comparison to that of Pb(Mg, Nb)O₃. The reason for this lies in that the mass of Ba atom and that of Sr atom is smaller than that of Pb atom. Since Pb(Ti, Zr)O₃ and (Pb,La)(Ti,Zr)O₃ do not contain Mg which is the component element of Pb(Mg,Nb)O₃, a problem such as the change of the characteristics of the MOS transistor due to the dispersion of Mg or the fact that Mg becomes movable ions can be prevented, so that an effect is obtained in that the reliability is improved.

Example 8

Although a sol-gel method is employed to form the ferroelectric material, a sputtering method, an organic metal gas phase deposition method, an evaporation method or a hydro-thermal method can be employed. If the sputtering method is employed, the composition of the target is changed and therefore the composition of the film can controlled satisfactorily. Hence, a film such as (Pb,La)(Ti,Zr)O₃ and Pb(Mg,Nb)O₃ in which copper is solid-dissolved and the like each of which is composed a multiplicity of elements can easily be formed. The organic metal gas phase deposition method or the hydro-thermal method is able to improve the throughput because films are simultaneously formed on 10 or more substrates.

Figure 17:
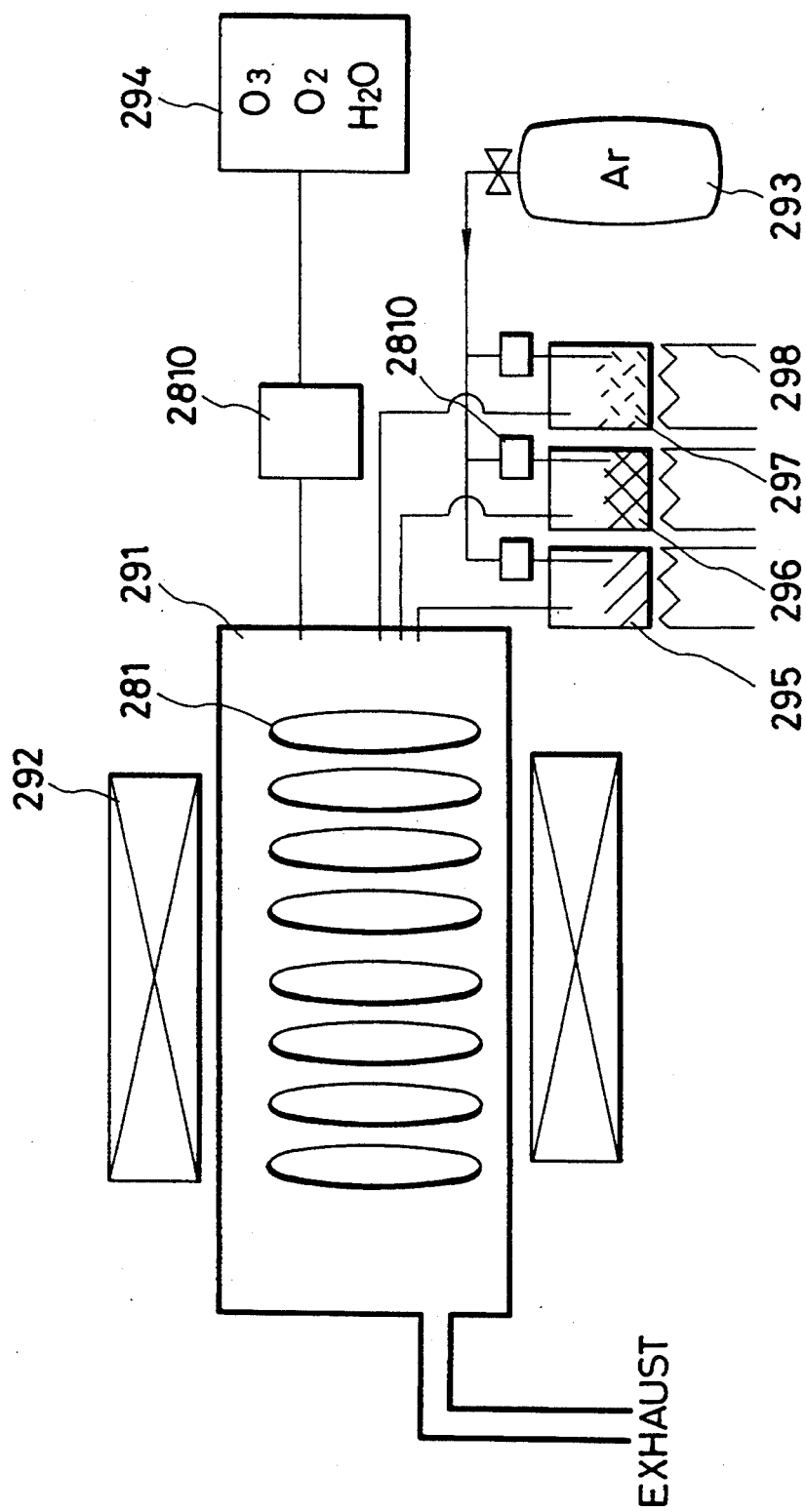
FIG. 17 illustrates the structure of an apparatus for forming the film according to the present invention by an organic metal gas-phase growth method.

FIG. 17 is a cross sectional view which illustrates an organic metal gas phase growing apparatus. In a quartz container the diameter of which is 300 mm, 30 substrates, the diameter of each of which is 8 inches, are placed. The substrates are heated up to 800° C. by a RF heating coil 292 disposed outside the quarts container. The pressure in the vacuum container is previously lowered to 10⁻⁴ Pa, and then, the organic material heated and gasified by using an Ar gas 294 as the carrier gas contacts to the surface of the substrate, so that a film forming process is performed. According to this example, ozone, oxygen and steam 294 are simultaneously introduced. After a film has been formed to have a required thickness, the substrate is gradually cooled down at a gradient of 100° C./hour, so that a multiplicity of ferroelectric films having a large grain size, revealing a high permittivity and capable of reducing the leakage current can be simultaneously formed.

The characteristics of the formed (Sr,Ba)TiO₃ and Pb(Zr,Ti)O₃ were evaluated, resulting in the relative permittivity and the specific resistance of (Sr,Ba)TiO₃ are 4,000 and 3×10¹⁴ Ωcm, and those of Pb(Zr,Ti)O₃ are 1,000 and 10¹⁵ Ωcm. However, the permittivity loss of (Sr,Ba)TiO₃ at a frequency of 100 MHz is smaller than that of Pb(Zr,Ti)O₃ by a quantity of one digit. Therefore, (Sr,Ba)TiO₃ is suitable to be employed in the DRAM which requires an access time of, for example, 80 ns.

However, in the case where dry etching method is employed while using chloride gas plasma, Pb(Zr,Ti)O₃ is suitable to be used in a 256 Mbit DRAM or the like which can be subjected to a very fine process because Pb(Zr,Ti)O₃ can easily be processed at high aspect ratio in comparison to (Sr,Ba)TiO₃.

Example 9

Figure 18:
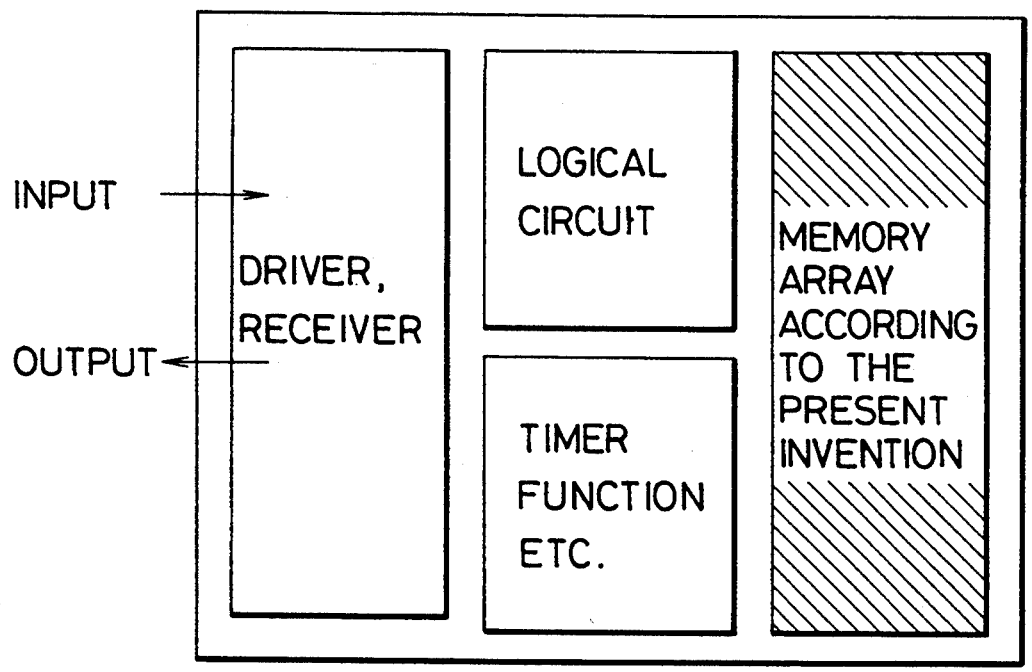
FIG. 18 illustrates the layout of a system LSI in which the memory according to the present invention is formed on a chip.

FIG. 18 illustrates the layout of a system LSI constituted in such a manner that the memory device according to the present invention is formed on a chip. The aforesaid technology is able to be adapted to the following future communication systems: an analog network, a digital network, a narrow band intelligent service digital network (N-ISDN), and a broad band (B)-ISDN. The driver receiver circuit and the like are formed on a chip in order to directly receiving signals from a highly integrated high speed memory, which can be adapted to a multimedia communication including precise natural kinetic pictures, and from a communication circuit.

Figure 19:
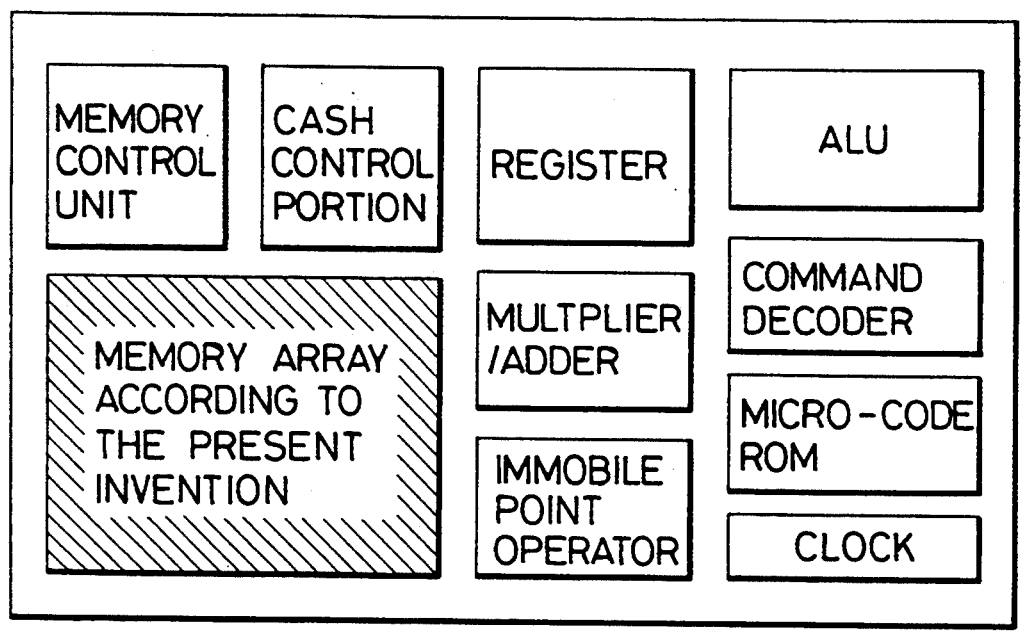
FIG. 19 illustrates the layout of a logical LSI which includes the memory according to an example of the present invention.

FIG. 19 illustrates the layout of a logical LSI (microprocessor) including the FRAM, the DRAM, and the SRAM as cash memories. In the aforesaid case in which the memory device according to the present invention is used as the cash memory, an advantage can be realized in that a logical device having a high grade function can be operated with a small electric power consumption because the memory device according to the present invention has a large capacity and consumes small electric power. Furthermore, another effect can be obtained in that a microprocessor freed from soft errors can be obtained.

Example 10

Figure 20:
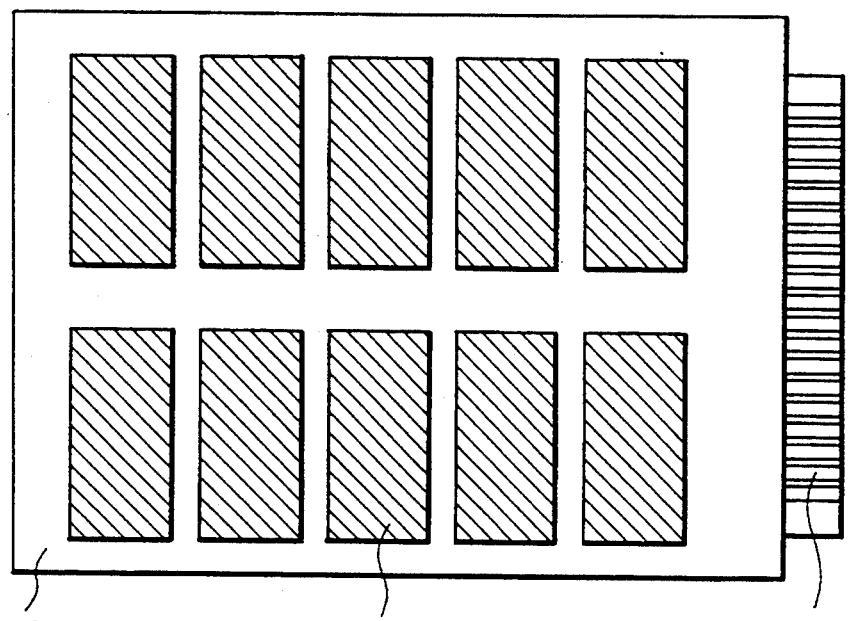
FIG. 20 illustrates the layout of a semiconductor memory board according to an example of the present invention.

FIG. 20 illustrates the layout in which the FRAM, the DRAM or the SRAM according to the present invention is used as the semiconductor memory board. As described above, a significant advantage can be obtained as a low cost and large capacity solid recording medium. In particular, use of the FRAM board enables electrical backup for power failure to be omitted because it is an nonvolatile memory, and therefore the necessity of copying the stored contents onto another recording medium (for example, a magnetic disk or a magnetic tape) as a backup. Furthermore, the fact that it has no movable portion improves the durability against shock and the electric power consumption can be significantly reduced. In addition, another effect can be obtained in that a semiconductor memory board durable against soft errors can be obtained.

The memory device according to the present invention can be applied to a memory card as well as the semiconductor memory board.

Figure 21:
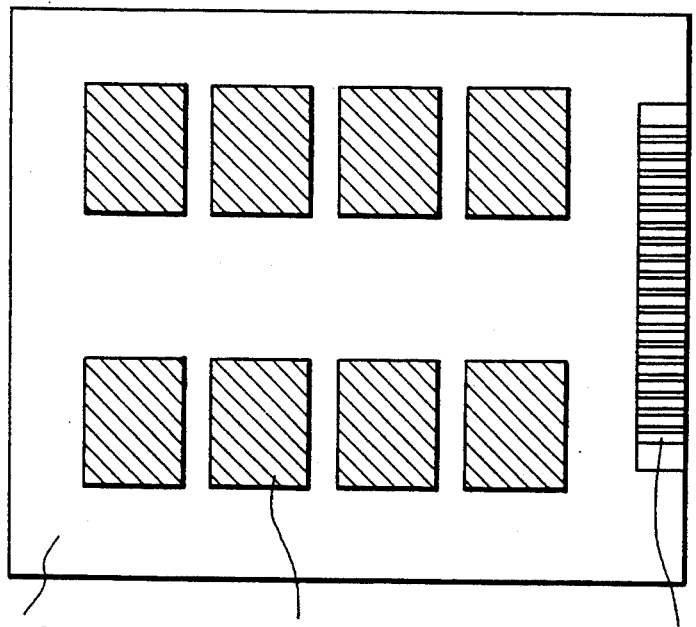
FIG. 21 illustrates a memory card according to an example of the present invention.

FIG. 21 illustrates the layout in which the FRAM, the DRAM or the SRAM according to the present invention is used as the memory card. In particular, a card (a FRAM card), which uses the FRAM, is able to eliminate the battery that the conventional memory card includes for maintaining the storage. Therefore, it can be used similarly to the conventional floppy disk but an advantage can be obtained in that the access time can significantly be shortened in comparison to the floppy disk. Hence, use of the memory card, which employs the memory device, as an interchangeable sub-storage medium such as a conventional floppy disk for a small or a portable computer system, will eliminate the drive system such as a motor and the drive power source. Therefore, the overall size of the system can be reduced, the electric power consumption can be decreased, and a large quantity information can be read/write at high speed. Hence, the processing performance of the overall system can be improved.

Example 11

The aforesaid logical device (microprocessor), the memory device (FRAM, DRAM, and SRAM) according to the present invention, and the semiconductor memory board and the memory card according to the present invention will respectively enable significant effects to be obtained when they are used in a super computer, a large-scale, a general-purpose, a small or medium size computes, a work station, a personal computer, a portable computer, a lap-top computer, a notebook type personal computer.

Figure 22:
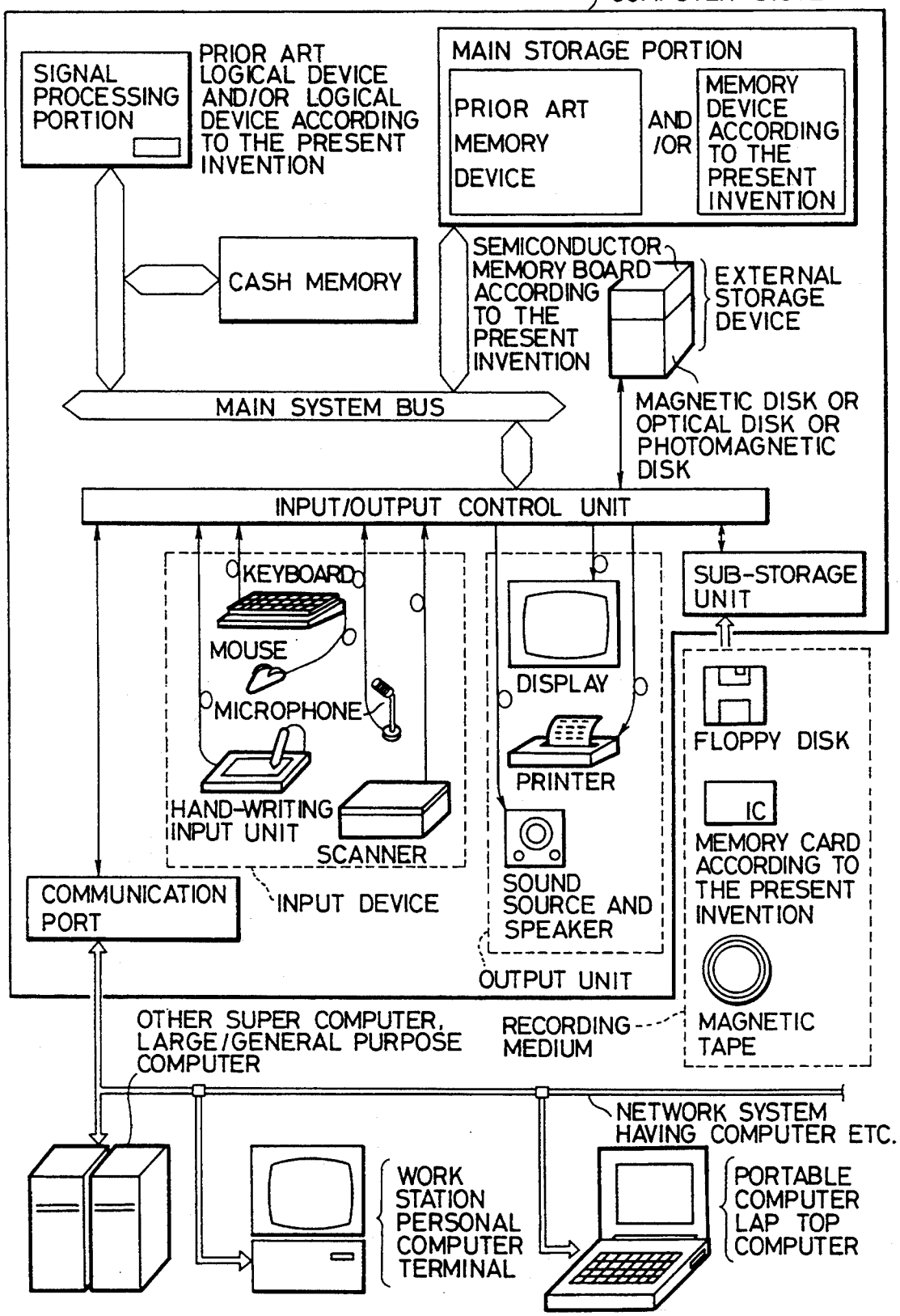
FIG. 22 illustrates a computer system according to an example of the present invention.

FIG. 22 illustrates a computer system according to this example. In the system shown in FIG. 34, the DRAM and the SRAM are used in a similar manner to that in the conventional structure, but the performance such as the processing speed can be improved because the capacity can be enlarged and the cost can be reduced in comparison to the conventional structure. The aforesaid improvement will be significantly effective for the large apparatus rather than the small or medium size computers.

The FRAM has a superior advantages of nonvolatile characteristics, a large capacity and a low electric power consumption to the conventional semiconductor memory. In particular, the nonvolatile characteristics will enable an advantage to be obtained in that the overall size of the system can be reduced because the storage battery provided for power failure which has been required for the large apparatus can be omitted. Furthermore, the stored informations do not need to be copied to a magnetic disk having a low access speed, and therefore larger quantity of information can be processed at a higher speed as compared with the conventional system. Hence, advantages can be obtained in that the processing speed of the overall system can be raised, the performance can be improved, and the size and the cost can be reduced.

Furthermore, advantages can be obtained in the portable personal computer to the notebook type computer in that the system durable against vibrations can be constituted. Furthermore, the aforesaid advantage of the low electric power consumption will enable the system to be operated with the battery for a long time, causing the way of portable use to be widened. Hence, the system can be stably operated even if it is placed in a vehicle.

In addition, in the case where the aforesaid microprocessor is provided in the signal processing portion and the memory device according to the present invention is used in the main storage portion 12, access to large quantity of information can be made at a high speed, causing an effect to be obtained in that a significantly high grade and complicated information process can be performed in a short time.

The system which uses the logical device, the memory device, the semiconductor memory board and the memory card according to the present invention will enable advantages to be obtained in the electric power consumption can be reduced, the size can be reduced and the processing speed can be raised, and therefore, the performance can be improved, and the cost and the electric power consumption can be reduced when they are adapted to an office machine such as a word processor, a printer and the like, computer game system, a disk top calculator, a pocket book type computer and the like. In addition, similar effects can be obtained in controlling an automobile, and home electronic products such as a refrigerator, an audio system and the like.

Example 12

Figure 23:
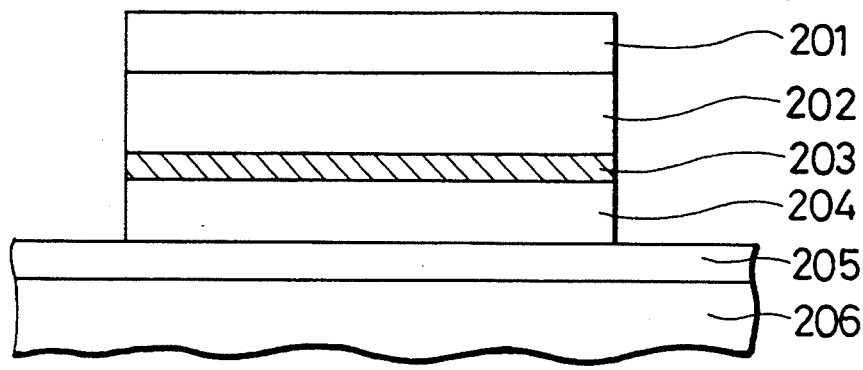
FIG. 23 is a schematic view which illustrates a state of deposition of an oxide ferroelectric thin film according to an example of the present invention.

FIG. 23 is a schematic view which illustrates a state of deposition of an oxide ferroelectric thin film according to Example 12 of the present invention. A $SiO_2$ film 205 is formed on an 8-inch Si substrate 206 to have a thickness of 100 nm, and then a polysilicon film 204 is deposited to a thickness of 100 nm. Then, a lead-titanium alloy film 203 is formed to have a thickness of 50 nm, and a ferroelectric thin film 202 made of $BaTiO_3$ is formed to be positioned in contact with the aforesaid alloy film 203 to have a thickness of 100 nm. Then, a polysilicon film 201 is deposited, and thus a capacitor is constituted.

Although this example employs the alloy film, a similar effect can be obtained if conductive sintered metal is used.

As described above, by interposing $PbTi_4$ layer 203 between the $BaTiO_3$ layer 201 and the polysilicon layer 204, the low dielectric layer is formed and a capacitor having a large capacity can be realized.

Then, a method of forming the lead-titanium alloy film will now be described. The aforesaid alloy film is formed by a RF magnetron sputtering method.

Figure 24:
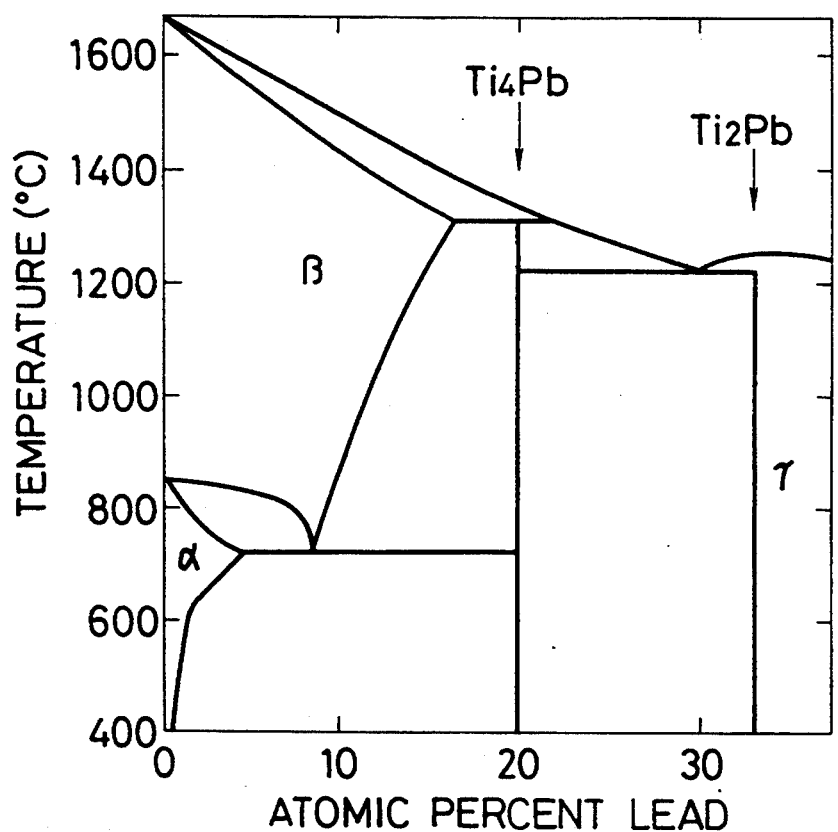
FIG. 24 illustrates a constitution diagram of two-element alloy of lead and titanium.

FIG. 24 illustrates a constitution diagram of a two-element alloy composed of lead and titanium. In the case where lead and titanium are mixed with each other as described above, a stable alloy state is realized in which the mole ratio of lead and titanium is 1:4. Also a target according to this example is composed of a lead-titanium alloy mixed at a mole ratio of 1:4. An argon gas is used as a sputtering gas which is used at a sputtering pressure of 0.3 Pa to perform sputtering while heating the substrate to 300° C., resulting in the lead-titanium alloy film having a mole ratio of 1:4 and substantially the same composition as that of the target to be formed.

The $BaTiO_3$ ferroelectric thin film is formed by an organic metal CVD method.

As shown in FIG. 6, a DRAM cell portion can be formed which uses the ferroelectric material which uses the dielectric material having a high permittivity according to this example.

As shown in FIG. 7, a ferroelectric film 72 is formed to surround a source electrode 85 of the MOS transistor. As a result, the area can be kept for the capacity which uses the ferroelectric material and therefore the height of the capacitance can be lowered. Therefore, breaking out of a difference in level after the memory cell has been formed can be satisfactorily prevented and the breakage of the wiring taken place at the time of wiring the aluminum wires due to the presence of the difference in level can be prevented. Hence, the yield of the device can be improved.

Example 13

It has been known that the crystallinity of the ferroelectric material can be improved, the permittivity can be raised and the leakage current can be decreased if it is subjected to high temperature annealing higher than 450° C. after it has been formed. Therefore, a heat treatment at 600° C. for 10 hours is performed after the capacitors have been constituted so as to evaluate the capacitance of each of the capacitors. As a result, the capacitance of each capacitor was lowered to 20 $fF/\mu m^2$, 5 $fF/\mu m^2$, and 19 $fF/\mu m^2$, respectively. The reason for this lies in that the overall capacitance is decreased because oxygen in the ferroelectric film is dispersed by heat, a SiO$_2$ film having a low permittivity is formed on the interface from polysilicon of the upper electrode and a series capacity with the low permittivity film is formed.

Figure 25:
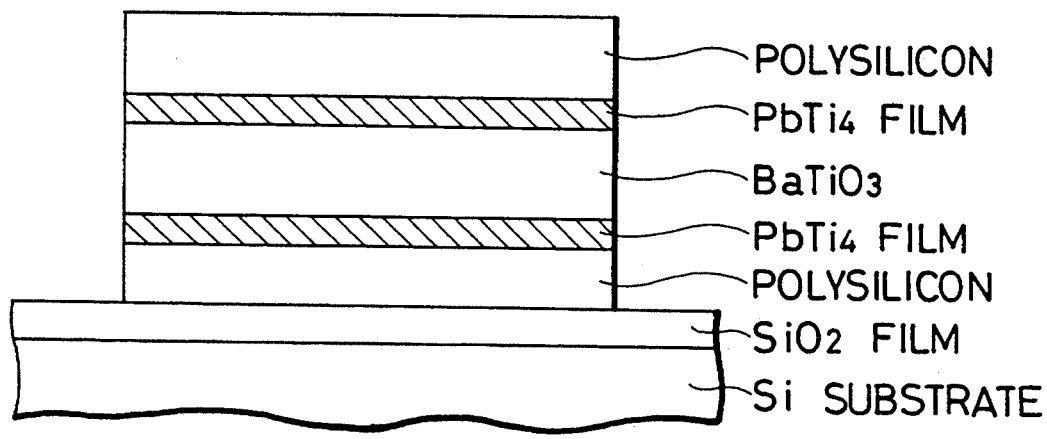
FIG. 25 is a schematic view which illustrate a state of deposition realized according to an example of the present invention.
Figure 38:
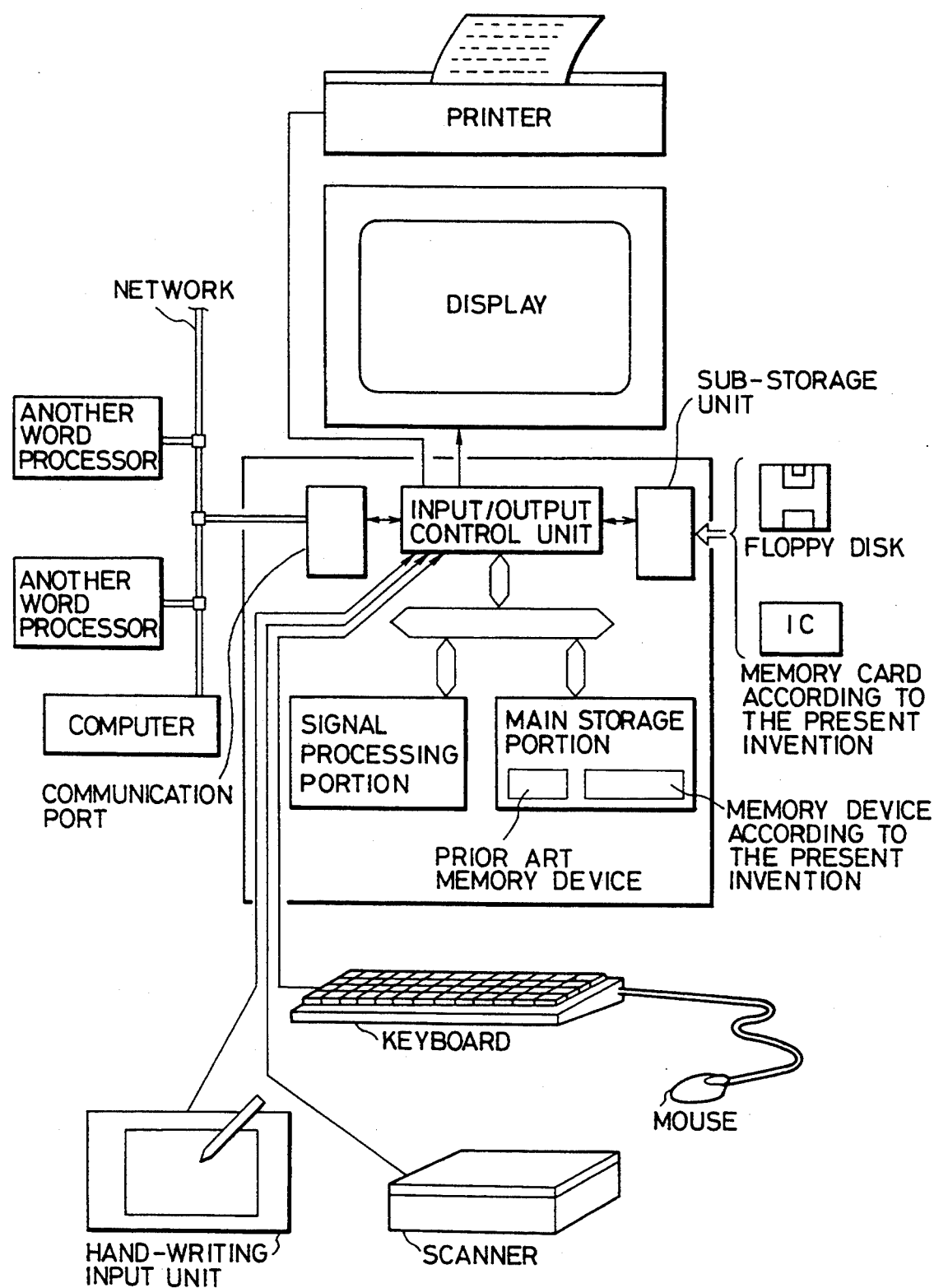
FIG. 38 illustrates the structure of a word processor according to an example of the present invention.

FIG. 25 is a schematic view which illustrates a state of deposition realized according to this example. As shown in FIG. 38, also the upper electrode is composed of a multilayered capacitor made of PbTi$_4$ and polysilicon. As a result, the capacitance after the annealing process has been completed was improved to a value of 65 fF/$\mu$m$^2$.

Example 14

Figure 26:
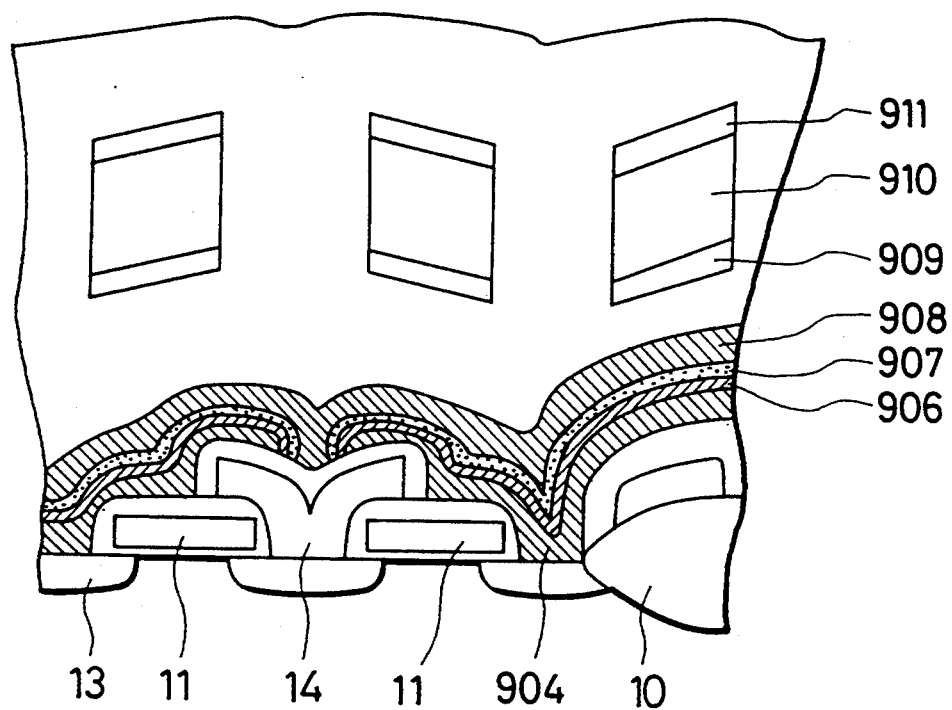
FIG. 26 is a cross sectional structural view which illustrates the DRAM cell according to an example of the present invention.

FIG. 26 is a cross sectional structural view which illustrates a DRAM cell portion according to this example.

FIG. 27 is a circuit diagram which illustrates the memory cell portion of a SRAM which uss the capacitor according to the present invention.

The nonvolatile memory (FRAM) has a similar cross sectional structure but it has different reading and writing peripheral circuits as shown in FIGS. 11 and 27. Referring to FIG. 26, on a Si substrate is formed a locally-oxidized film 10 for separating the device, an n-type doped layer 13 and gate oxidized film and a gate electrode 11 are formed, so that a MOS transistor is constituted. Then, a bit line 14 is formed, an oxide film is formed, a polysilicon layer 904 and a PbTi$_4$ layer 906 which are made to be storage nodes are formed, and a PbZrTiO$_3$ layer 907 serving as the ferroelectric film is formed. Furthermore, a polysilicon layer 908, which is made to be a plate electrode, is formed, and aluminum wiring 909, 910 and 911 for the multi-layer wiring are disposed. Then, a protection film is formed, so that a DRAM cell is manufactured.

The PbTi$_4$ layer is formed by the same method employed in Example 12, but a film having the same characteristics can be obtained by an evaporation method or the like. It has been found from the X-ray diffraction analysis that the crystallinity of PbZrTiO$_3$ can be improved when it is formed after the following processes have been performed: PbTi$_4$ is formed; and a heat treatment is performed at 600° C. for one hour in an oxygen atmosphere to form a PbTiO$_3$ film. As a result, a ferroelectric film capable of preventing the leakage current, having a high permittivity and having the ferroelectric characteristics can be formed. According to this example, an electrode area of 0.8 $\mu$m$^2$ is required to obtain a capacity which is sufficient to read data from the DRAM. Therefore, the device according to this example is able to be adapted to a highly-integrated DRAM or the like having a capacity of 64 Mb or large.

Example 15

An example in which the aforesaid capacitor is used in an FRAM. Among a variety of ways of using the ferroelectric capacitor, an example is shown in which it is used as a memory having substantially the same structure as that shown in FIG. 11 and an example is shown in which it is used as a data backup of an SRAM shown in FIG. 27. In the memory structure of the DRAM, the polarization direction of the ferroelectric material is inverted at the time of the data reading operation as well as the data writing operation. On the contrary, in the structure of the SRAM, voltage is applied to a backup word line (BUWL) when the power source is turned off, in particular, when data is stored on the ferroelectric material so as to turn on the MOS transistor to transfer data in the SRAM, and a 1-pulse rectangular wave is applied to a backup control line (BUCL) so as to write data on a ferroelectric memory capacity (FC) and a dummy ferroelectric memory capacity (FC upper line). Therefore, the number of polarization inversions can significantly be decreased, the data holding characteristics can be improved and the reliability of the device can be improved. Since the spontaneous polarization of the ferroelectric material according to this example is 50 $\mu$C/cm$^2$ and required capacitor area for reading is about 0.2 $\mu$m$^2$, the enlargement of the cell area can be restricted to about 20% including the backup MOS transistor. Therefore, a reliable and high speed memory can be constituted.

Example 16

Figure 28:
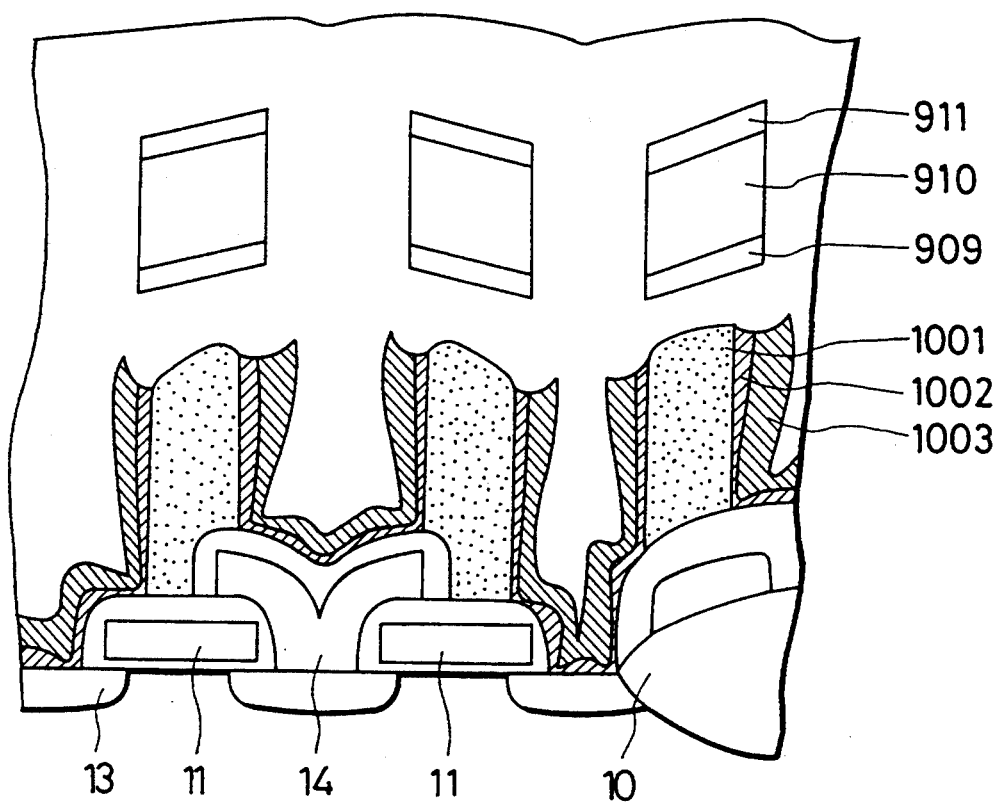
FIG. 28 is a cross sectional structural view which illustrates a DRAM cell which uses a ferroelectric material according to an example of the present invention.

FIG. 28 is a cross sectional structural view which illustrates a DRAM cell portion which uses the ferroelectric material according to this example.

FIGS. 29a to 29f are cross sectional views which illustrate a manufacturing process according to Example 16.

This example is designed by a 256 Mbit DRAM technology in accordance with a 0.25 $\mu$m rule at a power supply voltage of 1.5 V, a sense-up pitch of 0.8 $\mu$m, and a word line pitch of 0.7 $\mu$m.

Figure 29A:
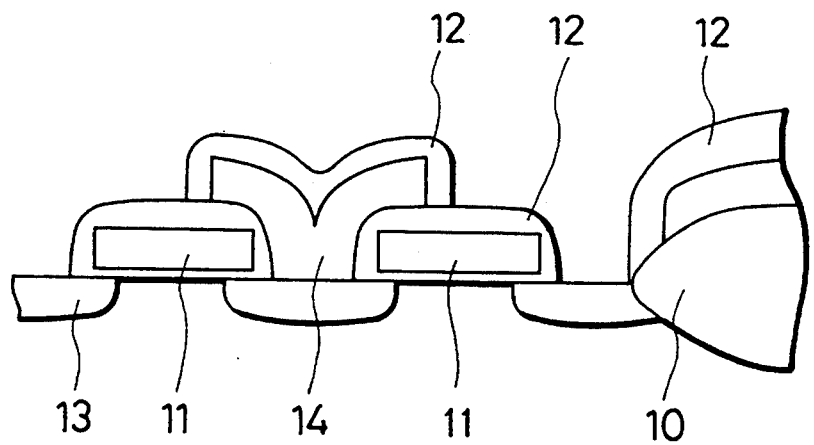
FIG. 29a illustrates the process for manufacturing the capacitor according to Example 16 of the present invention.
Figure 29B:
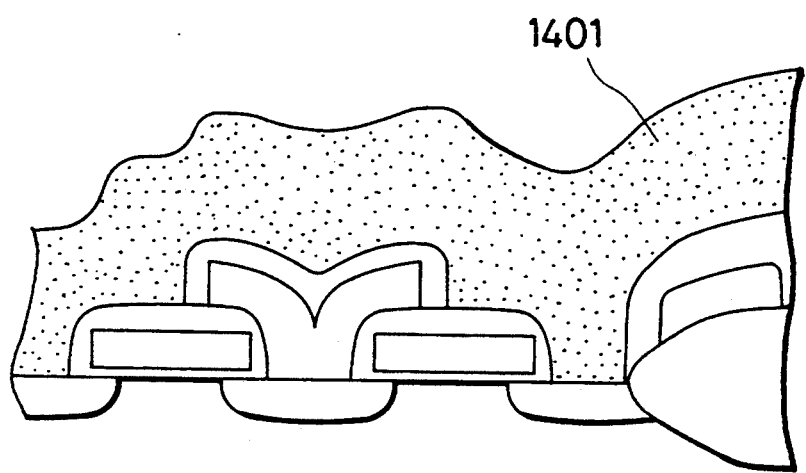
FIG. 29b is a cross sectional view which illustrates the manufacturing process according to Example 16 of the present invention.

As shown in FIG. 29a, on a Si substrate are formed an n-type dope layer 13 which is made to be a source and a drain, a gate electrode 11, a gate insulating film, a SiO$_2$ insulating film 10 for separating the device, and a bit line 14 made of polysilicon. Thus, a MOS transistor is constituted.

As shown in the drawings, on MOS transistor a solid-solution film 1401 of BaTiO$_3$ (barium titanate) and SrTiO$_3$ film is then formed to have a thickness of 0.3 $\mu$m. It is formed by an organic metal chemical gas phase deposition method in which organic metal such as Ba, Ti and Sr or an organic metal complex is used while employing ozone as the carrier gas in such a manner that the substrate is heated to 600° C. (see FIG. 29b).

Figure 29C:
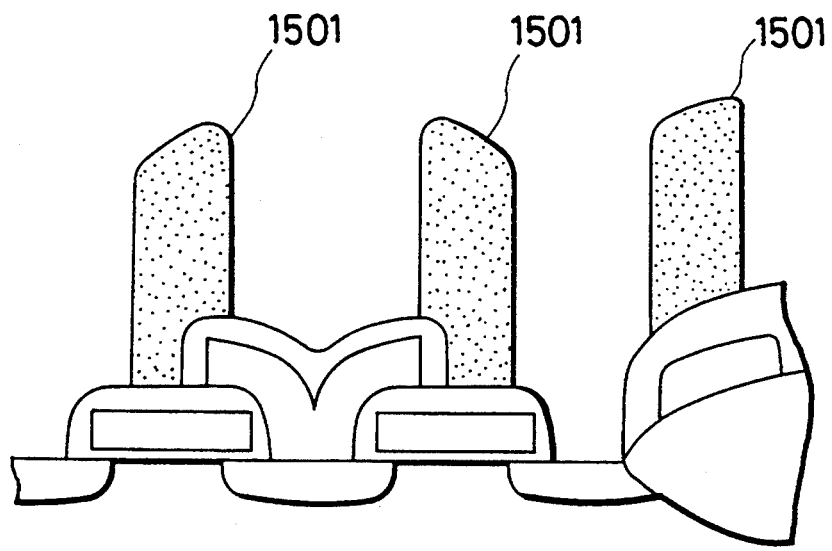
FIG. 29c is a cross sectional view which illustrates the manufacturing process according to Example 16 of the present invention.

FIG. 29c is a cross sectional view which illustrates a state where a ferroelectric film according to this example has been etched during the manufacturing process. Then, a lithography process is performed, and the aforesaid ferroelectric film is etched so as to form a cross sectional shape shown in FIG. 29c. At this time, the ferroelectric material present on the source contact hole of the MOS transistor must be removed and the ferroelectric material must be formed to have a predetermined thickness. However, no problem arises if the ferroelectric material is left on the SiO$_2$ portion on the bit line.

Figure 29D:
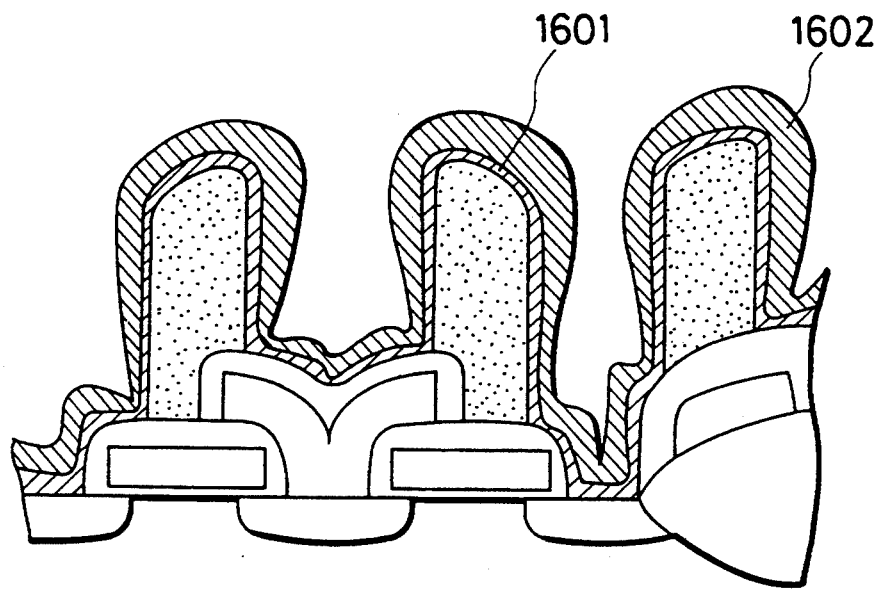
FIG. 29d is a cross sectional view which illustrates the manufacturing process according to Example 16 of the present invention.

As shown in FIG. 29d, a PbTi alloy film 1601 and an aluminum film 1602 are formed by sputtering.

Figure 29E:
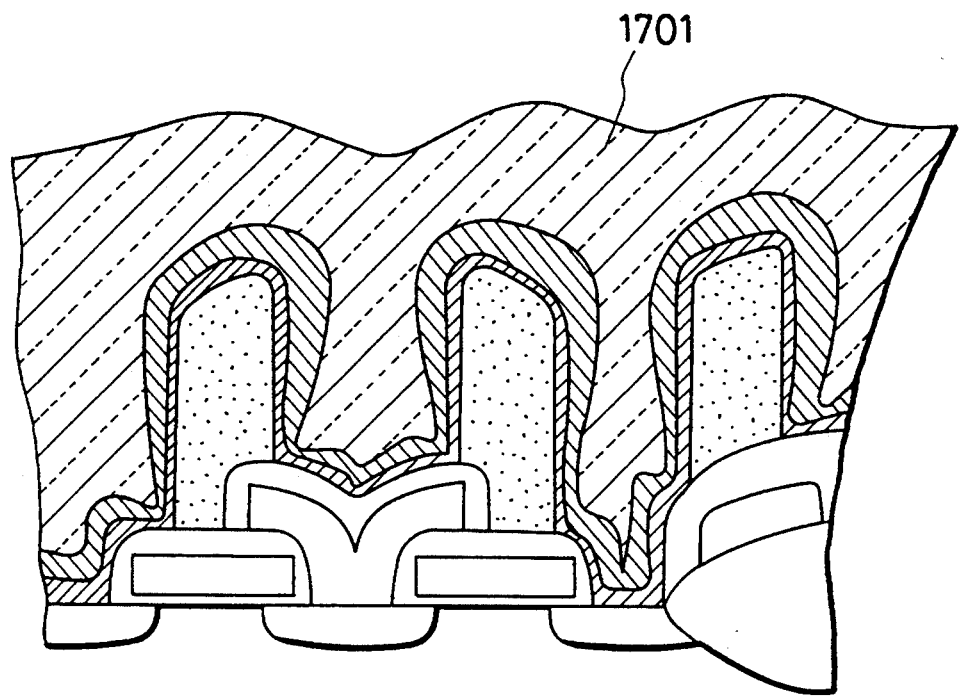
FIG. 29e is a cross sectional view which illustrates the manufacturing process according to Example 16 of the present invention.

As shown in FIG. 29e, a BPSG film 1701 is formed.

Figure 29F:
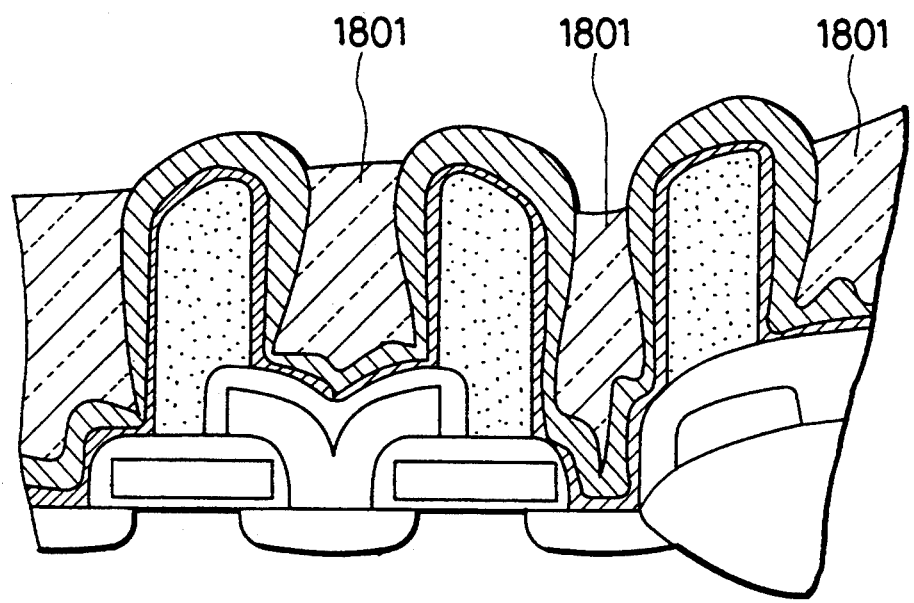
FIG. 29f is a cross sectional view which illustrates the manufacturing process according to Example 16 of the present invention.

As shown in FIG. 29f, etching back is performed until the portion of the ferroelectric material deposited on the aluminum thin film appears outside.

As shown in FIG. 29d, exposed aluminum film 1901 and a PbTi alloy 1902 below the aluminum film 1901 are etched so as to be formed into the shape of the desired electrodes. As a result, the side walls of the ferroelectric material are electrically separated from each other so that the electrodes are formed. Thus, the capacitor is formed. The interval between the electrodes is made to be 0.2 $\mu$m. However, the present invention is not limited to the aforesaid thickness of 0.2 $\mu$m. It is determined depending upon a required capacitance and the specific resistance of the film.

The electrode among the aforesaid aluminum electrodes, which is not connected to the MOS transistor, is electrically connected to an electrode common to the other capacitor so as to be used as a plate electrode.

Then, a SiO$_2$ film is formed on the capacitor to serve as a protection film, and thus a memory cell is constituted. In the case where a DRAM is constituted, aluminum wiring and the like 909, 910 and 911 are disposed while establishing a contact with an external electrode before it is enclosed in a package. As a result, a DRAM, the circuit of which is constituted as shown in FIG. 3, is completed. Although the peripheral circuits such as the sense amplifier and the driver circuit, and their processes are omitted, they are of course included.

The capacitor according to this example has a capacitance of 40 fF. The resistance rate is about $10^{13}$ $\Omega$cm when the side walls of the ferroelectric material and the interval between the electrodes is 0.2 $\mu$m, so that the leakage current value can be sufficiently reduced when it is used as the DRAM cell.

Figure 29G:
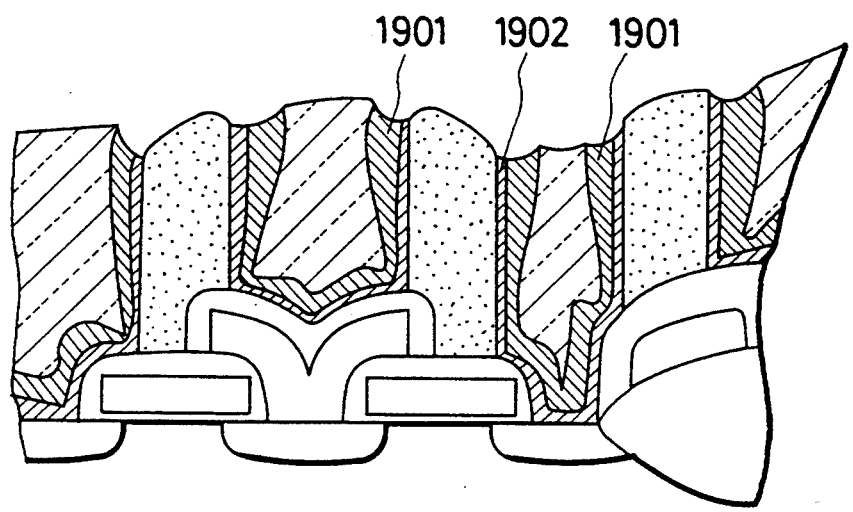
FIG. 29g is a cross sectional view which illustrates the manufacturing process according to Example 16 of the present invention.

According to this example, the area of the memory cell can be reduced to about one-third in comparison to the conventional memory cell structure shown in FIG. 29g which uses SiO$_2$ film as the insulating film. On the contrary, in the case where platinum is used as the electrode material, ion milling must be performed to process platinum. Therefore, a fine process cannot be performed, and a memory cell area of about 1.5 time that obtainable from this example is required when the same capacitance as that required in the aforesaid example is obtained. In the case where aluminum or polysilicon is used as the electrode, an excellent processability can be realized, but the electrode is oxidized at the time of forming the ferroelectric film, causing an aluminum oxide film or a SiO$_2$ film each having a low permittivity to be formed. Hence, the capacitance is reduced to about one-eighth of that obtainable from the aforesaid example in the case where the capacitor is constituted by making the ferroelectric film thickness and the electrode area to be the same as those of the aforesaid example.

Example 17

An ferroelectric memory according to this example is constituted by making the ferroelectric film with Pb(Zr,Ti)O$_3$ and by utilizing the spontaneous polarization. The memory is structured as shown in FIG. 7.

The PbZrTiO$_3$ film is formed by a sol-gel method. The PbTi$_3$ film is formed by an electron-ray evaporation method. According to this example, the electrode processability is superior to the conventional technology in which platinum is used as the base metal. Therefore, a fine processing facility can be realized and the ferroelectric characteristics can be improved. Furthermore, the cost of the target required to form the electrode can be reduced, causing advantages to be realized in that the memory can be highly integrated, the processing speed can be raised and the cost can be reduced.

Although this example is arranged in such a manner that the storage device is constituted by two pairs each of which is composed of one capacitor and one transistor, also the cell area can be reduced and the degree of integration can be raised in another nonvolatile memory which uses the spontaneous polarization of the ferroelectric material and having another structure.

Example 18

Figure 30:
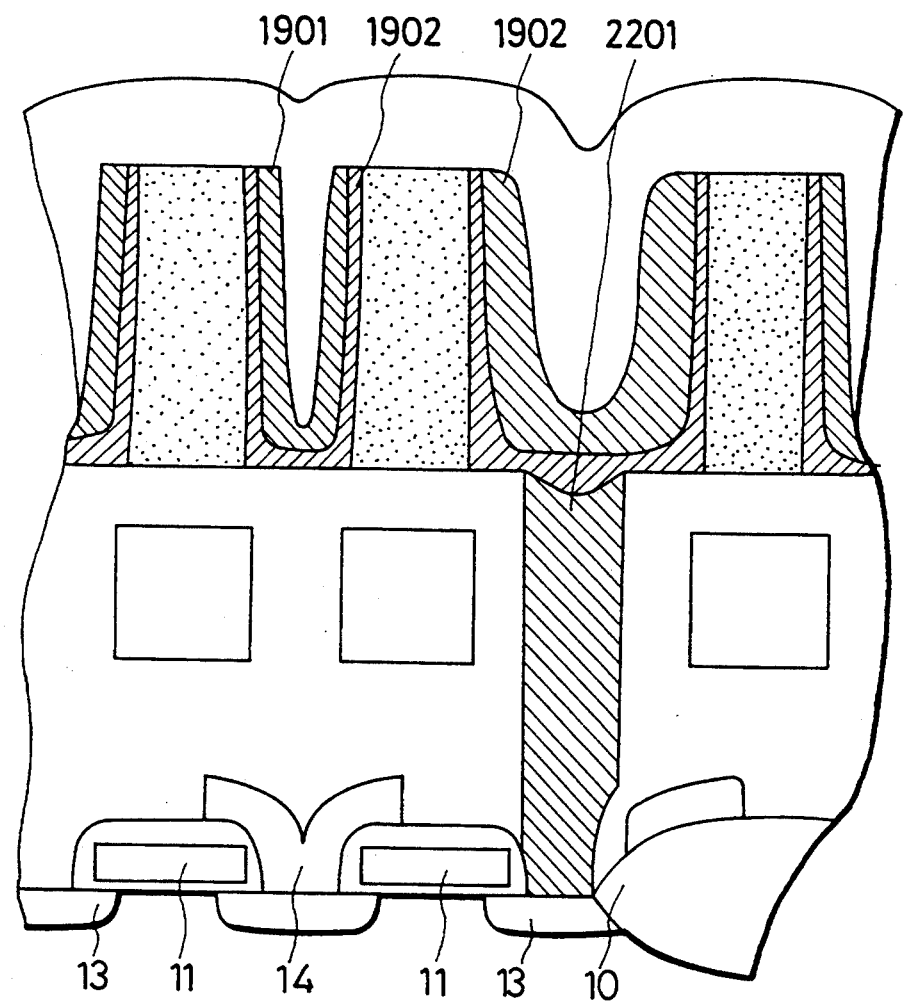
FIG. 30 is a cross sectional view which illustrates a memory cell portion of a DRAM according to an example of the present invention.

FIG. 30 is a cross sectional view which illustrates a DRAM cell according to this example.

FIG. 30 illustrates the cross sectional of a DRAM cell in which a capacitor, the electrode of which is made of PbTi4 and which uses the ferroelectric material, is formed at the top portion of the substrate in which the control transistor, a driving peripheral circuit and the wiring have been formed. The storage node of the capacitor and the MOS transistor are connected by a contact electrode 2201 made of tungsten. The ferroelectric material contains, as the aforesaid material, a multiplicity of elements such as heavy metal and magnesium and the like which change the characteristics of the semiconductor and the insulating film. By forming the aforesaid ferroelectric film in the final process, the long time reliability of the device can be improved.

As a result of evaluations made about the device shown in FIG. 29a and the structure shown in FIG. 30 by using a test elementary group, the turning off current for the MOS transistor can be lowered in the case of FIG. 30 as compared with the case shown in FIG. 29a. Therefore, the refresh cycle can be lengthened.

Furthermore, by using a material having a long half life of the $\alpha$-ray decay as the metal for forming the ferroelectric material, the probability of soft error can be lowered.

Example 19

Although the aforesaid examples are arranged in such a manner that the metal or the ferroelectric film is composed of a single layer, this example is arranged in such a manner that ferroelectric materials having different compositions are formed on the semiconductor substrate, one of the two layers, that is, the first layer being used as a buffer layer with respect to the base oxide layer so as to improve the crystallinity of the ferroelectric material of the second layer and to obtain the ferroelectric characteristics.

Figure 31:
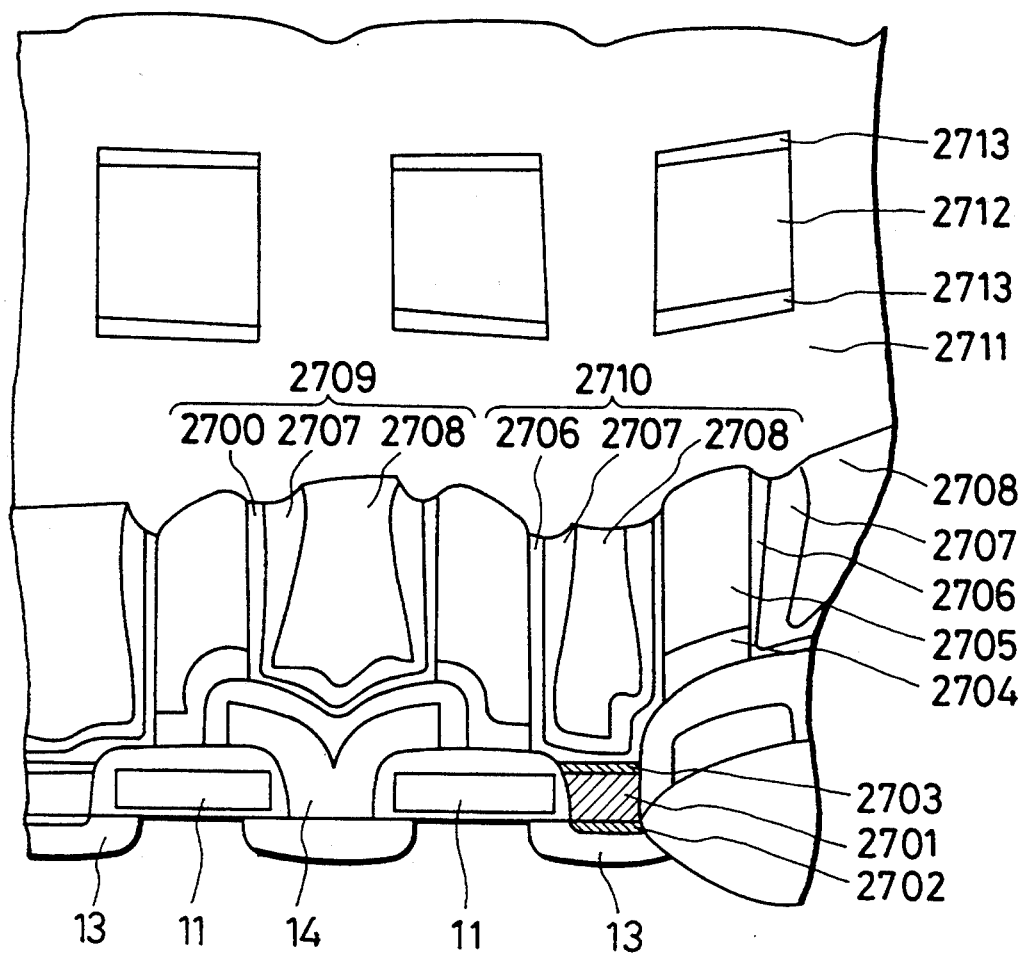
FIG. 31 is a cross sectional view which illustrates a memory cell which uses a multi-layer ferroelectric material and a multi-layer electrode according to an example of the present invention.

FIG. 31 illustrates a memory cell which uses a multi-layer ferroelectric material and a multi-layer electrode. The device according to this example is designed in accordance with a 0.3 $\mu$m rule under conditions that the power supply voltage is 3.0 V, the sense amplifier pitch is 0.8 $\mu$m, and the word line pitch is 0.7 $\mu$m. As shown in FIG. 29a, the MOS transistor and the bit line are formed on the Si substrate, titanium 271 in the contact hole is formed in order to reduce the contact resistance with silicon. The formed titanium 271 reacts with silicon in the ensuing high temperature process so that titanium siliside 2702 having a thickness of about 0.02 $\mu$m is formed in the boundary portion with the silicon. The titanium siliside 2702 further reduces the contact resistance.

Furthermore, titanium nitride 2703, which is made to be barrier layer, is formed on the titanium portion. By forming a barrier material in the contact hole of the drain electrode of the MOS transistor before the ferroelectric film is formed, contamination of heavy metal such as lead and zirconium, and magnesium contained by the ferroelectric material, which will be movable ions in Si, into Si is prevented. If the heavy metal or movable ions are contaminated into Si, an electron energy level is formed in a deep region in the band gap of Si, causing the leakage current to increase in the MOS transistor or causing the threshold voltage to be changed. As a barrier material capable of preventing it, the titanium nitride 2703 is used.

Furthermore, a SrTiO₃ layer 2704 and a Pb(Mg, Nb)O₃ layer 2705 are formed to respectively have a thickness of 0.1 μm and a thickness of 0.45 μm by a CVD method and a sol-gel method.

Furthermore, a photolithography process and a dry etching process are performed so that a Pb(Mg,Nb)O₃ layer 2705 and a SrTiO₃ layer 2704 are formed to have a width of 0.15 μm and a length of 2 μm. At this time, the height of the ferroelectric layer is 0.5 μm, and the ferroelectric layer is formed to surround the contact hole of the drain electrode of the MOS transistor as shown in FIG. 7. Furthermore, a PbTi₂ layer 2706 is formed to have a thickness of 0.04 μm and a polysilicon layer 2707 is formed to have a thickness of 0.05 μm. Furthermore, boron silicate glass (BPSG) 2708 is formed and reflowed at a high temperature of 800° C. Then, the PBSG is etched back until polysilicon present on Pb(Mg,Nb)O₃ appears. It should be noted that BPSG has a high degree of solid solution with heavy metal such as Pb and therefore a gettering effect can be realized.

Then, polysilicon present on the ferroelectric material is removed by etching, and aluminum present on the ferroelectric material is removed by sulfuric acid. As a result, a plate electrode 2709 and a storage node 2710 are electrically separated from each other while interposing the ferroelectric material. As a result, the area of the electrode positioned in contact with Pb(Mg, Nb)O₃ is made to be 1 μm² (2 μm×0.5 μm) and the interval between the electrodes is made to be 0.15 μm.

Then, a SiO₂ film 2711 serving as a protection film is formed on the capacitor, so that a memory cell is formed. In the case where it is used in a DRAM, aluminum wiring 2712 and the like are formed on it so as to establish a contact with external electrodes before it is enclosed into a package. Thus, the subject process is completed. Although a process of forming the peripheral circuits such as the sense amplifier and the driver circuit and the like are omitted from the description, they are of course included and therefore the structure is as shown in FIG. 3.

A capacitance of about 80 fF is obtained with the capacitor according to this example. Since a voltage of 1.5 V, which is the half of the power supply voltage, is applied to the plate electrode, a charge of 120 fC is stored. Furthermore, a leakage current is reduced to about 1 fA which is sufficiently small value to be used as a DRAM cell.

Although the description is made about Pb(Mg,Nb)O₃ which is used in the DRAM, the present invention is not limited to the aforesaid film. For example, in the case where BaTiO₃, or SrTiO₃ or a solid-solution film, or the main component of which is either of the aforesaid film, is used, excellent response characteristics can be obtained in a high frequency region of 100 kHz or higher although the dimensions of the device are difference from the aforesaid device because they have a small relative permittivity in comparison to that of Pb(Mg,Nb)O₃. The reason for this lies in that the mass of Ba atom and that of Sr atom is smaller than that of Pb atom. Since Pb(Ti,Zr)O₃ and (Pb,La) (Ti,Zr)O₃ do not contain Mg which is the component element of Pb(Mg,Nb)O₃, a problem such as the change of the characteristics of the MOS transistor due to the dispersion of Mg or the fact that Mg becomes movable ions can be prevented, so that an effect is obtained in that the reliability is improved.

Although the sol-gel method is employed in the aforesaid example, the film can be formed by a sputtering method, an organic metal gas phase deposition method, an evaporation method or a hydro-thermal method. If the sputtering method is employed, the composition of the target is changed and therefore the composition of the film can controlled satisfactorily. Hence, a film such as (Pb,La) (Ti,Zr)O₃ and Pb(Mg,Nb)O₃ in which copper is solid-dissolved and the like each of which is composed a multiplicity of elements can easily be formed. The organic metal gas phase deposition method or the hydro-thermal method is able to improve the through-put because films are simultaneously formed on 10 or more substrates.

The material of the electrode is not limited to the PbTi alloy, but the following combinations can be employed: KNb, NaTa, KTa, SrTi, BaTi, PbTi, SrZr, BaZr, BiFe, NaBiTi, KBiTi, KLaTi, BaPbTiO₃, CaSrTi, NaNdTi, AgCeTi, PbCaZr, BaMgTe, BaMnTe, BaCoTe, BaCdTe, PbMgTe, PbMnTe, PbCoTe, ZnTe, PbCdTe, PbCoW, PbZrTi, PbMgNb, PbScNb, PbMnNb, PbFeNb, PbNiNb, PbInNb, PbFeW, PbLuTa, PbYbTa, PbCuSb, PbAlSb, CaMgTe, and CaMnTe.

Then, a BaTi alloy and a SrTi alloy other than the aforesaid PbTi alloy will now be described.

Example 20

Figure 32:
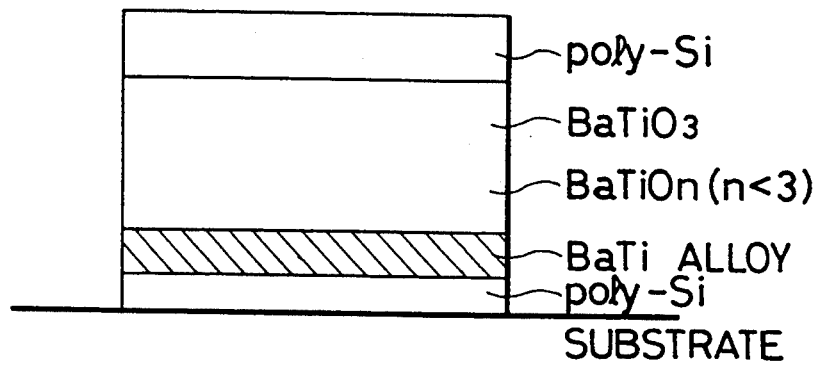
FIG. 32 is a schematic view which illustrates a state of deposition of the oxide ferroelectric thin film according to an example of the present invention.

FIG. 32 is a schematic view which illustrates a state of deposition of the oxide ferroelectric thin film according to this example. A Ba-Ti alloy film is formed on a polysilicon film, and a BaTiO₃ ferroelectric thin film is continuously formed on the alloy film.

Then, a process of forming the BaTiO₃ ferroelectric thin film will now be described with reference to FIG. 32. A silicon wafer (having a diameter 100 mm) was, as a substrate, placed in a vacuum evaporation apparatus, and an oxygen gas was introduced through a gas blowing pipe at a flow rate of 200 ml/min while adjusting the exhaust quantity so as to realize a pressure of 0.3 Pa. Then, monosilane and SiH₄ were introduced at a flow rate of 20 ml/min through the gas blowing pipe, so that a polysilicon layer was formed.

Then, Ba and Ti were simultaneously evaporated on it, so that a Ba-Ti alloy film was formed, and an oxygen gas was introduced so that an oxygen deficit BaTiOn layer was formed. Then, a BaTiO₃ layer was formed by sputtering. As the sputtering gas, an argon gas was used, and a target composed of barium and titanium mixed at a mole ratio of 1:1 and sintered was used. The substrate was heated to about 600° C., and a layer made of BaTiO₃ and having a perovskite crystal structure was formed. Then, Ti was deposited to have a thickness of 0.2 μm as the material of the electrodes. The capacitance of the BaTiO₃ film thus obtained and having a thickness of 5000 Å is 53.1 fF.

Figure 33:
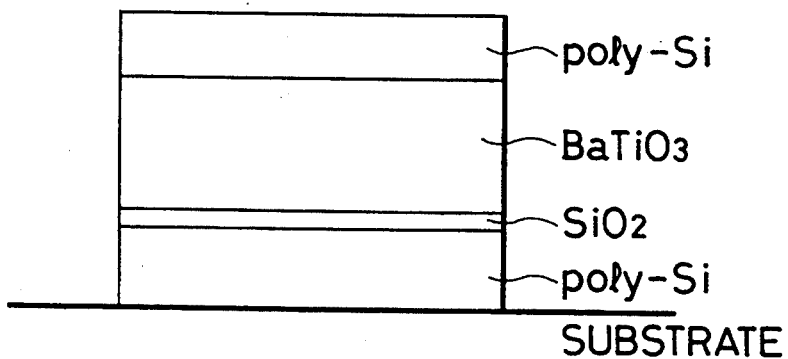
FIG. 33 is a schematic view which illustrates a state of deposition of a prior art oxide ferroelectric thin film.

FIG. 33 is a schematic view which illustrates a state of deposition of the conventional oxide ferroelectric thin film. This conventional technology is arranged in such a manner that a BaTiO₃ oxide dielectric thin film having a high permittivity is formed on polysilicon by a MOCVD method which is one of the chemical gas phase grow (CVD) method and in which organic metal is used. However, the polysilicon crystal surface is oxidized in a short time in this case and a SiO₂ insulating layer, which is a thin oxide film, is formed on the surface. Therefore, the capacity of the SiO$_2$ layer shares the major portion even if the BaTiO$_3$ layer, which is a ferroelectric film, is formed. As a result, a capacitance of 13.3 fF was realized when the thickness of the BaTiO$_3$ film was 5000 Å and the thickness of the SiO$_2$ film was 20 Å.

In comparison to the aforesaid conventional method, the method of forming the ferroelectric thin film according to the present invention is able to prevent the deterioration of the ferroelectric characteristics. Therefore, a ferroelectric thin film can be obtained which is composed of BaTiO$_3$ which does not react with the polysilicon electrode material.

In this example, the Ba-Ti alloy film shown in FIG. 32 can be formed by sputtering. As the sputtering gas, an argon gas was used, and a target formed in such a manner that Ba and Ti were sintered individually was used. Furthermore, the temperature of the substrate is about 600° C.

The Ba-Ti alloy film can be formed by employing a heat evaporation method. The BaTiO$_3$ layer can be formed by a MOCVD method in place of the sputtering method. As the material of the evaporation method, a β-diketone complex was employed, and alkoxide type Ti was used while using nitrogen as a carrier gas at the time of supplying the material.

Example 21

Figure 34:
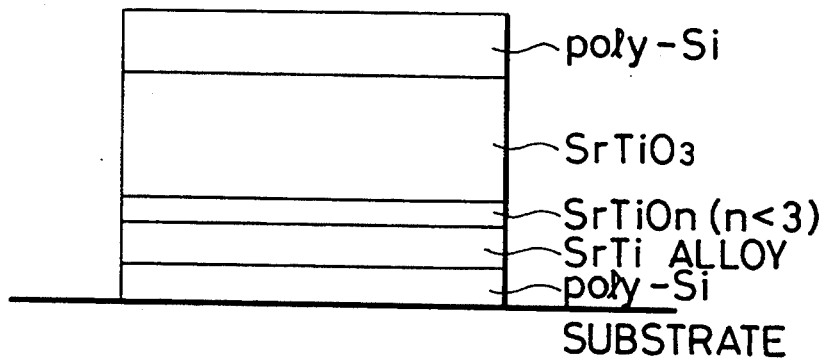
FIG. 34 is a schematic view which illustrates a state of deposition of the oxide ferroelectric thin film according to an example of the present invention.

FIG. 34 is a schematic view which illustrates a state of deposition of an oxide ferroelectric thin film according to this example. A Sr-Ti alloy film is formed on polysilicon, and a high permittivity dielectric thin film made of SrTiO$_3$ is continuously formed on it.

Then, a process of forming the SrTiO$_3$ high permittivity dielectric thin film made of SrTiO$_3$ will now be specifically described. A polysilicon layer was formed in a vacuum evaporation apparatus, and Sr and Ti were simultaneously evaporated on it, so that a Sr-Ti ally film was formed. Then, an oxygen gas was introduced so that an oxygen deficit SiTiOn layer was formed. Then, SrTiO$_3$ was continuously deposited on the aforesaid layer by a sputtering method, so that a SrTiO$_3$ layer was formed. Then, the substrate was heated to about 600° C. and a layer composed of SrTiO$_3$ and having a perovskite crystal structure was formed. Then, Ti was deposited on it, so that a desired layer was formed.

Figure 35:
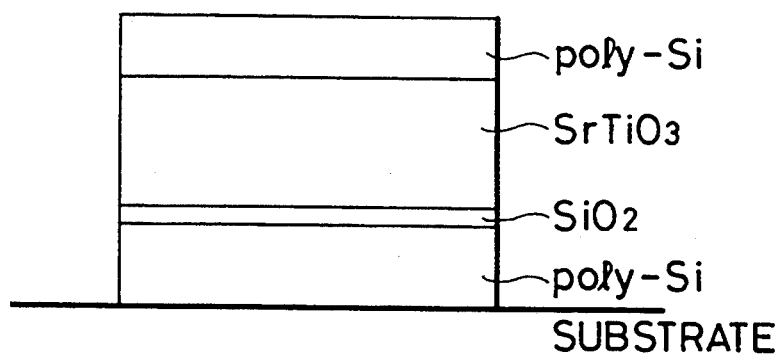
FIG. 35 is a schematic view which illustrates a state of deposition of a prior art ferroelectric thin film having a high permittivity.

FIG. 35 is a schematic view which illustrates a state of deposition of a conventional oxide dielectric film having a high permittivity. This conventional technology is arranged in such a manner that a SrTiO$_3$ oxide dielectric thin film having a high permittivity is formed on polysilicon crystal substrate by a MOCVD method which is one of the chemical gas phase grow (CVD) method and in which organic metal is used. However, the polysilicon crystal surface is oxidized in a short time in this case and a SiO$_2$ insulating layer, which is a thin oxide film, is formed on the surface. Therefore, the permittivity of a SiO$_2$ layer shares a major portion even if a SrTiO$_3$ layer, which is a high permittivity dielectric film, is formed on it. Therefore, the relative permittivity is determined and deterioration of the permittivity was confirmed.

In comparison to the aforesaid conventional method, the method of forming the high permittivity dielectric thin film according to the present inventions enables a ferroelectric thin film composed of SrTiO$_3$ to be obtained which is able to prevent deterioration of the permittivity and which does not react with the lower electrode material at the time of the film forming process.

The Sr-TI alloy film can be formed by a sputtering method, a heat evaporation method, or a CVD method. The SrTiO$_3$ film can be formed by a MOCVD method in place of the sputtering method.

Example 22

Figure 36:
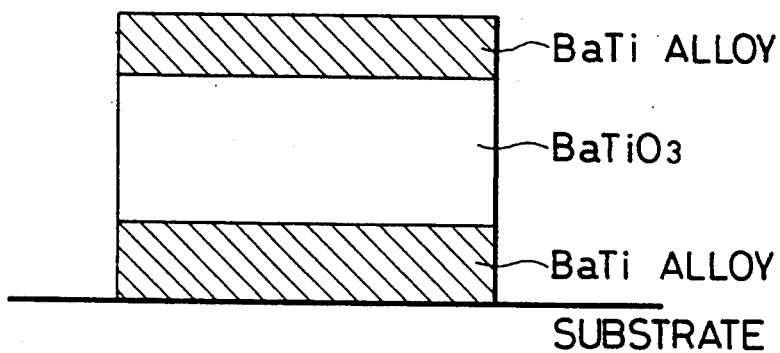
FIG. 36 is a schematic view which illustrates a state of deposition of the oxide ferroelectric thin film according to an example of the present invention.

FIG. 36 is a schematic view which illustrates a state of deposition of an oxide ferroelectric thin film according to this example.

A process of forming a BaTiO$_3$ ferroelectric thin film will now be described. A polysilicon layer was formed by a CVD method, Ti is evaporated on it, so that a lower electrode was formed. Then, Ba and Ti were continuously and simultaneously evaporated, so that a Ba-Ti alloy film was formed. Then, an oxygen was introduced, so that an oxygen deficit BaTiOn layer was formed, and a BaTiO$_3$ layer was formed on it by sputtering. As the sputtering gas, an argon gas was used and a target composed of Ba and Ti mixed at a mole rate of 1:1 was used. The substrate was heated to 600° c., and a layer composed of BaTiO$_3$ and having a perovskite crystal structure was formed. Then, Ti was deposited on it by a thickness of 0.2 μm to serve as an upper electrode.

Since the BaTiO$_3$ ferroelectric film according to the present invention utilizes Ti, which is a component, as the upper and the lower electrodes, a ferroelectric thin film capable of preventing the deterioration of the ferroelectric characteristics can be obtained.

Example 23

Figure 37:
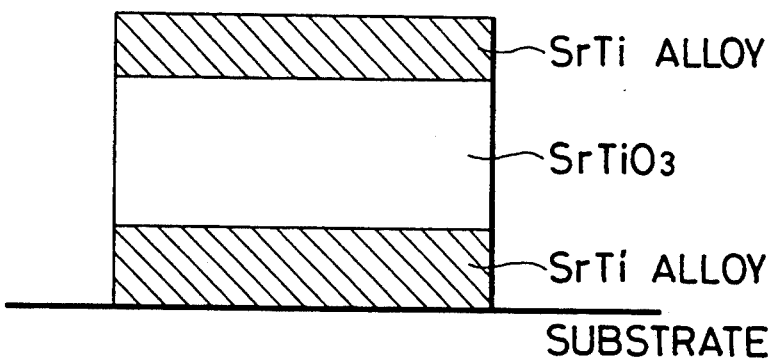
FIG. 37 is a schematic view which illustrates a state of deposition of the ferroelectric thin film having a high permittivity according to an example of the present invention.

FIG. 37 is a schematic view which illustrates a state of deposition of an oxide ferroelectric thin film according to this example.

A process of forming a SrTiO$_3$ ferroelectric thin film will now be described. A polysilicon layer was formed by a CVD method, Ti is evaporated on it, so that a lower electrode was formed. Then, Sr and Ti were continuously and simultaneously evaporated, so that a Sr-Ti alloy film was formed. Then, an oxygen was introduced, so that an oxygen deficit SrTiOn layer was formed, and a SrTiO$_3$ layer was formed on it by sputtering. As the sputtering gas, an argon gas was used and a target composed of Sr and Ti mixed at a mole rate of 1:1 was used. The substrate was heated to 600° c., and a layer composed of SrTiO$_3$ and having a perovskite crystal structure was formed. Then, Ti was deposited on it by a thickness of 0.2 μm to serve as an upper electrode, so that a layer was formed.

Since the SrTiO$_3$ ferroelectric film according to the present invention utilizes Ti, which is a component, as the upper and the lower electrodes, a ferroelectric thin film capable of preventing the deterioration of the ferroelectric characteristics can be obtained.

Example 24

A system LSI in which the memory device according to the present invention is formed on a chip as shown in FIG. 18 is able to be adapted to the following future communication systems: an analog network, a digital network, a narrow band intelligent service digital network (N-ISDN), and a broad band (B)-ISDN. The driver receiver circuit and the like are formed on a chip in order to directly receiving signals from a highly integrated high speed memory, which can be adapted to a multimedia communication including precise natural kinetic pictures, and from a communication circuit.

As shown in FIG. 19, the structure in which the FRAM, DRAM or SRAM memory device is used as an included cash memory reveals a large capacity and low electric power consumption. Therefore, a logical device having a high grade function can be operated with low electric power consumption. Furthermore, another effect can be obtained in that a microprocessor freed from soft errors can be obtained.

Example 25

In the case where the FRAM, the DRAM or the SRAM according to the present invention is, as shown in FIG. 20, used as the semiconductor memory board, a significant advantage can be obtained as a low cost and large capacity solid recording medium. In particular, use of the FRAM board enables electrical backup at the power failure to be omitted because it is an nonvolatile memory, and therefore the necessity of copying the stored contents onto another recording medium (for example, a magnetic disk or a magnetic tape) as a backup. Furthermore, the fact that it has no movable portion improves the durability against shock and the electric power consumption can be significantly reduced. In addition, another effect can be obtained in that a semiconductor memory board durable against soft errors can be obtained.

As shown in FIG. 21, the FRAM and SRAM according to the present invention can be applied to a memory card as well as the semiconductor memory board. In particular, a card (an FRAM card), which uses the FRAM, is able to eliminate a necessity for the conventional memory card to include the battery for maintaining the storage. Therefore, it can be used similarly to the conventional floppy disk but an advantage can be obtained in that the access time can significantly be shortened in comparison to the floppy disk. Hence, use of the memory card, which employs the FRAM or SRAM, as an interchangeable sub-storage medium such as a conventional floppy disk for a small or a portable computer system, the scale grade of which is lower the work station, will eliminate the drive system such as a motor and the drive power source. Therefore, the overall size of the system can be reduced, the electric power consumption can be decreased, and a large quantity information can be read/write at high speed. Hence, the processing performance of the overall system can be improved.

Example 26

The aforesaid logical device (microprocessor), the memory device (FRAM, DRAM, and SRAM) according to the present invention, and the semiconductor memory board and the memory card according to the present invention will respectively enable significant effects to be obtained when they are used in a super computer, a large-scale, a general-purpose, a small or medium size computes, a work station, a personal computer, a portable computer, a lap-top computer, a note-book type personal computer.

In the system shown in FIG. 22, the DRAM and the SRAM boards are used in a similar manner to that in the conventional structure, but the performance such as the processing speed can be improved because the capacity can be enlarged and the cost can be reduced in comparison to the conventional structure. The aforesaid improvement will be significantly effective for apparatus the scale grade of which is higher than the small or medium size computers.

The FRAM has a superior advantages of nonvolatile characteristics, a large capacity and a low electric power consumption to the conventional semiconductor memory. In particular, the nonvolatile characteristics will enable an advantage to be obtained in that the overall size of the system can be reduced because the storage battery against power failure which has been required for the apparatus higher than the small or medium computers can be omitted. Furthermore, the stored contents do not need to be copied to a magnetic disk having a low access speed, and therefore larger quantity of information can be processed at a higher speed as compared with the conventional system. Hence, advantages can be obtained in that the processing speed of the overall system can be raised, the performance can be improved, and the size and the cost can be reduced.

Furthermore, advantages can be obtained in the portable personal computer to the notebook type computer in that the system durable against vibrations can be constituted. Furthermore, the aforesaid advantage of the low electric power consumption will enable the system to be operated with the battery for a long time, causing the way of portable use to be widened. Hence, the system can be stably operated even if it is placed in a movable body.

In addition, in the case where the aforesaid microprocessor is provided in the signal processing portion and the memory device according to the present invention is used in the main storage portion, access to large quantity of information can be made at a high speed, causing an effect to be obtained in that a significantly high grade and complicated information process can be performed in a short time.

Example 27

The system which uses the logical device, the memory device, the semiconductor memory board and the memory card is exemplified by office machine such as a word processor and a printer and the like as well as the aforesaid computers.

FIG. 38 illustrates the structure of a word processor according to this example.

Figure 39:
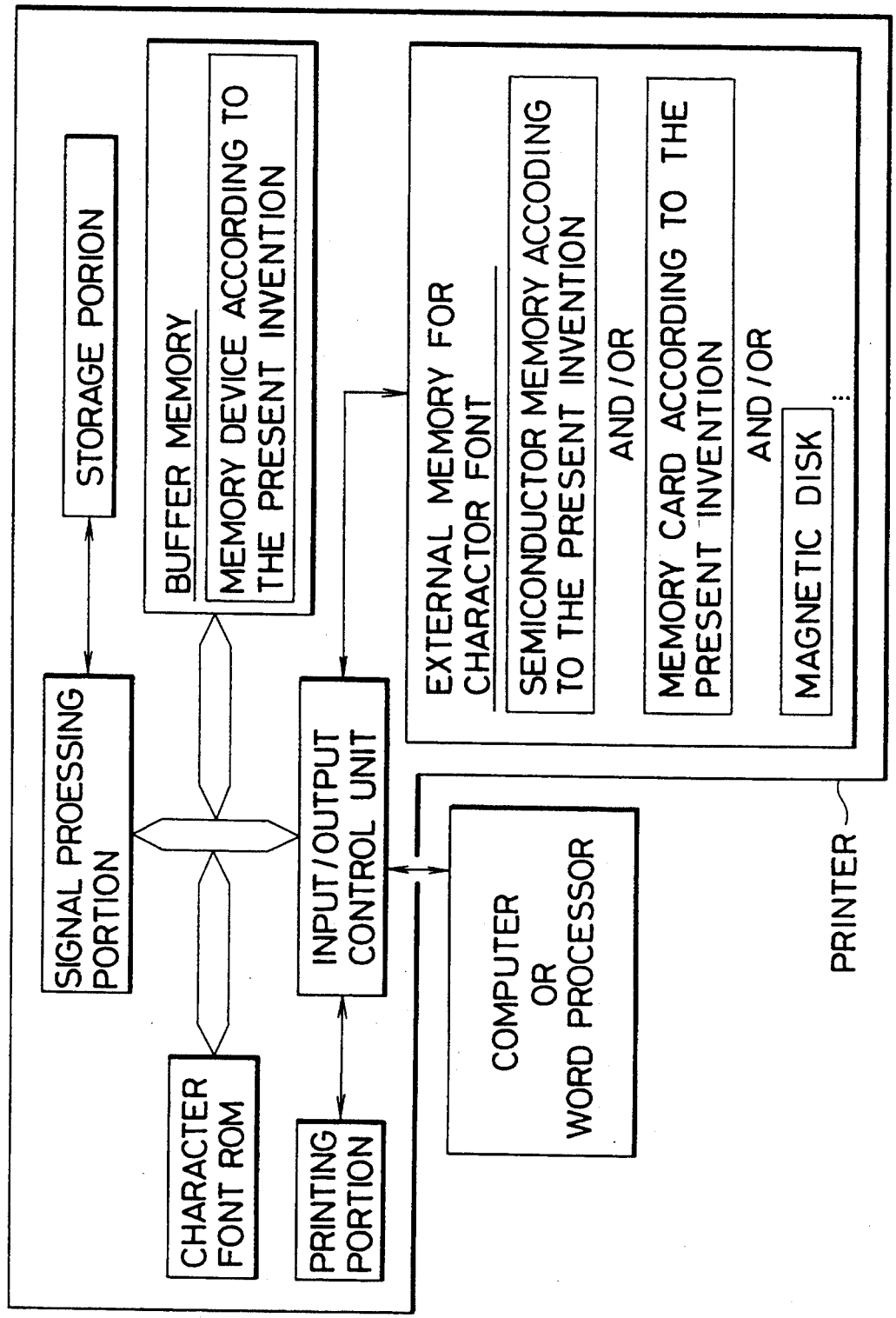
FIG. 39 illustrates the structure of the printer shown in FIG. 38.

FIG. 39 illustrates the structure of a printer shown in FIG. 38.

In the aforesaid office machine, a magnetic disk system has been used as a large capacity sub-storage device and a floppy disk system has been used as an interchangeable small capacity sub-storage device similarly to the aforesaid small to portable computer systems. Therefore, use of the memory device, the semiconductor memory board, or the memory card according to the present invention will raise the processing speed of the overall system because of the same reasons for the aforesaid computer system. Therefore, advantages can be realized in that the function can be improved, the size can be reduced, the cost can be reduced, and the reliability can be improved.

Example 28

Figure 40:
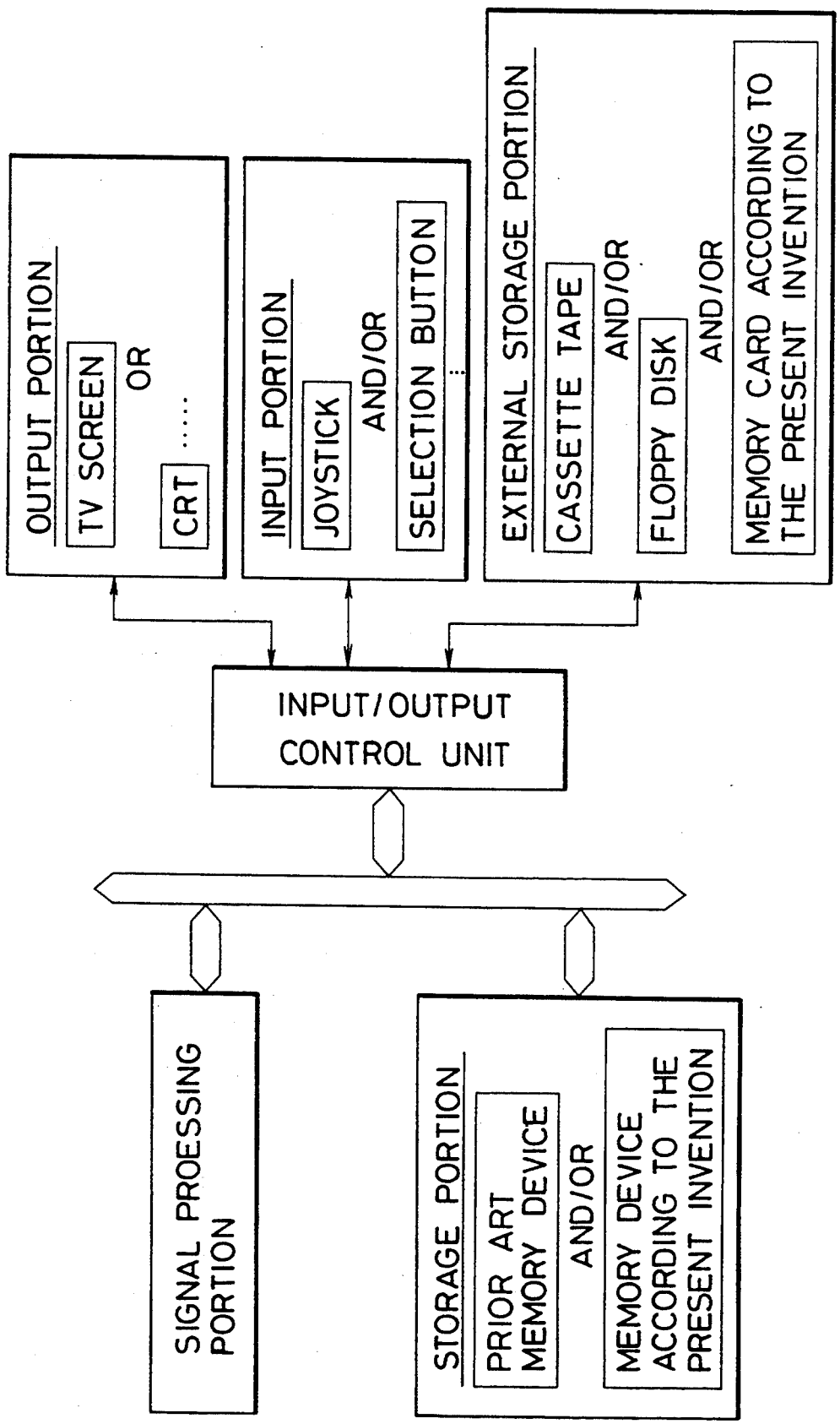
FIG. 40 illustrates the structure of a computer system for a computer game according to an example of the present invention.

FIG. 40 illustrates the structure of a computer game system according to this example. By adapting the present invention to a game-use computer, a game having a high grade content can easily be designed and the program can be operated at high speed because a large capacity memory can be provided while necessitating a reduced cost. The aforesaid effect becomes significant in the case the present invention is adapted to a portable game machine.

Example 29

Figure 41:
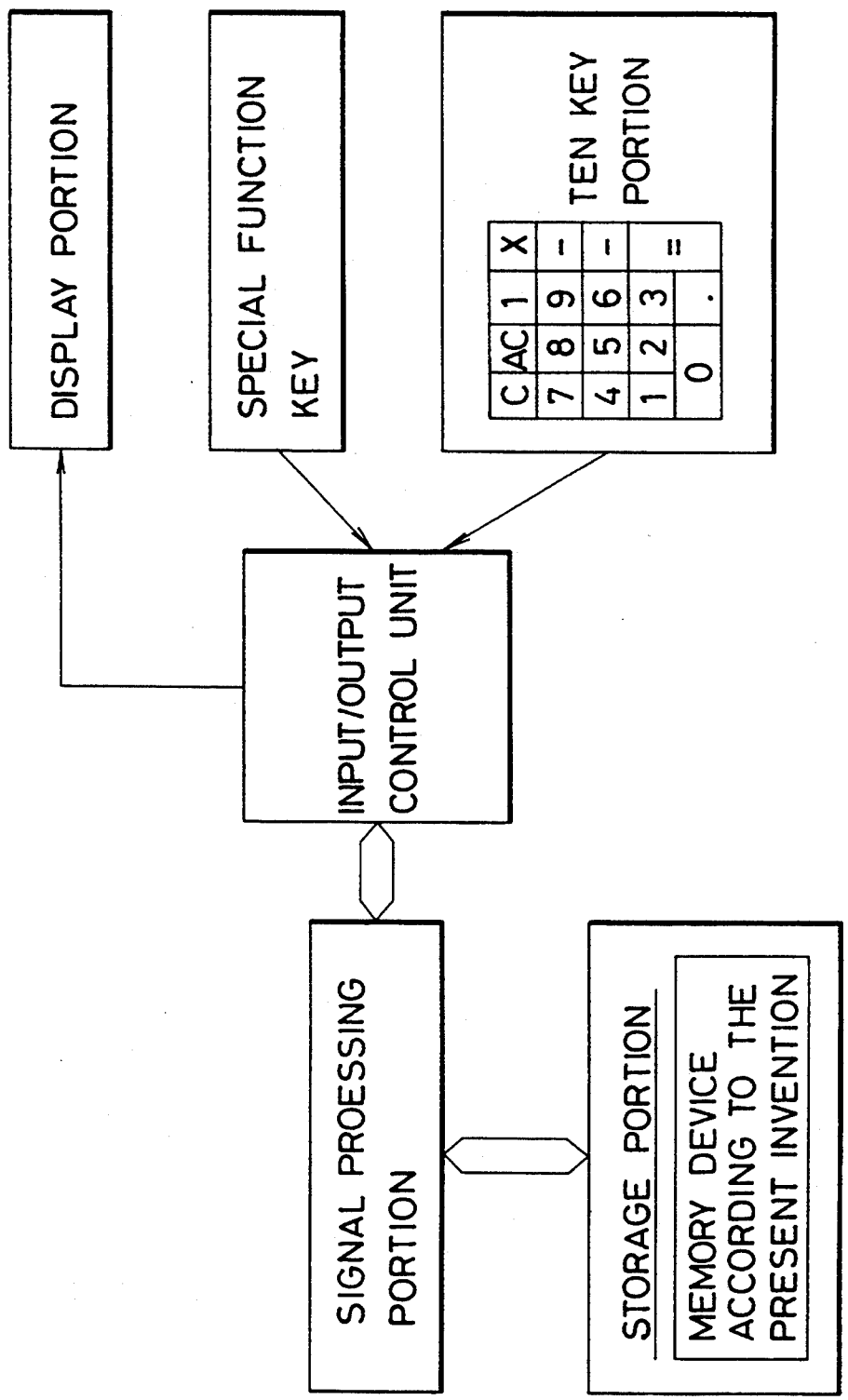
FIG. 41 illustrates the structure of a desktop electronic calculator according to an example of the present invention.

FIG. 41 illustrates the structure of a desk-top electronic calculator according to this example.

Figure 42:
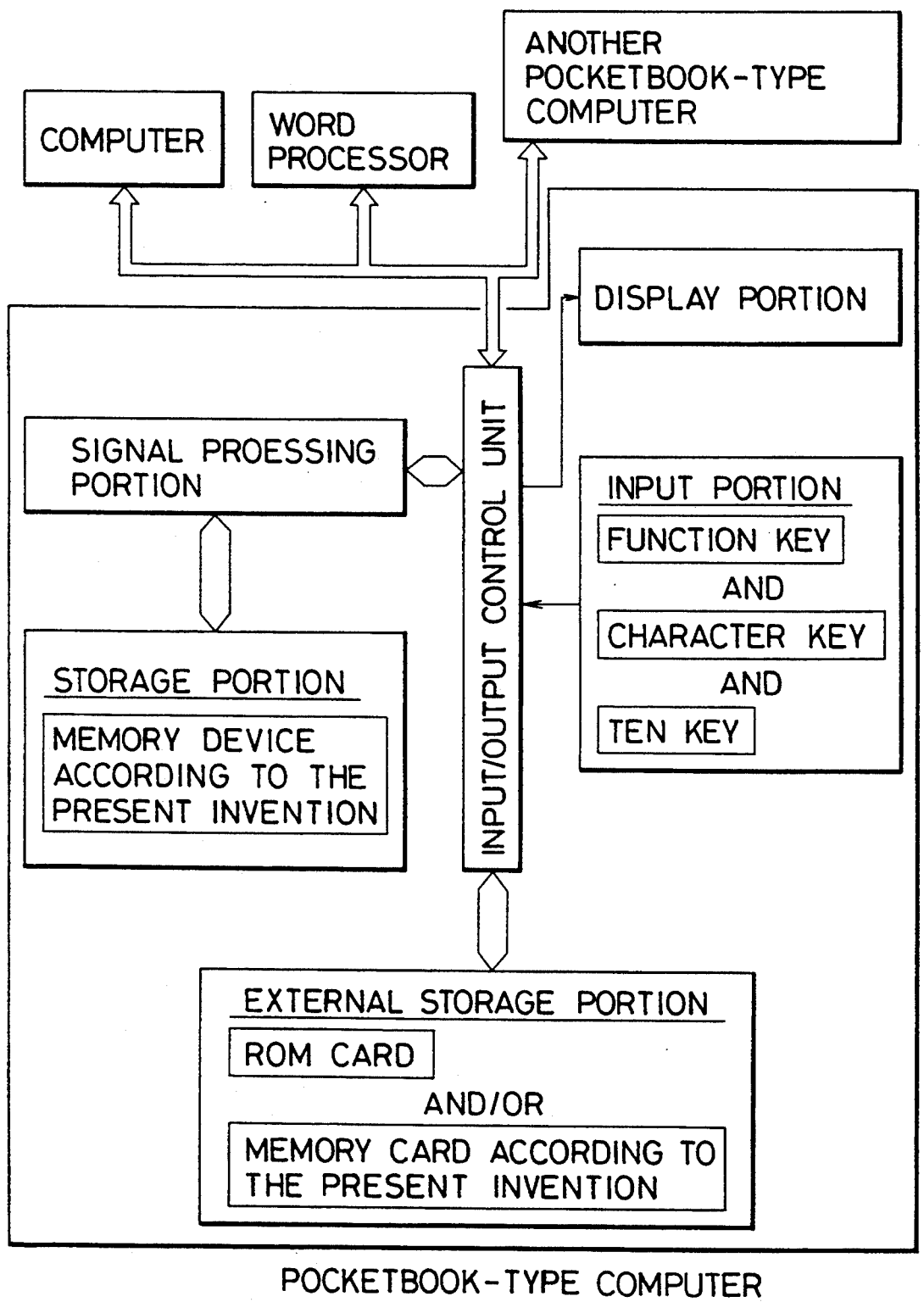
FIG. 42 illustrates the structure of a pocketbook type computer according to an example of the present invention.

FIG. 42 illustrates a pocketbook type computer according to this example.

Also in the case of the desk-top electronic calculator and the pocketbook type computer shown in FIGS. 41 and 42 will enable advantages to be realized in that the size can be reduced, the processing speed can be raised, the performance can be improved, the cost can be reduced and required electric power consumption can be decreased.

Example 30

Figure 43:
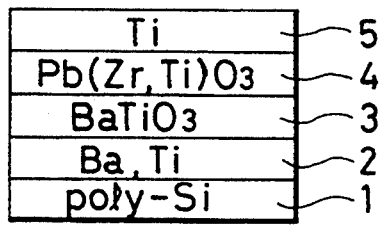
FIG. 43 is a cross sectional view which illustrates a state of deposition of $BaTiO_3$ and PZT ferroelectric material according to an example of the present invention.

FIG. 43 schematically illustrates a state of deposition of an oxide ferroelectric thin film according to this example. A Ba and Ti films 2 are formed on a polysilicon film, and $BaTiO_3$ and $Pb(Zr, Ti)O_3$ (hereinafter called a "PZT") ferroelectric thin films 3 and 4 are continuously formed on it, and a Ti film 5 is formed on it.

Figure 44:
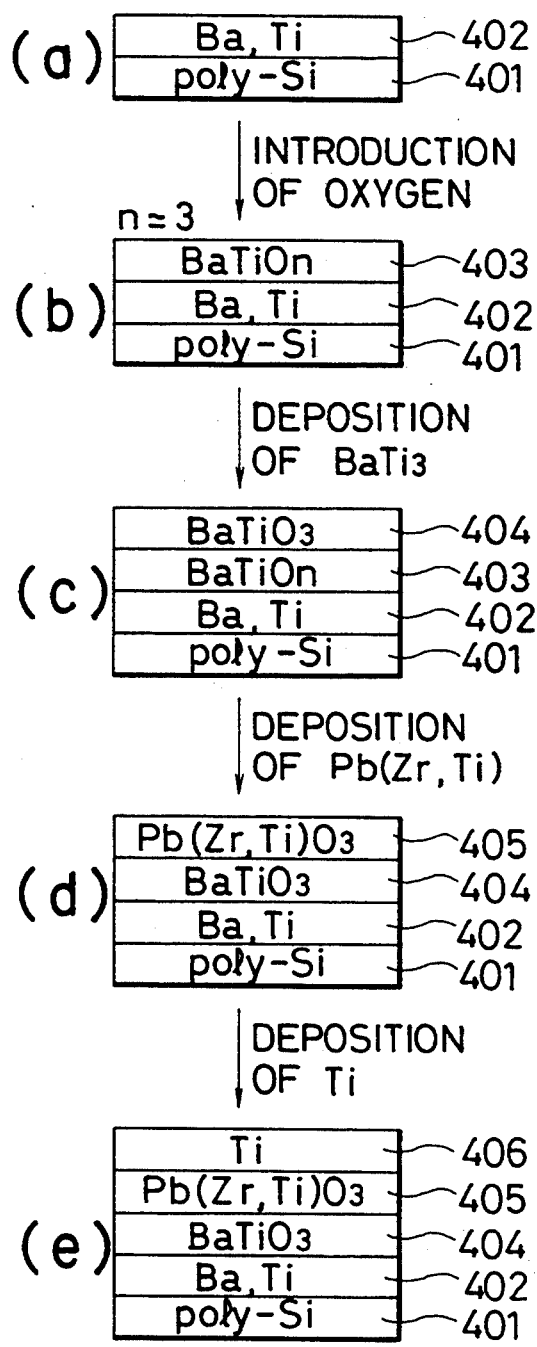
FIG. 44 is a cross sectional view which illustrates a process of forming $BaTiO_3$ and PZT ferroelectric material according to an example of the present invention.

Then, a process of forming the $BaTiO_3$ and PZT laminated ferroelectric thin films will now be described with reference to FIG. 44. A silicon wafer (having a diameter 100 mm) was, as a substrate, placed in a vacuum evaporation apparatus, and an oxygen gas was introduced through a gas blowing pipe at a flow rate of 200 ml/min while adjusting the exhaust quantity so as to realize a pressure of 0.3 Pa. Then, monosilane and $SiH_4$ were introduced at a flow rate of 20 ml/min through the gas blowing pipe, so that a polysilicon layer 401 was formed.

Then, Ba and Ti were simultaneously and continuously evaporated on it, so that a Ba-Ti alloy film 402 was formed, and an oxygen gas was introduced so that an oxygen deficit $BaTiO_n$ layer 403 was formed. Then, a $BaTiO_3$ layer and the PZT layers 404 and 405 were formed by sputtering. As the sputtering gas, an argon gas was used, and a barium titanate target composed of barium and titanium mixed at a mole ratio of 1:1 and sintered was used, and a PZT target prepared by adding PbO by an excessive quantity of 15 mol % was used. The substrate was heated to about 590° C., and layers 404, 405 each having a perovskite crystal structure were formed. Then, Ti layer 406 as upper electrode was deposited on the layers 404 and 405.

Example 31

2-1 A Ba-Ti alloy film 402 shown in FIG. 44a and according to Example 30 was formed by sputtering. As the sputtering gas, an argon was used, and a target prepared by individually sintering Ba and Ti was used. The temperature of the substrate was made to be about 600° C. The residual processes are the same as those of Example 30.

2-2 A Ba-Ti alloy film 402 shown in FIG. 44a according to Example 30 was formed by a heat evaporation method. The residual processes are the same as those of Example 30.

2-3 A Ba-Ti alloy film 402 shown in FIG. 44a was formed by a MOCVD method while employing the aforesaid process. The residual processes are the same as those of Example 30.

Example 32

A $BaTiO_3$ film 404 and PZT film 405 shown in FIG. 44d were formed by a MOCVD method in place of the sputtering method while employing the process according to Example 30. As an evaporation material, β-diketone complexes was used for Ba and Pb, alkoxide was used as the Ti and Zr, and an Ar gas was used as a carrier gas at the time of supplying the material.

The residual processes are the same as those of Example 30.

Example 33

A technology for forming a solid-solution film of $BaTiO_3$ and $SrTiO_3$ by an organic metal gas phase grow method will now be described.

Figure 45:
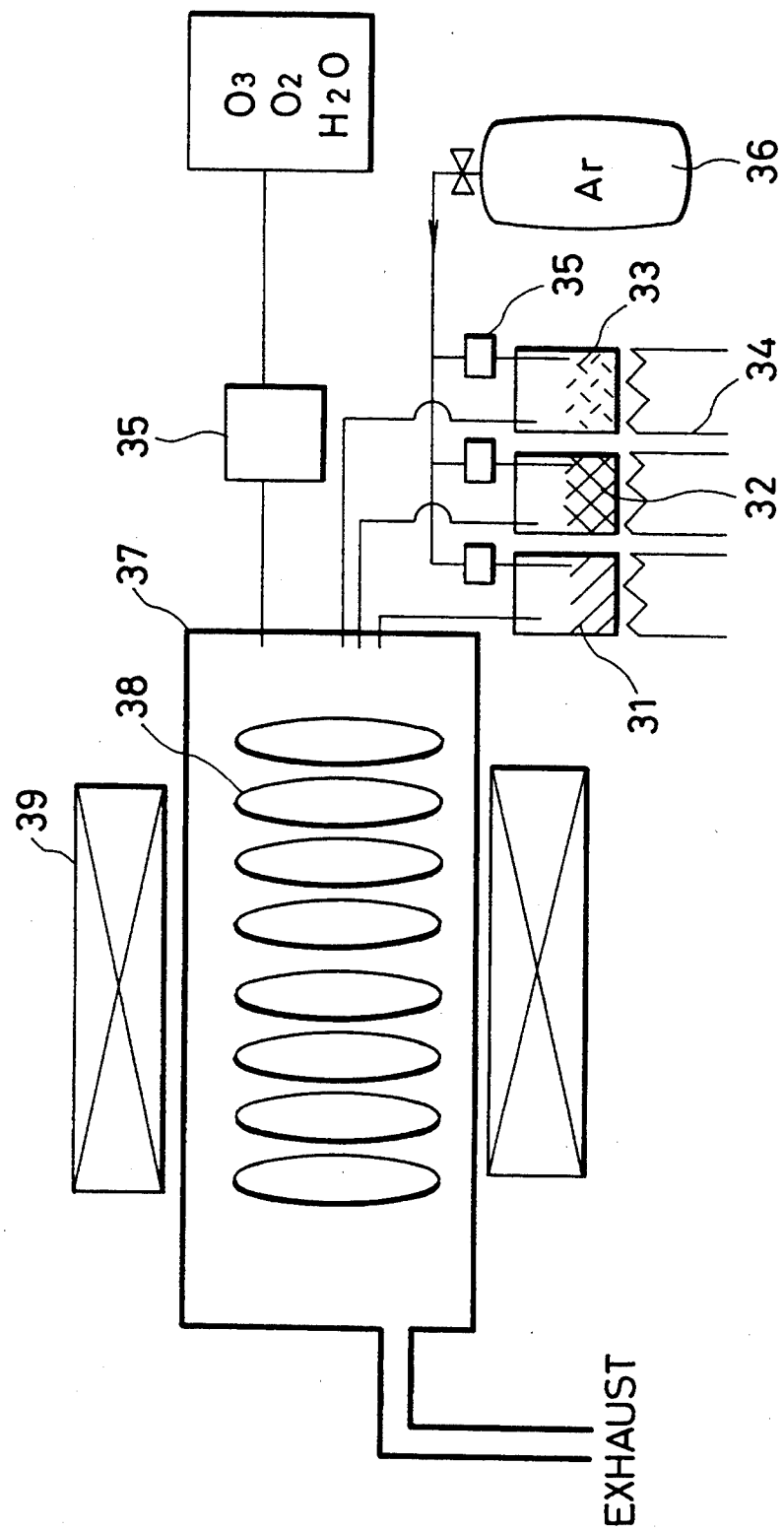
FIG. 45 illustrates an ordinary MOCVD apparatus.

FIG. 45 illustrates the structure of a growing apparatus adapted to the organic metal gas phase grow method. The composition ratio of $BaTiO_3$ and $SrTiO_3$ were made to be 4:6. Ba and Sr each of which is in the form of the β-ketone complex and Ti in the form of alkoxide are enclosed in individual vessels 31, 32 and 33, and they were heated by a heater 34 at 180° C., 250° C. and 30° C. respectively. Furthermore, argon gases 36 are respectively introduced into the containers at corresponding flow rates 220 ml/min, 400 ml/min and 300 ml/min by using a flow controller 35. As a result, the argon gas, which contains the metal complex evaporated from the vessel, is introduced into a quartz cylinder 37 in which a substrate 38 is placed. Simultaneously a mixture gas of an ozone gas, steam and oxygen is introduced into the quartz cylinder at a flow rate of 500 ml/min. It should be noted that the substrate placed in the quartz cylinder is heated to 600° C. by a heating coil. The pressure in the quartz cylinder is lowered to a pressure of 100 Pa.

As a result of the film forming process performed for one hour, $BaTiO_a$ and $SrTiO_3$ solid-solution film having a thickness of about 0.5 μm is formed on the surface of each of the 50 substrates placed in the quarts cylinder. The substrate, on which the film has been formed, is cooled down to the room temperature while taking about 6 hours at a temperature drop rate of 100° C./hour, so that a capacitor is constituted.

Although the MOCVD method is employed to form the film, it can be formed by a sputtering method, a sol-gel method, an evaporation method, or a hydrothermal method. If the sputtering method is employed, the composition of the target is changed and therefore the composition of the film can controlled satisfactorily. Hence, a film such as $(Pb,La) (Ti,Zr)O_3$ and $Pb(Mg, Nb)O_3$ in which copper is solid-dissolved and the like, each of which is composed a multiplicity of elements, can easily be formed.

Example 34

In each of the aforesaid examples, ferroelectric materials having different compositions are formed on a metal or semiconductor substrate, and the first layer is used as the buffer layer with the base metal so as to improve the crystallinity of the ferroelectric material of the second layer so that the ferroelectric characteristics are realized. Another technology will now be described in which ferroelectric materials having different compositions are formed on an insulator or an insulating substrate and the first layer is, similarly to the aforesaid example, used as the buffer layer with the base metal so as to improve the crystallinity of the ferroelectric material of the second layer so that the ferroelectric characteristics are realized.

Figure 46A:
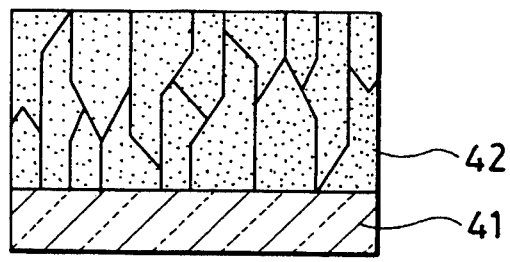
FIGS. 46a to 46d is a vertical cross sectional view which illustrates the capacitor according to an example of the present invention.
Figure 46B:
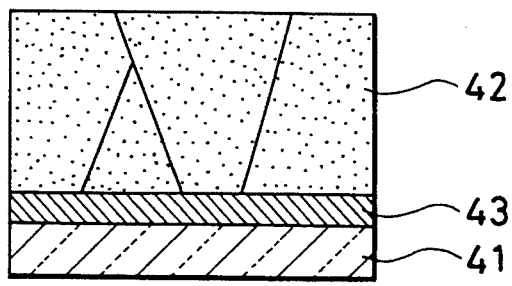

FIGS. 46a and 46b are schematic views which respectively illustrate a cross sectional structure observed by an electronic microscope in the case where $SiO_2$ 41 is used as the base material, and a $Pb(Mg,Nb)O_3$ crystal 42 is allowed to grow as the ferroelectric material on it, and a cross sectional structure observed in the case where a $SrTiO_3$ film 43 is formed on the base $SiO_2$ layer, and $Pb(Mg,Nb)O_3$ is allowed to grow on it.

The $SrTiO_3$ film is formed by a MOCVD method in accordance with the following process. A substrate is disposed in a vacuum chamber, the pressure of which has been lowered to $10^{-6}$ Torr. Then, the substrate is heated to 600° C. Sr in the form of a $\beta$-diketone complex and Ti in the form of alkoxide are used. The vessel and the pipes are respectively heated to 230° C. and 30° C., and Ar is, as the carrier gas, introduced into the vacuum chamber at flow rates 50 ml/min and 150 ml/min. Simultaneously, ozone, excited by ultraviolet rays, is introduced at a flow rate of 200 ml/min. The pressure in the vacuum chamber is 0.1 Torr at this time. After the film has been formed, a heat treatment at 700° C. for one hour is performed in vacuum. The $Pb(Mg,Mg)O_3$ film is formed by a sol-gel method. The thickness of the $SrTiO_3$ film is 0.1 $\mu$m and that of the $Pb(Mg,Nb)O_3$ is 0.5 $\mu$m.

The crystallinity of $Pb(Mg, Nb)O_3$ of the two types of films were subjected to a comparison by an X-ray diffraction method while evaluating the intensity of the diffraction peak. As a result, the $Pb(Mg, Nb)O_3$ film formed by using $SrTiO_3$ displays excellent crystallinity because it has a diffraction intensity from the plane azimuth (001) which is about 20 times. Furthermore, the fact that the size of the crystal particles is 10 times or more as shown in FIGS. 46a and 46b was observed.

Figure 46C:
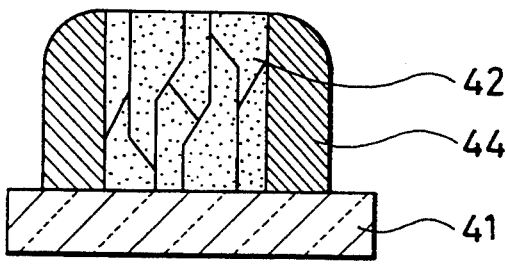
Figure 46D:
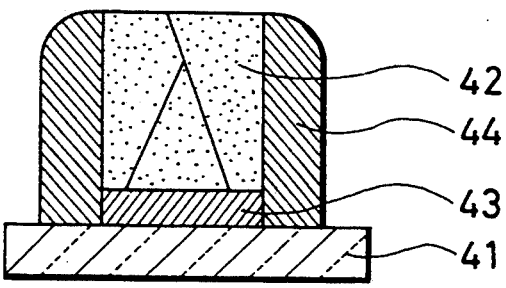

In order to evaluate the electric characteristics of the aforesaid structures, devices were formed as shown in FIGS. 46c and 46d in each of which electrodes 44 are formed on the side surface of the ferroelectric material. The procedure is as follows: the ferroelectric film is processed to have a width of 0.2 $\mu$m and a length of 5 mm by photolithography and reactive ion etching. Platinum, which is made to be the electrodes, is formed to have a thickness of 0.1 $\mu$m by sputtering. Then, platinum present on the processed ferroelectric material is removed by photolithography and ion milling so as to electrically separate platinum present on the side surface of the ferroelectric material.

The electric characteristics of the devices were evaluated, resulting in that the relative permittivities of the devices respectively shown in FIGS. 46c and 46d were 500 and 4,300, and the specific resistances were $5 \times 10^{12}$ $\Omega$cm and $8 \times 10^{13}$ $\Omega$cm. As a result of the measurement, the structure having the $SrTiO_3$ layer from the base film displayed excellent permittivity improved by one digit and insulating characteristics improved by one digit.

Furthermore, the existence of $SrTiO_3$ from the base film is subjected to a comparison by using $Pb(Zr,Ti)O_3$ in the same structures, resulting in improvements in that the permittivity is improved by about one digit and the insulating characteristics are improved by about one digit or more. Furthermore, the spontaneous polarization is increased by about 30% in the case where $SrTiO_3$ is formed.

Figure 47:
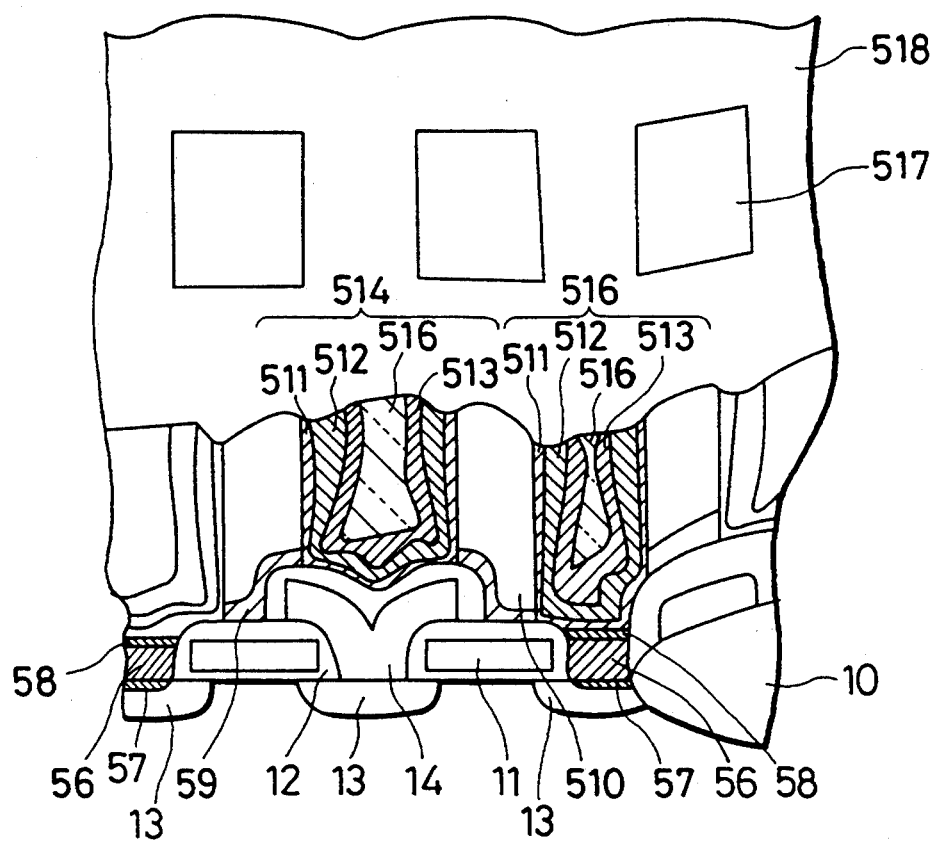
FIG. 47 is a vertical cross sectional view which illustrates the DRAM according to an example of the present invention.

FIG. 47 is a cross sectional view which illustrates a DRAM cell which is an applicable example of the present invention.

Figure 48:
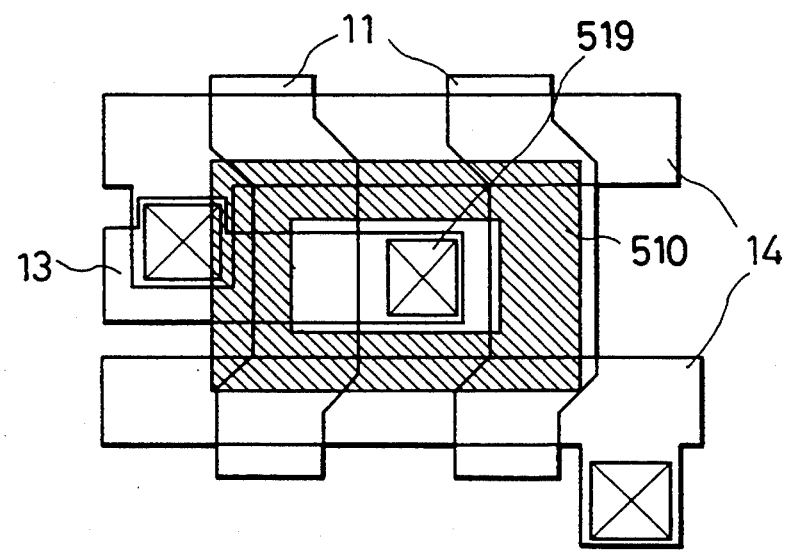
FIG. 48 is a plan view which illustrates the DRAM according to an example of the present invention.

FIG. 48 is a plane view which illustrates the DRAM cell which is the applicable example of the present invention.

The aforesaid device is designed in accordance with a 0.3 $\mu$m rule under conditions that the power supply voltage is 3.0 V, the sense amplifier pitch is 0.8 $\mu$m and the word line pitch is 0.7 $\mu$m. However, the present invention is not limited to the aforesaid designed dimensions.

On the Si substrate are formed an n-type diffusion layer 13, a gate electrode 11, a gate insulating film 12, a $SiO_2$ insulating film 10 for separating the device for example, and a bit line 14 made of polysilicon, so that a MOS transistor is constituted. After the contact hole has been formed, a titanium layer 56 in a contact hole is formed for reducing the contact resistance. Formed titanium reacts with silicon in an ensuing high temperature process, so that a titanium silicide 57 having a thickness of about 0.020 $\mu$m is formed in the boundary with silicon, the titanium silicide further reducing the contact resistance.

Then, a titanium nitride 58 serving as a barrier layer is formed on the titanium layer. By forming the barrier material in the contact hole of the drain electrode of the MOS transistor before the ferroelectric film is formed, contamination of heavy metal such as lead and zirconium, and magnesium contained by the ferroelectric material, which will be movable ions in Si, into Si is prevented. If the heavy metal or movable ions are contaminated into Si, an electron energy level is formed in a deep region in the band gap of Si, causing the MOS characteristics to deteriorate, for example, the leakage current to increase in the MOS transistor or causing the threshold voltage to be changed. As a barrier material capable of preventing it, the titanium nitride 273 is used.

Furthermore, an $SrTiO_3$ layer and a $Pb(Mg,Nb)O_3$ layer are formed to respectively have a thickness of 0.1 $\mu$m and a thickness of 0.45 $\mu$m by a CVD method and a sol-gel method. Furthermore, a photolithography process and a dry etching process are performed so that a P $(Mg,Nb)O_3$ layer 510 and a $SrTiO_3$ layer 59 are formed to have a width of 0.15 $\mu$m and a length of 2 $\mu$m. At this time, the height of the ferroelectric layer is 0.5 $\mu$m, and the ferroelectric layer is formed to surround the contact hole 519 of the drain electrode of the MOS transistor as shown in FIG. 48. Furthermore, platinum 511 is formed to have a thickness of 0.01 $\mu$m, aluminum 512 is formed to have a thickness of 0.04 $\mu$m and a polysilicon 513 is formed to have a thickness of 0.05 $\mu$m. Then, the surface of polysilicon is oxidized by heat. Furthermore, boron silicate glass (BPSG) 516 is formed and reflowed at a high temperature of 800° C. Then, the PBSG 516 is etched back until polysilicon 513 present on $Pb(Mg,Nb)O_3$ 510 appears.

Then, polysilicon 513 present on the ferroelectric material is removed by etching, and aluminum 512 present on the ferroelectric material is removed by sulfuric acid. Then, the exposed platinum is removed by aqua regia. As a result, a plate electrode 514 and a storage node 516 are, as shown in FIG. 47, electrically separated from each other while interposing the ferroelectric material. As an alternative to this, the removal of platinum can be performed by an ion milling method. As a result, the area of the electrode positioned in contact with $Pb(Mg,Nb)O_3$ is made to be 1.1 $\mu m^2$ (2 $\mu$m $\times$ 0.55 $\mu$m) and the interval between the electrodes is made to be 0.15 $\mu$m.

A capacitance of about 80 fF is obtained with the capacitor according to this example. Since a voltage of 1.5 V, which is the half of the power supply voltage of 3 V, is applied to the plate electrode, a charge of 120 fC is stored. Furthermore, in the case where the electrode is formed perpendicular to the direction of the growth of the ferroelectric crystal, a leakage current is reduced to about 1 fA which is sufficiently small value to be used as a DRAM cell.

In the aforesaid process, only one lithography process is required to constitute the storing capacitor, the number of masks can be decreased in comparison to the conventional method in which two to four lithography processes must be performed for constitute the capacitor. Furthermore, another advantage can be realized in that the limit present in the layout taken place due to the alignment accuracy can be absorbed.

Although the description is made about $Pb(Mg,Nb)O_3$ which is used in the DRAM, the present invention is not limited to the aforesaid film. For example, in the case where $BaTiO_3$, or $SrTiO_3$ or a solid-solution film, or the main component of which is either of the aforesaid film, is used, excellent response characteristics can be obtained in a high frequency region of 1 MHz or higher although the dimensions of the device are different from the aforesaid device because they have a small relative permittivity in comparison to that of $Pb(Mg, Nb)O_3$. The reason for this lies in that the mass of Ba atom and that of Sr atom is smaller than that of Pb atom. Since $Pb(Ti, Zr)O_3$ and $(Pb, La)(Ti, Zr)O_3$ do not contain Mg which is the component element of $Pb(Mg, Nb)O_3$, a problem such as the change of the characteristics of the MOS transistor due to the dispersion of Mg or the fact that Mg becomes movable ions can be prevented, so that an effect is obtained in that the reliability is improved.

In the aforesaid example, the ferroelectric capacitor 510 surrounds the drain electrode 519 of the MOS transistor as shown in FIG. 48. FIG. 8 is a plan view which illustrates an applicable example of this example of a DRAM capacitor in which the ferroelectric capacitor is formed to surround the electrode of a transistor, and projections and pits are formed on the surface of the electrode in order to enlarge the surface area of the electrode. By employing the aforesaid layout, the height of the ferroelectric material can be lowered to 0.4 μm when the same capacitance as that obtainable from the aforesaid example is obtained. Since the height of the ferroelectric capacitor can be lowered, the deterioration of yield due to the breakage of the wiring (the aluminum wiring of the word line) disposed on the capacitor can be prevented.

Example 35

An example, in which the capacitor is arranged to have the electrodes formed in parallel to the direction in which the ferroelectric material crystal grows, will now be described. In the drawings, the states of the particle block of crystals observed by an electronic microscope are schematically illustrated.

Figure 49:
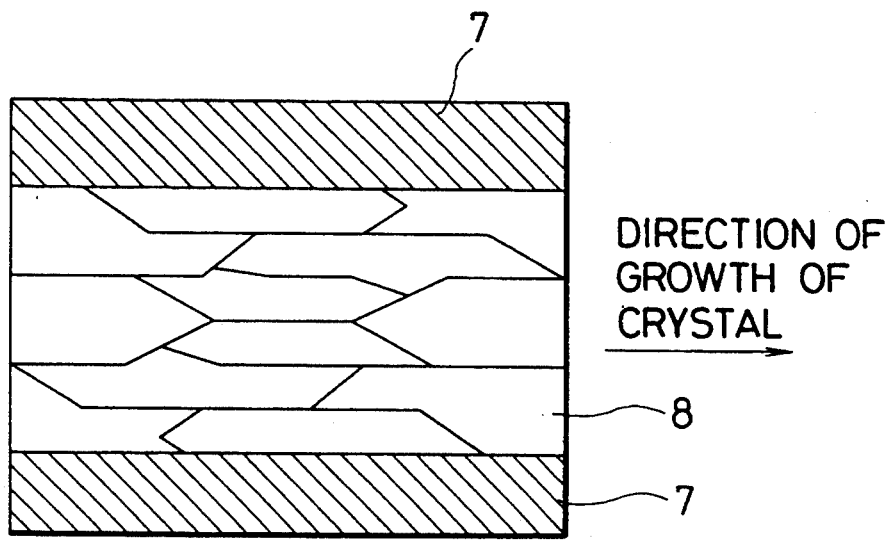
FIG. 49 is a cross sectional view which illustrates a direction in which crystal grows in the ferroelectric material and the capacitor in which electrodes are formed in parallel according to an example of the present invention.

FIG. 49 is a cross sectional view which illustrates the capacitor having the electrode formed in parallel to the direction in which the ferroelectric material crystal grows.

Figure 50:
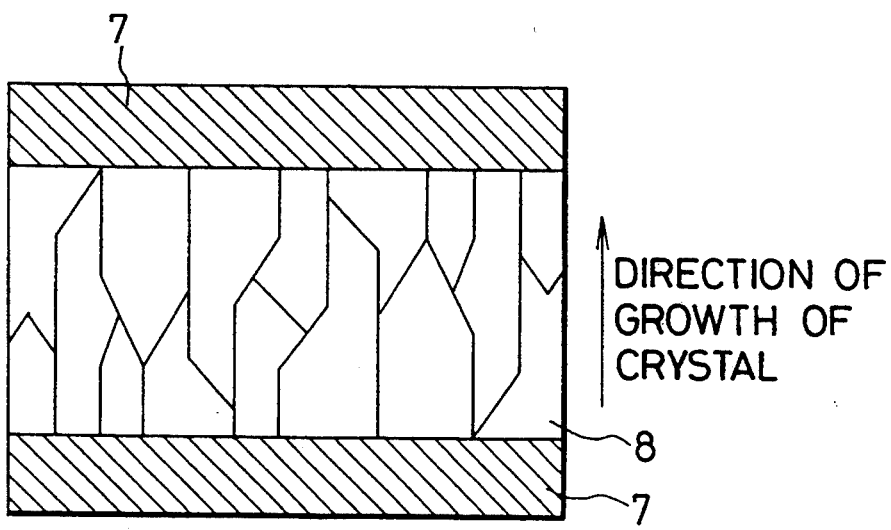
FIG. 50 is a cross sectional view which illustrates a capacitor in which electrodes are formed perpendicular to the direction in which the crystal grows in the ferroelectric material.

FIG. 50 is a cross sectional view which illustrates the capacitor having the electrode formed perpendicular to the direction in which the ferroelectric material crystal grows.

Referring to FIG. 50, reference numeral 7 represents a pair of electrodes, and 8 represents a crystal of the ferroelectric material. The area of the electrode is 500 $\mu m^2$ and the interval between the electrodes is 0.5 μm. As the material of the ferroelectric material, $Ta_2O_5$ is employed.

It should be noted that $Ta_2O_5$ is formed by the following process by employing a CVD method. A substrate is placed in a vacuum chamber the pressure of which has been lowered to $10^{-6}$ Torr. Then, $Ta(OC_2H_5)_5$ and ozone excited by ultraviolet ray are introduced at a flow rate of 200 ml/min and 500 ml/min respectively. The pressure in the above chamber at this time is 0.1 Torr. After the film has been formed, a heat treatment at 700° C. is performed in vacuum. The electrodes are formed by n-type doped polysilicon.

Figure 51:
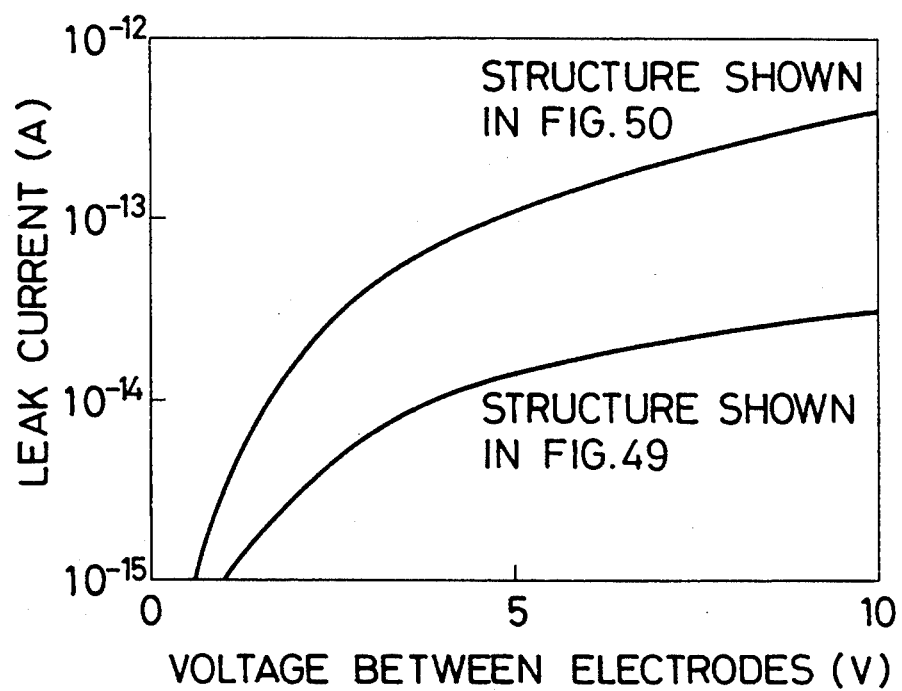
FIG. 51 is a graph which illustrates the relationship among the voltage between the electrodes and the leakage current realized in the capacitors respectively shown in FIGS. 49 and 50.

FIG. 51 is a graph which illustrates the dependency of the leakage current in the capacitors upon the voltage between the electrodes. As a result, the device, in which the electrodes are formed perpendicular to the direction in which the crystal grows, and to which an electric field is applied perpendicular to the direction in which the crystal grows, displays the leakage current reduced by about one digit in comparison to the structure in which the electric field is applied in parallel.

Also in the case where the electrodes are formed perpendicular to the direction in which the crystal grows and in the case where the electrodes are formed in parallel to the same, the effective permittivity is 20.

Also in the case where $TiO_2$ is formed by a similar method, a similar permittivity is realized, and the leakage current can be reduced by about one digit when the electric field is applied perpendicular to the direction in which the crystal grows.

Example 36

A DRAM cell which uses the capacitor according to this example will now be described. The aforesaid DRAM cell is designed in accordance with a 0.3 μm rule under conditions that the power supply voltage is 3.0 V, the sense amplifier pitch is 0.8 μm, and the word line pitch is 0.7 μm. However, the present invention is not limited to the aforesaid designed dimensions.

Then, a process of manufacturing the aforesaid DRAM cell portion will now be described.

Figure 52A:
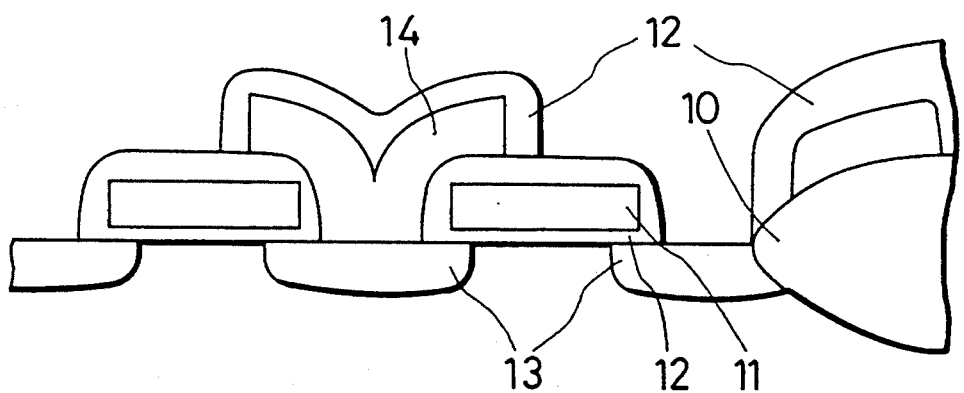
FIGS. 52a to 52g illustrates the process for manufacturing a DRAM memory cell portion which uses a capacitor according to Example 36 of the present invention, where

FIG. 52a illustrates the structure of an ordinary MOS transistor.

The MOS transistor is constituted in such a manner that an n-type diffusion layer 13, a gate electrode 11, a gate insulating film 12, and a $SiO_2$ insulating film 10 for separating the device for example, and a bit line 14 made of polysilicon are formed on a Si substrate.

Figure 52B:
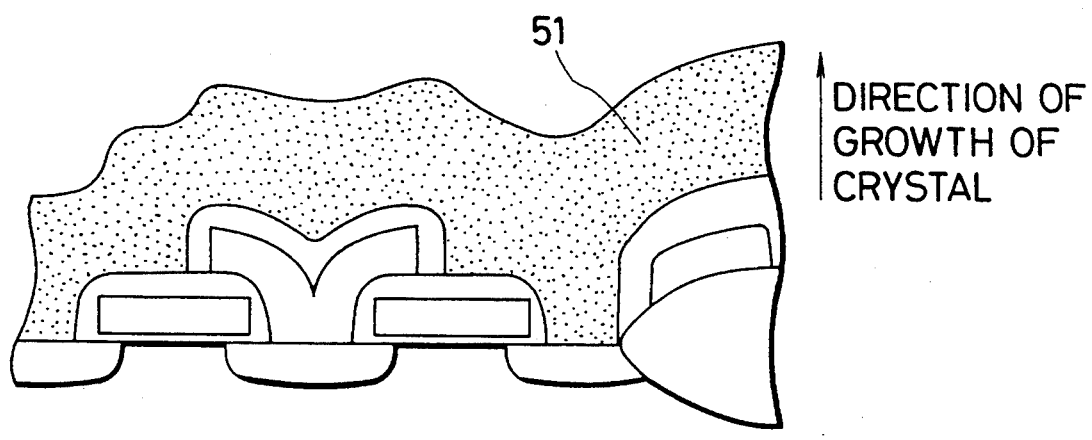

FIG. 52b illustrates a process for manufacturing the DRAM cell which uses the capacitor.

Then, $Pb(Mg,Nb)O_3$ is formed to serve as a ferroelectric material 51 by sol-gel method and to have a thickness of 0.5 μm after the contact hole has been formed.

Figure 52C:
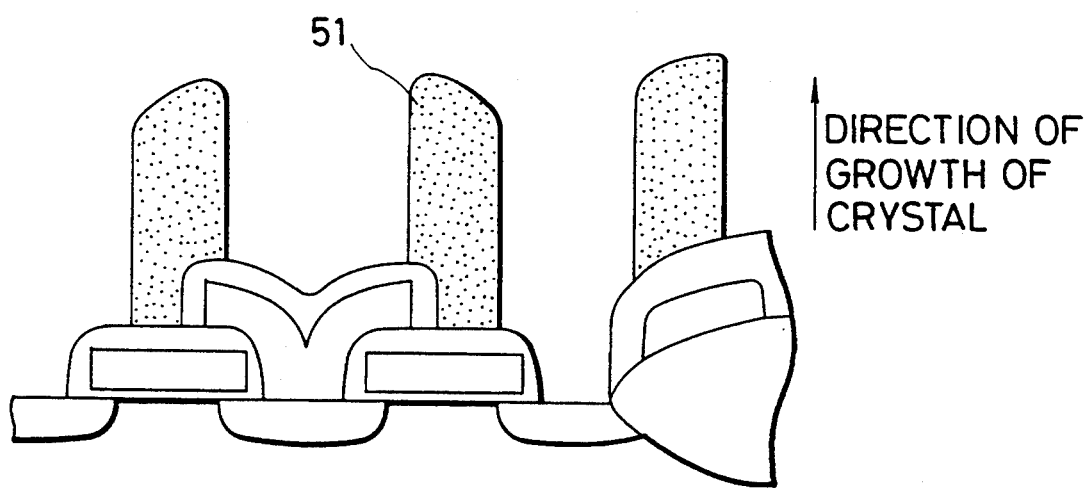

FIG. 52c illustrates a process for manufacturing the DRAM cell which uses the capacitor.

A photolithography process and a dry etching process are performed, and $Pb(Mg, Nb)O_3$ which is made to be a ferroelectric material 51 is formed to have a width of 0.15 μm and a length of 2 μm. At this time, the height of the ferroelectric material 51 is 0.5 μm so that a pattern is formed in which the ferroelectric capacitor surrounds the contact hole of the source electrode of the MOS transistor.

Figure 52D:
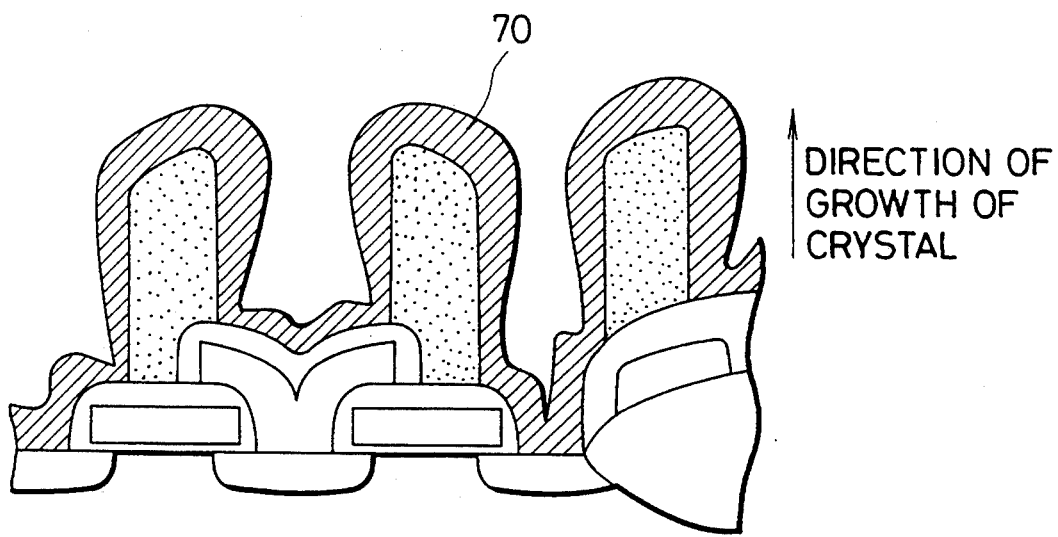

FIG. 52d illustrates a process for manufacturing the DRAM cell which uses the capacitor.

By employing a sputtering method, platinum 70 is formed on the ferroelectric material 51 to have a thickness of 0.05 μm.

Figure 52E:
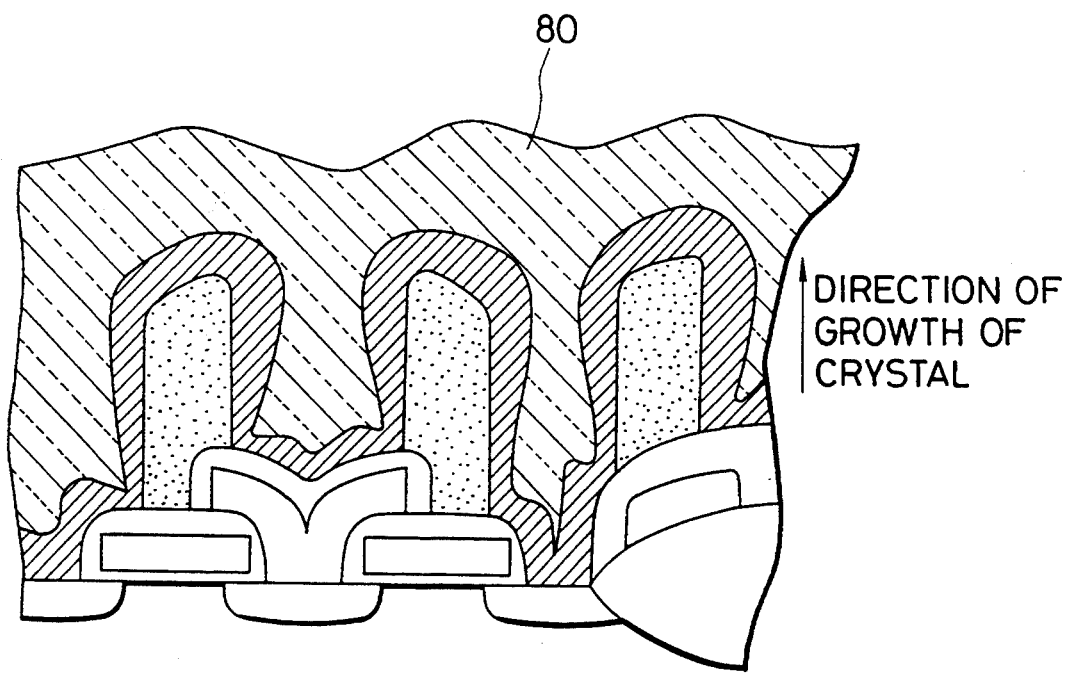

FIG. 52e illustrates a process for manufacturing the DRAM cell which uses the capacitor.

Boron silicate glass (BPSG) 80 is formed on the platinum 70, which is made to be the electrode, and it is reflowed at a high temperature of 800° C.

Figure 52F:
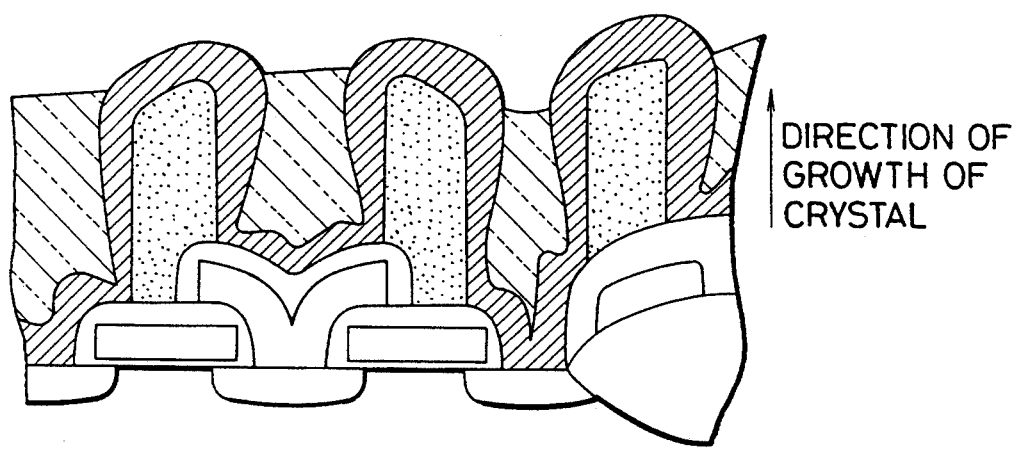

FIG. 52f illustrates a process for manufacturing the DRAM cell which uses the capacitor.

The boron silicate glass (BPSG) 80 is etched back until the platinum 70 on the ferroelectric material Pb(Mg, Nb)O$_3$ 51 appears outside.

Figure 52G:
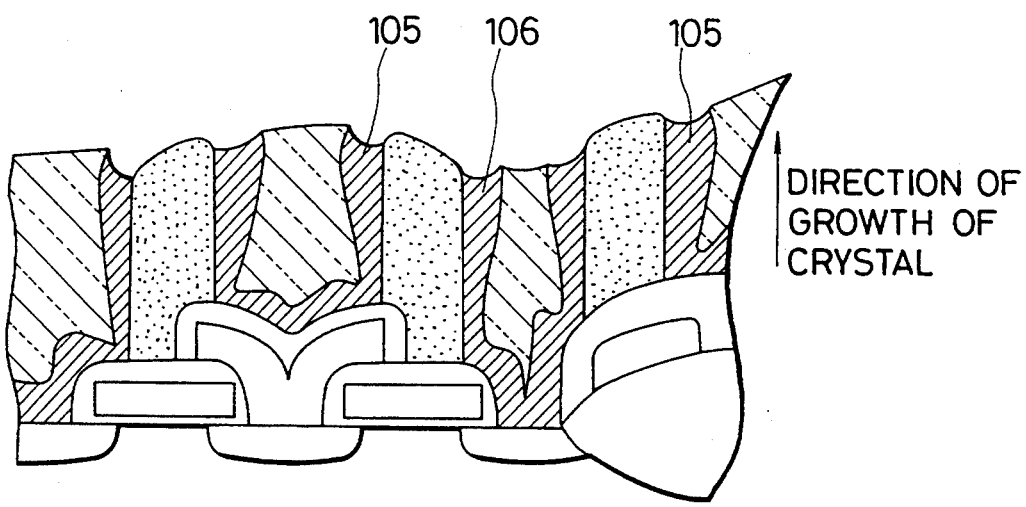

FIG. 52g illustrates a process for manufacturing the DRAM cell which uses the capacitor.

By performing wet etching by using aqua regia, the exposed platinum 70 is removed, so that the plate electrode 105 and the storage node 106 are electrically separated from each other. The platinum can also be removed by an ion milling method. As a result, the area of the electrode which is positioned in contact with the ferroelectric material Pb(Mg,Nb)O$_3$ 51 is made to be 1 μm$^2$ (2 μm×0.5 μm), and the interval between electrodes is made to be 0.15 μm.

Figure 53:
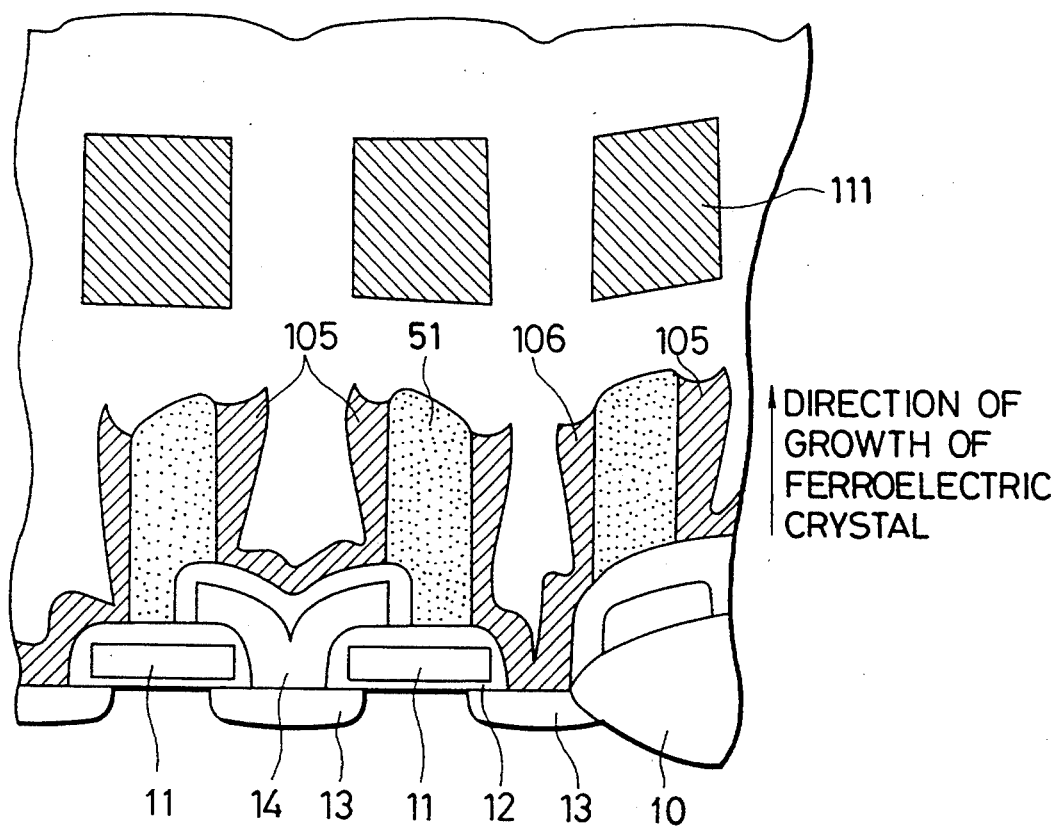
FIG. 53 illustrates the process for manufacturing the DRAM cell portion which uses the capacitor according to example 36 of the present invention.

FIG. 53 illustrates a process for manufacturing the DRAM cell which uses the capacitor.

As shown in FIG. 53, a SiO$_2$ film serving as a protection film is formed on the capacitor, so that the memory cell is constituted. In the case where a DRAM is constituted, an aluminum wiring 111 and the like are disposed on it so as to establish a contact with an external electrode before it is enclosed in a package. Thus, the DRAM is manufactured. Although the process for forming the peripheral circuits such as the sense amplifier and the driver circuit and the like are omitted from the description, they are of course included.

A capacitance of about 80 fF is obtained with the capacitor according to this example. Since a voltage of 1.5 V, which is the half of the power supply voltage, is applied to the plate electrode, a charge of 120 fC is stored. Furthermore, a leakage current is reduced to about 1 fA which is sufficiently small value to be used as a DRAM cell in the case where the electrodes are formed perpendicular to the direction in which the crystal of the ferroelectric material grows.

In the case where the capacitor is constituted by the conventional technology in which platinum is used as the base film, a Pb(Mg,Nb)O$_3$ film is forme by a sol-gel method to have a thickness of 0.15 μm, and the area of the electrode is made to be 1 μm, the crystal grows perpendicular to the base platinum film as shown in FIG. 50. The aforesaid direction of the growth of the crystal can be observed by an electronic microscope while cutting the capacitor. The electric characteristics of the capacitor was evaluated, resulting in that the capacity was about 80 fC but the leakage current was excessively increased to 20 fA.

By forming a barrier material in the contact hole of the drain electrode of the MOS transistor before the ferroelectric film is formed, contamination of heavy metal such as lead and zirconium, and magnesium contained by the ferroelectric material, which will be movable ions in Si, into Si is prevented. If the heavy metal or movable ions are contaminated into Si, an electron energy level is formed in a deep region in the band gap of Si, causing the leakage current to increase in the MOS transistor or causing the threshold voltage to be changed. As a barrier material capable of preventing it, the titanium nitride is used.

Figure 54:
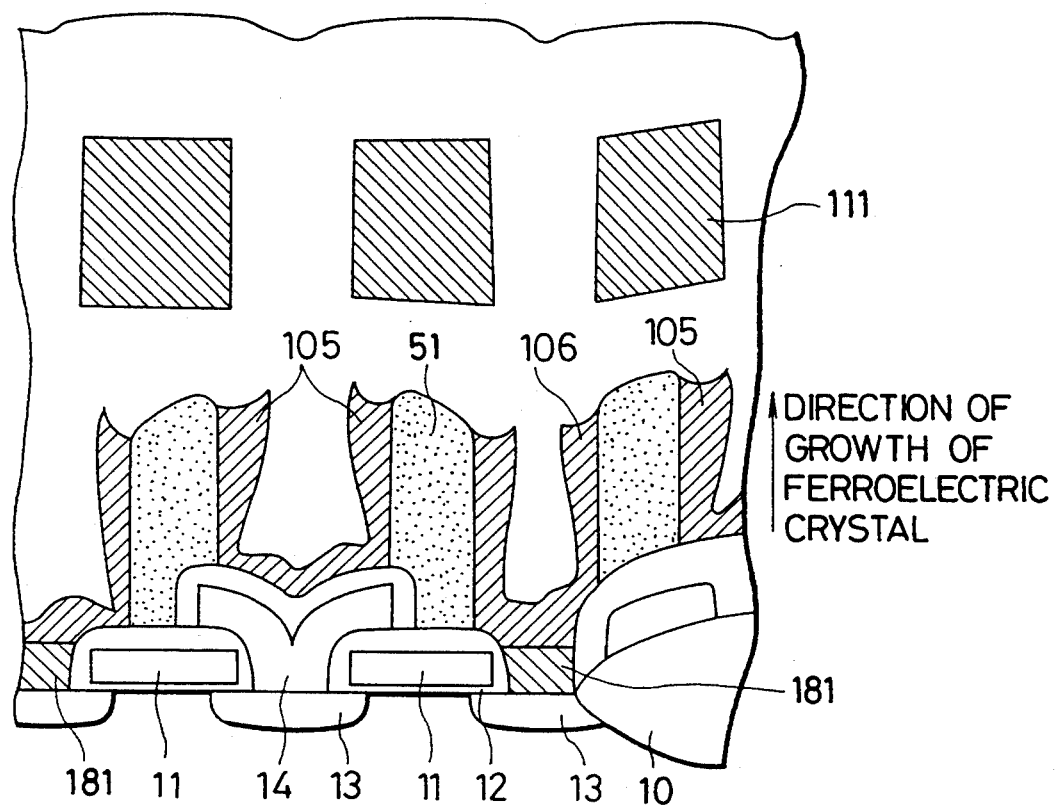
FIG. 54 illustrates a DRAM cell portion which uses a capacitor according another example of the present invention.

FIG. 54 illustrates the DRAM cell portion which uses another capacitor. The DRAM cell portion shown in FIG. 79 is arranged in such a manner that titanium nitride 181 is, as the barrier material, formed on the source electrode. In the aforesaid method, only one lithography process is required to constitute the storing capacitor, the number of masks can be decreased in comparison to the conventional method in which two to four lithography processes must be performed to constitute the capacitor. Furthermore, another advantage can be realized in that the limit present in the layout taken place due to the alignment accuracy can be absorbed.

Example 37

Although the description of this example is made about Pb (Mg, Nb)O$_3$, the present invention is not limited to the aforesaid film. For example, in the case where BaTiO$_3$, or SrTiO$_3$ or a solid-solution film, or the main component of which is either of the aforesaid film, is used, excellent response characteristics can be obtained in a high frequency region of 100 kHz or higher although the dimensions of the device are different from the aforesaid device because they have a small relative permittivity in comparison to that of Pb(Mg, Nb)O$_3$. The reason for this lies in that the mass of Ba atom and that of Sr atom is smaller than that of Pb atom.

Since Pb(Ti, Zr)O$_3$ and (Pb La)(Ti,Zr)O$_3$ do not contain Mg which is the component element of Pb(Mg,Nb)O$_3$, a problem such as the change of the characteristics of the MOS transistor due to the dispersion of Mg or the fact that Mg becomes movable ions can be prevented, so that an effect is obtained in that the reliability is improved.

Although a sol-gel method is employed to form the film, a sputtering method, an organic metal gas phase deposition method, an evaporation method or a hydro-thermal method can be employed. If the sputtering method is employed, the composition of the target is changed and therefore the composition of the film can controlled satisfactorily. Hence, a film such as (Pb,La)(Ti,Zr)O$_3$ and Pb(Mg,Nb)O$_3$ in which copper is solid-dissolved and the like each of which is composed a multiplicity of elements can easily be formed. The organic metal gas phase deposition method or the hydro-thermal method is able to improve the through-put because films are simultaneously formed on 10 or more substrates.

A method of forming a solid-solution film of BaTiO$_3$ and SrTiO$_3$ by an organic metal gas phase grow method will now be described.

Figure 55:
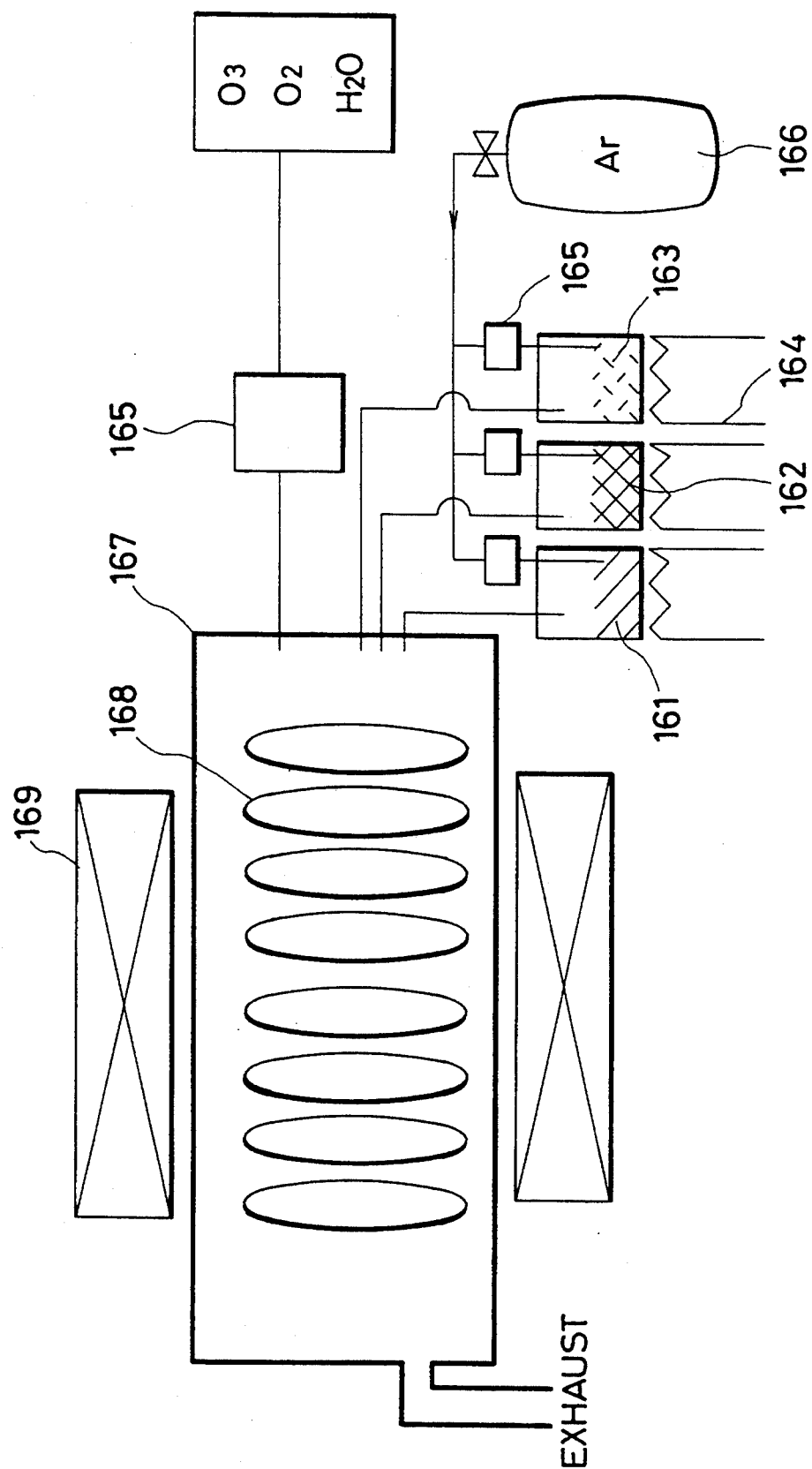
FIG. 55 illustrates the structure of an ordinary growing apparatus adapted to the organic metal gas phase method.

FIG. 55 illustrates the structure of a growing apparatus adapted to the organic metal gas phase grow method. The composition ratio of BaTiO$_3$ and SrTiO$_3$ were made to be 4:6. Ba, Ti and Sr each of which is in the form of complex of Barium and dipivaloymethanato are enclosed in individual containers 161, 162 and 163, and they were heated by a heater 164 at 180° C., 250° C. and 230° C. respectively. Furthermore, argon gases 166 are respectively introduced into the vessels at corresponding flow rates 220 ml/min, 400 ml/min and 300 ml/min by using a flow controller 165. As a result, the argon gas, which contains the metal complex evaporated from the vessel, is introduced into a quartz cylinder 167 in which a substrate 168 is placed. Simultaneously a mixture gas of an ozone gas, steam and oxygen is introduced into the quartz cylinder at a flow rate of 500 ml/min. It should be noted that the substrate placed in the quartz cylinder is heated to 600° C. by a heating coil. The pressure in the quartz cylinder is lowered to a pressure of 100 Pa.

As a result of the film forming process performed for one hour, BaTiOa and SrTiO$_3$ solid-solution film having a thickness of about 0.5 μm is formed on the surface of each of the 50 substrates placed in the quarts cylinder. The substrate, on which the film has been formed, is cooled down to the room temperature while taking about 6 hours at a temperature drop rate of 100° C./hour, so that a capacitor is constituted by same process as example 36.

Example 38

Although platinum is used as the electrode in Example 36, this example has an electrode in the form of a laminated structure which is arranged in such a manner that platinum 121 is thinned to about 0.01 μm to have a compatibility with the conventional process, and aluminum 122 is formed to have a thickness of about 0.1 μm.

Figure 56:
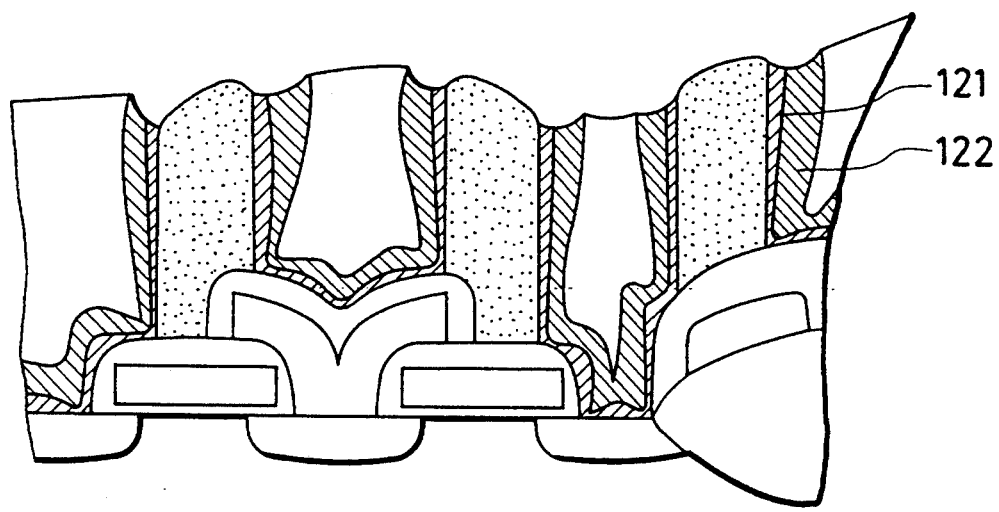
FIG. 56 illustrates the structure of the electrode according to an example of the present invention in which platinum and aluminum are stacked.

FIG. 56 illustrates the electrode according to this example and having a laminated structure composed of platinum and aluminum.

Since the aluminum 122 excellent in the etching processability is used as shown in FIG. 81, the dispersion of the capacitances taken place due to the change of the structure of the capacitor at the time of the etching process can be reduced by about 20%. A similar effect can be obtained by using polysilicon in place of the aluminum 122.

In the case where the SiO$_2$ film is formed at the time of forming the insulating film by a plasma CVD method or a method, in each of which organic silicon such as ozone and tetraethylorthosilicate is used so as to perform a low temperature process lower than 400° C. in a manner different from the process in which high temperature is required for reflowing the BPSG or the like, polysilicon or aluminum is directly formed as the electrode and the dispersion of the formed devices can be further reduced by about 10%. However, the leakage current increases by about 5% at this time in the SiO$_2$ film and on the interface between the SiO$_2$ layer and the ferroelectric material. However, the aforesaid method can be employed because this leakage current is sufficiently small with respect to the leakage current in the ferroelectric film.

Example 39

In this example, a capacitor, in which its electrodes are formed substantially in parallel to the direction in which the crystal of the ferroelectric material grows, is used and Pb(Zr, Ti)O$_3$ (titanate lead zirconate) is used as the ferroelectric layer so as to constitute the ferroelectric nonvolatile memory (FRAM).

As shown in FIG. 11, the ferroelectric capacitor 208 is made of Pb(Zr,Ti)O$_3$ which is a material having spontaneous polarization. Pb(Zr,Ti)O$_3$ has a Curie temperature of 300° C. or higher and possesses the spontaneous polarization. In this example, a capacitor arranged in such a manner that the interval between the electrodes is 0.2 μm and the area of the electrode is 2 μm$^2$. When the power supply voltage is 5 V, the leakage current between the electrodes can be reduced to about one-tenth.

Example 40

In this example, the ferroelectric capacitor is, as shown in FIG. 7, constituted to surround the contact hole of the drain electrode of the MOS transistor.

As shown in FIG. 8, the ferroelectric capacitor is, as shown in FIG. 7, constituted to surround the electrode of the transistor. Furthermore, projections and pits are formed on the surface of the electrode in order to enlarge the surface area of the electrode. By employing the aforesaid layout, the height of the ferroelectric material can be lowered to 0.4 μm if the same capacitance is realized as that obtainable from the aforesaid structure. Since the height of the ferroelectric capacitor can be lowered, the deterioration of the yield due to the breakage of the wiring (the aluminum wiring or the like of the word line) formed on the capacitor can be prevented.

Example 41

In the aforesaid examples, the material or the ferroelectric film is formed into a single layer. However, this example is arranged in such a manner that ferroelectric materials having different compositions are formed on the semiconductor substrate, one of the two layers, that is, the first layer being used as a buffer layer with respect to the base oxide layer so as to improve the crystallinity of the ferroelectric material of the second layer and to obtain the ferroelectric characteristics.

Figure 57:
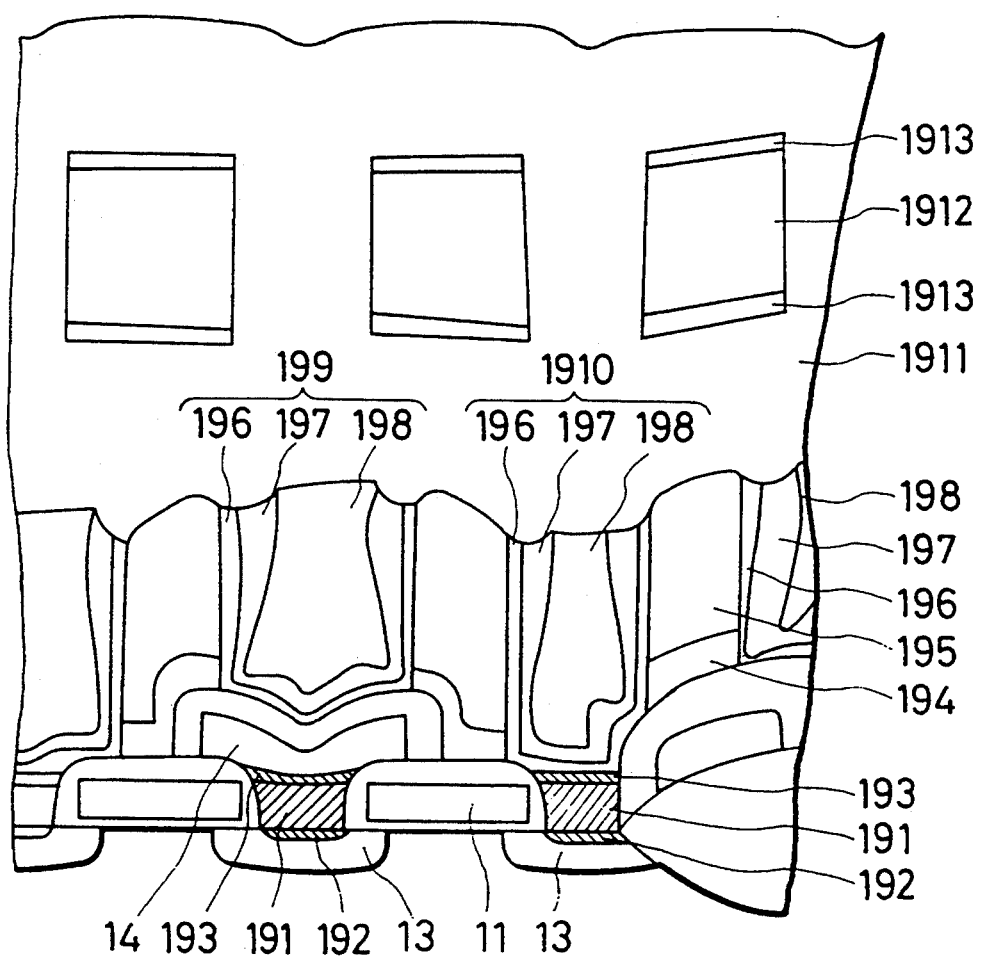
FIG. 57 illustrates the structure of a memory cell which uses a multi-layer ferroelectric material and a multilayer electrode according to an example of the present invention.

FIG. 57 illustrates a memory cell which uses a multi-layer ferroelectric material and a multi-layer electrode. The device according to this example is designed in accordance with a 0.3 μm rule under conditions that the power supply voltage is 3.0 V, the sense amplifier pitch is 0.8 μm, and the word line pitch is 0.7 μm. However, the present invention is not limited to the aforesaid design dimensions.

As shown in FIG. 52a, the MOS transistor and the bit line are formed on the Si substrate, titanium in the contact portion is formed in order to reduce the contact resistance with silicon. The formed titanium reacts with silicon in the ensuing high temperature process so that titanium silicide 192 having a thickness of about 0.020 μm is formed in the boundary portion with the silicon. The titanium silicide 272 further reduces the contact resistance.

Furthermore, titanium tungsten 193, which is made to be barrier layer, is formed on the titanium portion. By forming a barrier material in the contact hole of the drain electrode of the MOS transistor before the ferroelectric film is formed, contamination of heavy metal such as lead and zirconium, and magnesium contained by the ferroelectric material, which will be movable ions in Si, into Si is prevented. If the heavy metal or movable ions are contaminated into Si, an electron energy level is formed in a deep region in the band gap of Si, causing the leakage current to increase in the MOS transistor or causing the threshold voltage to be changed. As a barrier material capable of preventing it, the titanium tungsten 193 is used.

Furthermore, a SrTiO$_3$ layer 194 and a Pb(Mg,Nb)O$_3$ layer 195 are formed to respectively have a thickness of 0.1 μm and a thickness of 0.45 μm by a CVD method and a sol-gel method.

After the films have been formed, a heat treatment at 700° C. is performed for one hour.

As disclosed in Example 37, the structure in which PbMgNbO$_3$ is formed on the SrTiO$_3$ is able to enlarge the crystal particle block and increase the permittivity in comparison to the structure in which PbMgNbO$_3$ is directly formed on SiO$_2$. However, the crystal particle block in the film is formed into an elongated shape and the lengthwise direction of the particle block faces perpendicular with respect to the substrate, although the aforesaid state is omitted from illustration.

Furthermore, a photolithography process and a dry etching process are performed so that a Pb (Mg,Nb)O$_3$ layer 195 and a SrTiO$_3$ layer 194 are formed to have a width of 0.15 μm and a length of 2 μm. At this time, the height of the ferroelectric layer is 0.5 μm, and the ferroelectric layer is formed to surround the contact hole of the drain electrode of the MOS transistor as shown in FIG. 7. Furthermore, an aluminum layer 196 is formed to have a thickness of 0.04 μm and a polysilicon layer 197 is formed to have a thickness of 0.05 μm. Furthermore, boron silicate glass (BPSG) 198 is formed and reflowed at a high temperature of 800° C. Then, the boron silicate glass (PBSG) is etched back until polysilicon present on Pb (Mg,Nb) O$_3$ appears.

Then, polysilicon 197 present on the ferroelectric material is removed by etching, and aluminum 196 present on the ferroelectric material is removed by sulfuric acid. As a result, a plate electrode 199 and a storage node 910 are electrically separated from each other while interposing the ferroelectric material. As a result, the area of the electrode positioned in contact with Pb(Mg,Nb)O$_3$ is made to be 1 μm$^2$ (2 μm×0.5 μm) and the interval between the electrodes is made to be 0.15 μm.

Then, a SiO$_2$ film 1911 serving as a protection film is formed on the capacitor, so that a memory cell is formed. In the case where it is used in a DRAM, aluminum wiring 1912 and the like are formed on it so as to establish a contact with external electrodes before it is enclosed into a package. Thus, the subject process is completed. Although a process of forming the peripheral circuits such as the sense amplifier and the driver circuit and the like are omitted from the description, they are of course included and therefore the structure is as shown in FIG. 3.

A capacitance of about 80 fF is obtained with the capacitor according to this example. Since a voltage of 1.5 V, which is the half of the power supply voltage of 3 V, is applied to the plate electrode, a charge of 120 fC is stored. Furthermore, a leakage current is reduced to about 1 fA which is sufficiently small value to be used as a DRAM cell.

Although the description is made about Pb(Mg,Nb)O$_3$ which is used in the DRAM, the present invention is not limited to the aforesaid film. For example, in the case where BaTiO$_3$, or SrTiO$_3$ or a solid-solution film, or the main component of which is either of the aforesaid film, is used, excellent response characteristics can be obtained in a high frequency region of 100 kHz or higher although the dimensions of the device are different from the aforesaid device because they have a small relative permittivity in comparison to that of Pb(Mg,Nb)O$_3$. The reason for this lies in that the mass of Ba atom and that of Sr atom is smaller than that of Pb atom. Since Pb (Ti,Zr)O$_3$ and (Pb, La) (Ti,Zr)O$_3$ do not contain Mg which is the component element of Pb(Mg, Nb)O$_3$, a problem such as the change of the characteristics of the MOS transistor due to the dispersion of Mg or the fact that Mg becomes movable ions can be prevented, so that an effect is obtained in that the reliability is improved.

Example 42

Figure 58:
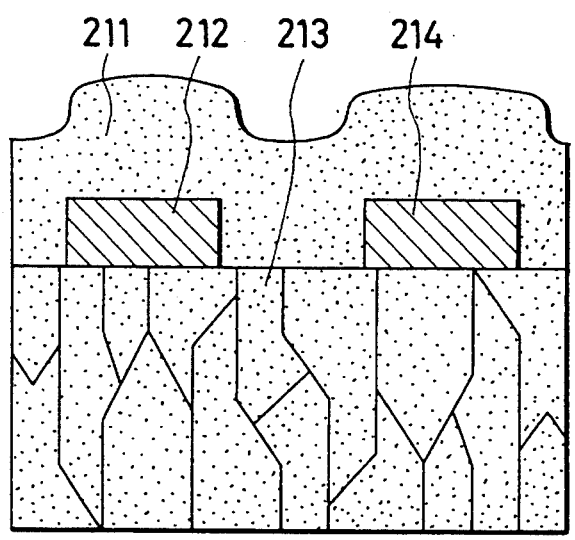
FIG. 58 illustrates the structure of the capacitor according to another example of the present invention.

FIG. 58 illustrates the structure of the capacitor by this example.

Although the aforesaid examples are arranged in such a manner that the electrodes are formed in parallel to the direction in which the crystal grows and voltage is applied between the electrodes so that an electric field is applied perpendicular to the direction in which crystal grows.

In this example, the electrodes are formed perpendicular to the direction in which the crystal of the ferroelectric material grows and the voltage is applied between the electrodes so that an electric field is applied perpendicular to the direction in which the crystal grows. The process of manufacturing the capacitor according to this example is as follows: a PbZrTiO$_3$ film 213 is, due to the growth of crystal, formed as the ferroelectric film, and metal films 212 and 214 are formed perpendicular to the direction in which the crystal grows and a SiO$_2$ film 211 is formed as the protection film.

Figure 59:
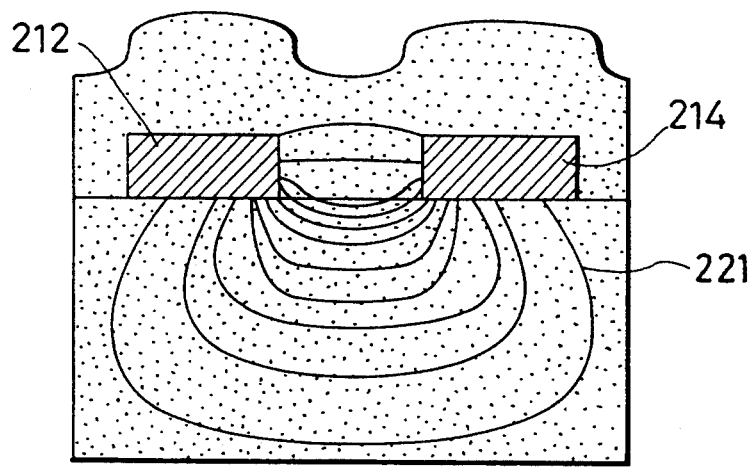
FIG. 59 is a graph which illustrates the result of simulation of electric flux lines generated in the ferroelectric material of the capacitor shown in FIG. 58.

FIG. 59 is a graph which illustrates the result of a simulation made about electric flux line generated in the ferroelectric material of the capacitor according to this example.

The relative permittivities of PbZrTiO$_3$ 213 and SiO$_2$ 211 were made to be 1000 and 4 respectively to simulate the electric flux lines 221 generated in the ferroelectric material. The direction of the electric flux line 221, that is, the direction of the electric field is perpendicular to the direction in which the crystal of the PbZrTiO$_3$ 213 growth in the lower portion between the electrodes 212 and 214. Furthermore, the major portion of the electric field to be applied into the film is applied to the PbZrTiO$_3$ 213 having a high permittivity. Therefore, substantially no electric flux line is found in the SiO$_2$ 211 having a low permittivity. Therefore, the high permittivity layer can be effectively utilized and, hence, a large capacitance can be obtained.

If the electrodes are not formed in parallel to the direction in which the crystal grows, the leakage current can be reduced by applying the electric field perpendicular to the direction in which the crystal grows, and therefore a large capacitance can be obtained.

Example 43

The effect of reducing the leakage current by applying an electric field perpendicular to the direction in which the crystal grows is not limited to the polycrystal materials. It can be obtained from an amorphous material if particle blocks are formed in the film, the particles block is in the form of a columnar structure and the lengthwise direction of the particle block faces a predetermined direction.

For example, the aforesaid columnar structure is found in an amorphous silicon nitride film (abbreviated to a-Si$_3$N$_4$) and the major portion of the leakage currents flow in the lengthwise direction but a small quantity of the leakage current flow in the vertical direction. The aforesaid columnar structure of the a-Si$_3$N$_4$ is formed by an ECRCVD method or the like at a relatively lower pressure of 10 mTorr or lower at a high speed faster than 3 nm/s, resulting in elongated particle blocks to be found. The specific resistance of the particle block in the a-Si$_3$N$_4$ film in the lengthwise direction is about $10^{12}$ Ω.cm, and a value larger than $10^{15}$ Ω.cm can be obtained in a direction perpendicular to the aforesaid lengthwise direction.

Figure 60:
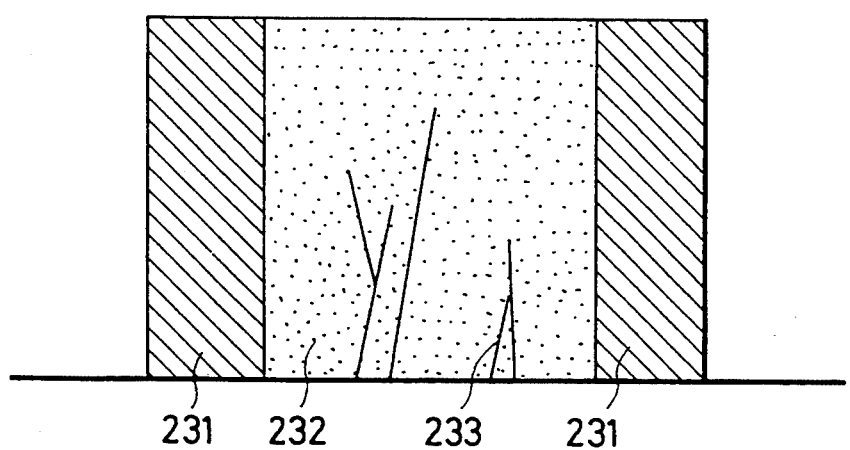
FIG. 60 illustrates a state in which defects present in the crystal of the ferroelectric material of the capacitor according to an example of the present invention.

FIG. 60 illustrates a state in which a somewhat small defect is present in the crystal of the ferroelectric material of the capacitor.

Also in a single crystal ferroelectric material 232, the leakage current can be considerably reduced if a direction of the electric field applied by an electrode 231 is substantially perpendicular to the direction of the defect 233 of the crystal.

Example 44

This example is arranged in such a manner that the capacitor is used for backup of SRAM. In the memory structure shown in FIG. 11, the polarization direction of the ferroelectric material is inverted at the time of the data reading operation as well as the data writing operation. On the contrary, the structure shown in FIG. 27, voltage is applied to a backup word line (BUWL) only when the power source is turned off, in particular, when data is stored on the ferroelectric material so as to turn on the MOS transistor to transfer data in the SRAM, and a 1-pulse rectangular wave is applied to a backup control line (BUCL) so as to write data on a ferroelectric memory capacity (FC upper line) and a dummy ferroelectric memory capacity (FC upper line). Therefore, the number of polarization inversions can significantly be decreased, the data holding characteristics can be improved and the reliability of the device can be improved. Since the spontaneous polarization of the ferroelectric material according to this example is 50 $\mu C/cm^2$ and an area required to form the capacity for reading is about 0.2 $\mu m^2$, the enlargement of the cell area can be restricted to about 20% including the backup MOS transistor. Therefore, a reliable and high speed memory can be constituted.

Example 45

This example is arranged to be able to be adapted to the following future communication systems: an analog network, a digital network, a narrow band intelligent service digital network (N-ISDN), and a broad band (B)-ISDN. The driver receiver circuit and the like are formed on a chip in order to directly receiving signals from a highly integrated high speed memory, which can be adapted to a multimedia communication including precise natural kinetic pictures, and from a communication circuit.

As shown in FIG. 19, the structure in which the FRAM, DRAM or SRAM device is used as an included cash memory reveals a large capacity and low electric power consumption. Therefore, a logical device having a high grade function can be operated with low electric power consumption. Furthermore, another effect can be obtained in that a microprocessor freed from soft errors can be obtained.

Example 46

As shown in FIG. 20, use of the FRAM, the DRAM or the SRAM according to the present invention as the semiconductor memory board will enable an significant advantage to be obtained as a low cost and large capacity solid recording medium. In particular, use of the FRAM board enables electrical backup at the power failure to be omitted because it is an nonvolatile memory, and therefore the necessity of copying the stored contents onto another recording medium (for example, a magnetic disk or a magnetic tape) as a backup. Furthermore, the fact that it has no movable portion improves the durability against shock and the electric power consumption can be significantly reduced. In addition, another effect can be obtained in that a semiconductor memory board durable against soft errors can be obtained.

As shown in FIG. 21, a card (a FRAM card), which uses the FRAM, is able to eliminate a necessity for the conventional memory card to include the battery for maintaining the storage. Therefore, it can be used similarly to the conventional floppy disk but an advantage can be obtained in that the access time can significantly be shortened in comparison to the floppy disk. Hence, use of the memory card, which employs the memory device, as an interchangeable sub-storage medium such as a conventional floppy disk for a small or a portable computer system, the scale grade of which is lower the work station, will eliminate the drive system such as a motor and the drive power source. Therefore, the overall size of the system can be reduced, the electric power consumption can be decreased, and a large quantity information can be read/write at high speed. Hence, the processing performance of the overall system can be improved.

Example 47

The aforesaid logical device (microprocessor), the memory device (FRAM, DRAM, and SRAM) according to the present invention, and the semiconductor memory board and the memory card according to the present invention will respectively enable significant effects to be obtained when they are used in a super computer, a large-scale, a general-purpose, a small or medium size computes, a work station, a personal computer, a portable computer, a lap-top computer, a notebook type personal computer.

Figure 61:
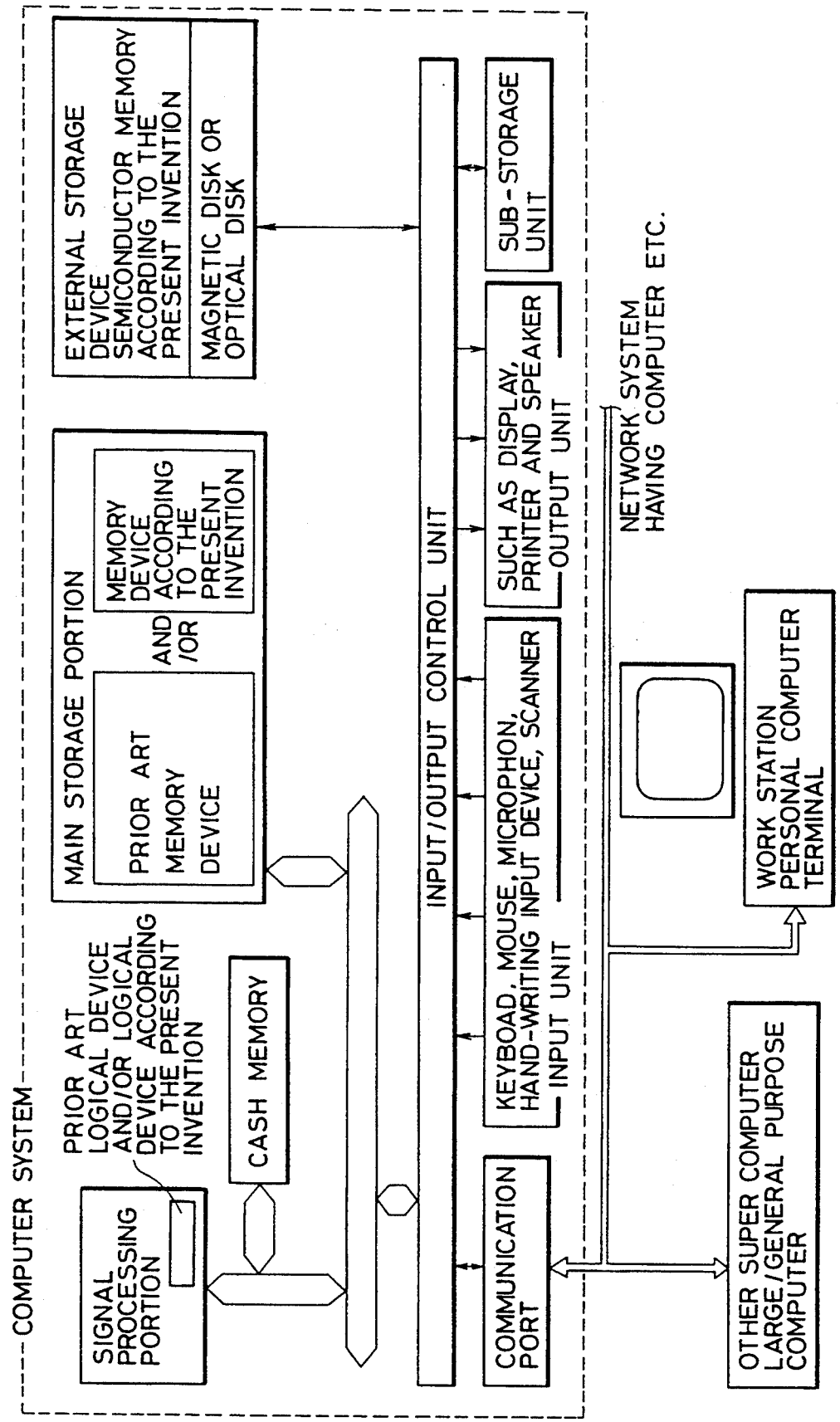
FIG. 61 illustrates a computer system according to an example of the present invention.

FIG. 61 illustrates a computer system according to this example. In the system shown in FIG. 61, the DRAM and the SRAM are used in a similar manner to that in the conventional structure, but the performance such as the processing speed can be improved because the capacity can be enlarged and the cost can be reduced in comparison to the conventional structure. The aforesaid improvement will be significantly effective for apparatus the scale grade of which is higher than the small or medium size computers.

The FRAM has a superior advantages of nonvolatile characteristics, a large capacity and a low electric power consumption to the conventional semiconductor memory. In particular, the nonvolatile characteristics will enable an advantage to be obtained in that the overall size of the system can be reduced because the storage battery against power failure which has been required for the apparatus higher than the small or medium computers can be omitted. Furthermore, the stored contents do not need to be copied to a magnetic disk having a low access speed, and therefore larger quantity of information can be processed at a higher speed as compared with the conventional system. Hence, advantages can be obtained in that the processing speed of the overall system can be raised, the performance can be improved, and the size and the cost can be reduced.

Furthermore, advantages can be obtained in the portable personal computer to the notebook type computer in that the system durable against vibrations can be constituted. Furthermore, the aforesaid advantage of the low electric power consumption will enable the system to be operated with the battery for a long time, causing the way of portable use to be widened. Hence, the system can be stably operated even if it is placed in a movable body.

In addition, in the case where the aforesaid microprocessor is provided in the signal processing portion and the memory device according to the present invention is used in the main storage portion, access to large quantity of information can be made at a high speed, causing an effect to be obtained in that a significantly high grade and complicated information process can be performed in a short time.

The system which uses the logical device, the memory device, the semiconductor memory board and the memory card according to the present invention will enable advantages to be obtained in the electric power consumption can be reduced, the size can be reduced and the processing speed can be raised, and therefore, the performance can be improved, and the cost and the electric power consumption can be reduced when they are adapted to office machine such as a word processor, a printer and the like, computer game system, a disk top calculator, a pocketbook type computer and the like. In addition, similar effects can be obtained in controlling an automobile, and home electronic products such as a refrigerator, an audio system and the like.

Figure 62:
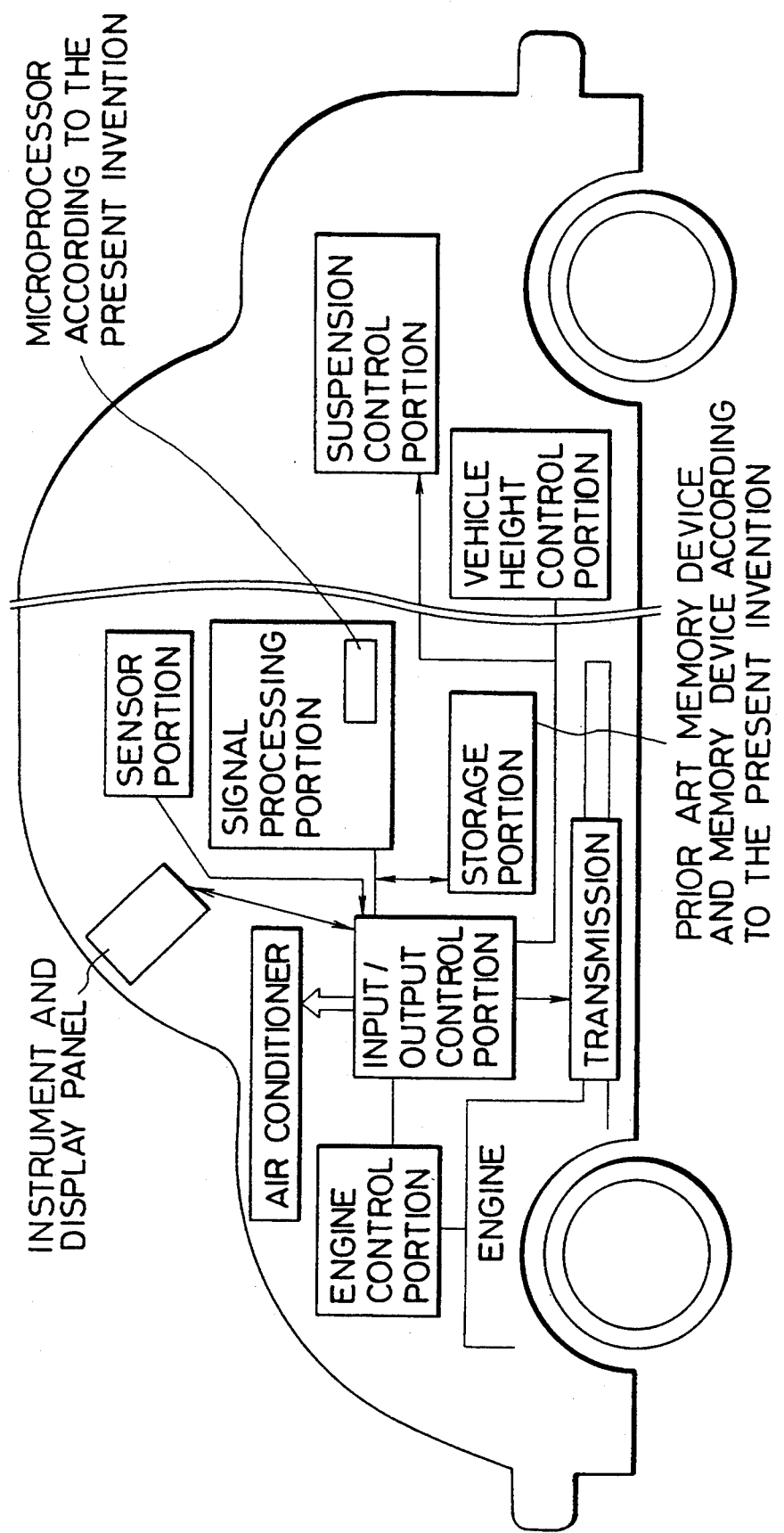
FIG. 62 illustrates an automobile control system which uses the memory according to an example of the present invention.

FIG. 62 illustrates a system for electrically controlling the engine, fuel injection and suspension of an automobile. Such system must realize reliability because data is input/output under severe atmosphere. When the DRAM, FRAM, the SRAM according to the present invention are used, durability against data errors due to an external influence can be improve, resulting in that the problem of the reliability can be overcome. Furthermore, a large capacity memory can be provided, an advantage can be realized in that a high grade processing performance can be realized in the aforesaid control system while necessitating a reduced number of elements. Furthermore, use of the FRAM enables an energy saving effect and reduction in the fuel consumption to be realized in the aforesaid control system because of the reduced power consumption of the FRAM.

What is claimed is:

1. A capacitor comprising:
a substrate;
ferroelectric material provided on said substrate;
at least two electrodes formed in direct contact with said ferroelectric material, at least one of said electrodes being composed of a conductive material which contains plural elements and which can be oxidized to form ferroelectric material.

2. A capacitor according to claim 1, wherein said ferroelectric material provided on the substrate is formed into a wall shape which is substantially perpendicular to said substrate, and each side wall of said ferroelectric material provided on the substrate has at least one of said at least two electrodes.

3. A capacitor according to claim 1, wherein an oxide of said conductive material of at least one of said electrodes is said ferroelectric material provided on said substrate.

4. A capacitor comprising a ferroelectric material on a substrate and at least two electrodes for applying an electric field to said ferroelectric material, wherein
said ferroelectric material is made of elongated crystal particle blocks, and said electrodes are disposed so as to apply an electric field substantially perpendicular to the lengthwise direction of said crystal particle blocks.

5. A capacitor according to claim 1, wherein said substrate is a semiconductor integrated circuit substrate.

6. A capacitor according to claim 2, wherein said substrate is a semiconductor integrated circuit substrate.

7. A capacitor according to claim 3, wherein said substrate is a semiconductor integrated circuit substrate.

8. A capacitor according to claim 4, wherein said substrate is a semiconductor integrated circuit substrate.

9. A capacitor according to claim 1, wherein said ferroelectric material is at least one material selected from a group consisting of the following materials:

$KNbO_3$, $NaTaO_3$, $KTaO_3$, $SrTiO_3$, $BaTiO_3$, $PbTiO_3$, $SrZrO_3$, $BaZrO_3$, $BiFeO_3$, $(Na_{\frac{1}{2}}Bi_{\frac{1}{2}})TiO_3$, $(K_{\frac{1}{2}}Bi_{\frac{1}{2}})TiO_3$, $(K_{\frac{1}{2}}La_{\frac{1}{2}})TiO_3$, $(Ba_{\frac{1}{2}}Pb_{\frac{1}{2}})TiO_3$, $(Ca_{\frac{1}{2}}Sr_{\frac{1}{2}})TiO_3$, $(Na_{\frac{1}{2}}Nd_{\frac{1}{2}})TiO_3$, $(Ag_{\frac{1}{2}}Ce_{\frac{1}{2}})TiO_3$, $(Pb_{\frac{1}{2}}Ca_{\frac{1}{2}})ZrO_3$, $Ba(Mg_{\frac{1}{2}}Te_{\frac{1}{2}})O_3$, $Ba(Mn_{\frac{1}{2}}Te_{\frac{1}{2}})O_3$, $Ba(Co_{\frac{1}{2}}Te_{\frac{1}{2}})O_3$, $Ba(Cd_{\frac{1}{2}}Te_{\frac{1}{2}})O_3$, $Pb(Mg_{\frac{1}{2}}Te_{\frac{1}{2}})O_3$, $Pb(Mn_{\frac{1}{2}}Te_{\frac{1}{2}})O_3$, $Pb(Co_{\frac{1}{2}}Te_{\frac{1}{2}})O_3$, $Pb(Ni_{\frac{1}{2}}Te_{\frac{1}{2}})O_3$, $Pb(Zn_{\frac{1}{2}}Te_{\frac{1}{2}})O_3$, $Pb(Cd_{\frac{1}{2}}Te_{\frac{1}{2}})O_3$, $Pb(Co_{\frac{1}{2}}W_{\frac{1}{2}})O_3$, $Pb(Zr_{\frac{1}{2}}Ti_{\frac{1}{2}})O_3$, $Pb(Mg_{\frac{1}{2}}Nb_{\frac{1}{2}})O_3$, $Pb(Sc_{\frac{1}{2}}Nb_{\frac{1}{2}})O_3$, $Pb(Mn_{\frac{1}{2}}Nb_{\frac{1}{2}})O_3$, $Pb(Fe_{\frac{1}{2}}Nb_{\frac{1}{2}})O_3$, $Pb(Ni_{\frac{1}{2}}Nb_{\frac{1}{2}})O_3$, $Pb(In_{\frac{1}{2}}Nb_{\frac{1}{2}})O_3$, $Pb(Fe_{\frac{1}{2}}W_{\frac{1}{2}})O_3$, $Pb(Lu_{\frac{1}{2}}Ta_{\frac{1}{2}})O_3$, $Pb(Yb_{\frac{1}{2}}Ta_{\frac{1}{2}})O_3$, $Pb(Cu_{\frac{1}{2}}Sb_{\frac{1}{2}})O_3$, $Pb(Al_{\frac{1}{2}}Sb_{\frac{1}{2}})O_3$, $Ca(Mg_{\frac{1}{2}}Te_{\frac{1}{2}})O_3$, and $Ca(Mn_{\frac{1}{2}}Te_{\frac{1}{2}})O_3$.

10. A capacitor according to claim 1, wherein said material is at least one material selected from a group consisting of the following materials:

$KNbO_3$, $NaTaO_3$, $KTaO_3$, $SrTiO_3$, $BaTiO_3$, $PbTiO_3$, $SrZrO_3$, $BaZrO_3$, $BiFeO_3$, $(Na_{\frac{1}{2}}Bi_{\frac{1}{2}})TiO_3$, $(K_{\frac{1}{2}}Bi_{\frac{1}{2}})TiO_3$, $(K_{\frac{1}{2}}La_{\frac{1}{2}})TiO_3$, $(Ba_{\frac{1}{2}}Pb_{\frac{1}{2}})TiO_3$, $(Ca_{\frac{1}{2}}Sr_{\frac{1}{2}})TiO_3$, $(Na_{\frac{1}{2}}Nd_{\frac{1}{2}})TiO_3$, $(Ag_{\frac{1}{2}}Ce_{\frac{1}{2}})TiO_3$, $(Pb_{\frac{1}{2}}Ca_{\frac{1}{2}})ZrO_3$, $Ba(Mg_{\frac{1}{2}}Te_{\frac{1}{2}})O_3$, $Ba(Mn_{\frac{1}{2}}Te_{\frac{1}{2}})O_3$, $Ba(Co_{\frac{1}{2}}Te_{\frac{1}{2}})O_3$, $Ba(Cd_{\frac{1}{2}}Te_{\frac{1}{2}})O_3$, $Pb(Mg_{\frac{1}{2}}Te_{\frac{1}{2}})O_3$, $Pb(Mn_{\frac{1}{2}}Te_{\frac{1}{2}})O_3$, $Pb(Co_{\frac{1}{2}}Te_{\frac{1}{2}})O_3$, $Pb(Ni_{\frac{1}{2}}Te_{\frac{1}{2}})O_3$, $Pb(Zn_{\frac{1}{2}}Te_{\frac{1}{2}})O_3$, $Pb(Cd_{\frac{1}{2}}Te_{\frac{1}{2}})O_3$, $Pb(Co_{\frac{1}{2}}W_{\frac{1}{2}})O_3$, $Pb(Zr_{\frac{1}{2}}Ti_{\frac{1}{2}})O_3$, $Pb(Mg_{\frac{1}{2}}Nb_{\frac{1}{2}})O_3$, $Pb(Sc_{\frac{1}{2}}Nb_{\frac{1}{2}})O_3$, $Pb(Mn_{\frac{1}{2}}Nb_{\frac{1}{2}})O_3$, $Pb(Fe_{\frac{1}{2}}Nb_{\frac{1}{2}})O_3$, $Pb(Ni_{\frac{1}{2}}Nb_{\frac{1}{2}})O_3$, $Pb(In_{\frac{1}{2}}Nb_{\frac{1}{2}})O_3$, $Pb(Fe_{\frac{1}{2}}W_{\frac{1}{2}})O_3$, $Pb(Lu_{\frac{1}{2}}Ta_{\frac{1}{2}})O_3$, $Pb(Yb_{\frac{1}{2}}Ta_{\frac{1}{2}})O_3$, $Pb(Cu_{\frac{1}{2}}Sb_{\frac{1}{2}})O_3$, $Pb(Al_{\frac{1}{2}}Sb_{\frac{1}{2}})O_3$, $Ca(Mg_{\frac{1}{2}}Te_{\frac{1}{2}})O_3$, and $Ca(Mn_{\frac{1}{2}}Te_{\frac{1}{2}})O_3$ and said conductive material of said electrode is at least one type material selected from a group consisting of the following materials:

KNb, NaTa, KTa, SrTi, BaTi, PbTi, SrZr, BaZr, BiFe, NaBiTi, KBiTi, KLaTi, $BaPbTiO_3$, CaSrTi, NaNdTi, AgCeTi, PbCaZr, BaMgTe, BaMnTe, BaCoTe, BaCdTe, PbMgTe, PbMnTe, PbCoTe, ZnTe, PbCdTe, PbCoW, PbZrTi, PbMgNb, PbScNb, PbMnNb, PbFeNb, PbNiNb, PbInNb, PbFeW, PbLuTa, PbYbTa, PbCuSb, PbAlSb, CaMgTe, and CaMnTe.

11. A capacitor according to claim 4, wherein said ferroelectric material is at least one material selected from a group consisting of the following materials:

$KNbO_3$, $NaTaO_3$, $KTaO_3$, $SrTiO_3$, $BaTiO_3$, $PbTiO_3$, $SrZrO_3$, $BaZrO_3$, $BiFeO_3$, $(Na_{\frac{1}{2}}Bi_{\frac{1}{2}})TiO_3$, $(K_{\frac{1}{2}}Bi_{\frac{1}{2}})TiO_3$, $(K_{\frac{1}{2}}La_{\frac{1}{2}})TiO_3$, $(Ba_{\frac{1}{2}}Pb_{\frac{1}{2}})TiO_3$, $(Ca_{\frac{1}{2}}Sr_{\frac{1}{2}})TiO_3$, $(Na_{\frac{1}{2}}Nd_{\frac{1}{2}})TiO_3$, $(Ag_{\frac{1}{2}}Ce_{\frac{1}{2}})TiO_3$, $(Pb_{\frac{1}{2}}Ca_{\frac{1}{2}})ZrO_3$, $Ba(Mg_{\frac{1}{2}}Te_{\frac{1}{2}})O_3$, $Ba(Mn_{\frac{1}{2}}Te_{\frac{1}{2}})O_3$, $Ba(Co_{\frac{1}{2}}Te_{\frac{1}{2}})O_3$, $Ba(Cd_{\frac{1}{2}}Te_{\frac{1}{2}})O_3$, $Pb(Mg_{\frac{1}{2}}Te_{\frac{1}{2}})O_3$, $Pb(Mn_{\frac{1}{2}}Te_{\frac{1}{2}})O_3$, $Pb(Co_{\frac{1}{2}}Te_{\frac{1}{2}})O_3$, $Pb(Ni_{\frac{1}{2}}Te_{\frac{1}{2}})O_3$, $Pb(Zn_{\frac{1}{2}}Te_{\frac{1}{2}})O_3$, $Pb(Cd_{\frac{1}{2}}Te_{\frac{1}{2}})O_3$, $Pb(Co_{\frac{1}{2}}W_{\frac{1}{2}})O_3$, $Pb(Zr_{\frac{1}{2}}Ti_{\frac{1}{2}})O_3$, $Pb(Mg_{\frac{1}{2}}Nb_{\frac{1}{2}})O_3$, $Pb(Sc_{\frac{1}{2}}Nb_{\frac{1}{2}})O_3$, $Pb(Mn_{\frac{1}{2}}Nb_{\frac{1}{2}})O_3$, $Pb(Fe_{\frac{1}{2}}Nb_{\frac{1}{2}})O_3$, $Pb(Ni_{\frac{1}{2}}Nb_{\frac{1}{2}})O_3$, $Pb(In_{\frac{1}{2}}Nb_{\frac{1}{2}})O_3$, $Pb(Fe_{\frac{1}{2}}W_{\frac{1}{2}})O_3$, $Pb(Lu_{\frac{1}{2}}Ta_{\frac{1}{2}})O_3$, $Pb(Yb_{\frac{1}{2}}Ta_{\frac{1}{2}})O_3$, $Pb(Cu_{\frac{1}{2}}Sb_{\frac{1}{2}})O_3$, $Pb(Al_{\frac{1}{2}}Sb_{\frac{1}{2}})O_3$, $Ca(Mg_{\frac{1}{2}}Te_{\frac{1}{2}})O_3$, and $Ca(Mn_{\frac{1}{2}}Te_{\frac{1}{2}})O_3$.

12. A method of manufacturing a capacitor, comprising the steps of:

forming, on a semiconductor substrate, a film of ferroelectric material;
forming said ferroelectric material into a wall shape;
forming a film of a conductive material which contains plural elements and which can be oxidized to form ferroelectric material on the surfaces of said ferroelectric material formed into said wall shape; and
removing said conductive material film formed at a top portion of said ferroelectric material so as to electrically separate the two side walls of said ferroelectric material from each other, so that electrodes are formed.

13. A method of manufacturing a capacitor, comprising the steps of:
forming, on a semiconductor substrate, a film of a ferroelectric material composed of elongated crystal particle blocks;
forming said ferroelectric material into a wall shape;
forming a conductive material film to be positioned in contact with the lengthwise direction of said crystal particle blocks of said ferroelectric material formed into said wall shape; and
removing said conductive material film formed at a top portion of said ferroelectric material so as to electrically separate the two side walls of said ferroelectric material from each other, so that electrodes are formed.

14. A capacitor according to claim 1, wherein the ferroelectric material provided on the substrate has a permittivity of at least 20.

15. A capacitor according to claim 1, wherein the ferroelectric material provided on the substrate has a polarization which possesses hysteresis.

16. A capacitor according to claim 5, wherein the semiconductor integrated circuit substrate includes wiring structure and a semiconductor substrate, the capacitor being further from the semiconductor substrate than the wiring structure is from the semiconductor substrate.

17. A capacitor according to claim 1, wherein the ferroelectric material provided on the substrate includes a plurality of layers of ferroelectric material having different compositions.

18. A capacitor according to claim 17, wherein a first layer, of the plurality of layers, is a buffer layer such that crystallinity of a second layer of the plurality of layers is improved.

19. A capacitor according to claim 17, wherein at least one of the at least two electrodes includes a plurality of layers having different compositions.

20. A capacitor according to claim 1, wherein said at least one of said electrodes that can be oxidized to form ferroelectric material includes an element that is included in said ferroelectric material provided on the substrate.

21. A capacitor according to claim 1, wherein the ferroelectric material provided on the substrate has opposed sides, and wherein the at least two electrodes are provided on the opposed sides of the ferroelectric material provided on the substrate.

22. A capacitor according to claim 4, wherein the at least two electrodes are provided on a same surface of the ferroelectric material, the elongated crystal particle blocks being positioned substantially perpendicular to said same surface.

23. A capacitor according to claim 4, wherein the ferroelectric material has a wall shape, with opposed sides of the ferroelectric material extending substantially perpendicular to said substrate, the elongated crystal particle blocks extending substantially perpendicular to the substrate, and wherein the at least two electrodes are positioned on the opposed sides of the ferroelectric material.

24. A method according to claim 12, wherein the ferroelectric material provided on the substrate has a permittivity of at least 20.

25. A method according to claim 12, wherein the ferroelectric material provided on the substrate has a polarization that possesses hysteresis.

* * * * *